United States Patent
Luschtinetz et al.

(10) Patent No.: US 11,795,186 B2
(45) Date of Patent: Oct. 24, 2023

(54) ORGANIC ELECTRONIC DEVICE COMPRISING AN ORGANIC SEMICONDUCTOR LAYER AND A DEVICE

(71) Applicant: Novaled GmbH, Dresden (DE)

(72) Inventors: Regina Luschtinetz, Dresden (DE); Benjamin Schulze, Dresden (DE)

(73) Assignee: Novaled GmbH, Dresden (DE)

( * ) Notice: Subject to any disclaimer, the term of this patent is extended or adjusted under 35 U.S.C. 154(b) by 397 days.

(21) Appl. No.: 16/615,224

(22) PCT Filed: May 18, 2018

(86) PCT No.: PCT/EP2018/063167
§ 371 (c)(1),
(2) Date: Nov. 20, 2019

(87) PCT Pub. No.: WO2018/215355
PCT Pub. Date: Nov. 29, 2018

(65) Prior Publication Data
US 2020/0095269 A1 Mar. 26, 2020

(30) Foreign Application Priority Data
May 23, 2017 (EP) .................................. 17172393

(51) Int. Cl.
  *C07F 9/6521* (2006.01)
  *C07F 9/6558* (2006.01)
  (Continued)

(52) U.S. Cl.
  CPC .......... *C07F 9/6521* (2013.01); *C07F 9/6561* (2013.01); *C07F 9/65128* (2013.01);
  (Continued)

(58) Field of Classification Search
  None
  See application file for complete search history.

(56) References Cited

U.S. PATENT DOCUMENTS

2012/0119191 A1  5/2012  Dorok et al.
2017/0141324 A1  5/2017  Jin

FOREIGN PATENT DOCUMENTS

EP           2452946 A1    5/2012
KR    10-2016-0087331  *  7/2016
WO        2017/089399 A1  6/2017

OTHER PUBLICATIONS

Machine English translation of Cha et al. (KR-10-2016-0087331). Dec. 23, 2021.*

(Continued)

*Primary Examiner* — Jay Yang
(74) *Attorney, Agent, or Firm* — Eversheds Sutherland (US) LLP

(57) ABSTRACT

The present invention relates to a compound of formula 1 and an organic electronic device comprising an organic semiconductor layer, wherein at least one organic semiconductor layer comprises a compound of formula (1), wherein X is selected from O, S or Se; $Ar^1$ is selected from unsubstituted or substituted $C_2$ to $C_{60}$ heteroarylene, and wherein the substituted $C_2$ to $C_{60}$ heteroarylene comprises at least about one to about six substituents, wherein the substituent of the substituted $C_2$ to $C_{60}$ heteroarylene are independently selected from $C_1$ to $C_{12}$ alkyl, $C_1$ to $C_{12}$ alkoxy, CN, OH, halogen, $C_6$ to $C_{36}$ arylene, or $C_2$ to $C_{25}$ heteroarylene; n is 1 or 2; $L^1$ is selected from a single bond, $C_1$ to $C_4$ alkyl, substituted or unsubstituted $C_6$ to $C_{36}$ arylene, wherein the substituent of substituted $C_6$ to $C_{36}$ arylene is selected from $C_1$ to $C_{12}$ alkyl, $C_6$ to $C_{18}$ arylene; $L^2$ is selected from a single bond or $C_1$ to $C_6$ alkyl; $R^1$, $R^2$ are independently selected from substituted or unsubstituted $C_1$ to $C_{16}$ alkyl, wherein the substituent of substituted $C_1$ to $C_{16}$ alkyl is selected from $C_6$ to $C_{18}$ arylene or $C_2$ to $C_{12}$ heteroarylene; wherein the compound of formula 1 comprises at least about (Continued)

4 of $C_6$-arylene rings and a molecular mass of at least about 400 g/mol to about 1800 g/mol.

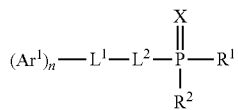

(1)

19 Claims, 3 Drawing Sheets

(51) Int. Cl.
    *C07F 9/6561*    (2006.01)
    *C07F 9/6512*    (2006.01)
    *H01L 51/00*     (2006.01)
    *H10K 85/60*     (2023.01)
    *H10K 50/16*     (2023.01)

(52) U.S. Cl.
    CPC ....... *C07F 9/65583* (2013.01); *H10K 85/622* (2023.02); *H10K 85/654* (2023.02); *H10K 85/6572* (2023.02); *H10K 85/6574* (2023.02); *H10K 50/16* (2023.02)

(56) References Cited

OTHER PUBLICATIONS

PCT International Search Report and Written Opinion for PCT Application No. PCT/EP2018/063167 dated Jul. 25, 2018 (7 pages).
Notification of First Office Action issued in China application No. 201880033940.7, dated May 26, 2022, 14 pages.
Communication pursuant to Article 94(3) EPC issued in corresponding European application No. 17172393.5, dated Feb. 17, 2023, 5 pages.

* cited by examiner

ORGANIC ELECTRONIC DEVICE COMPRISING AN ORGANIC SEMICONDUCTOR LAYER AND A DEVICE

CROSS REFERENCE TO RELATED APPLICATIONS

This application is a U.S. national stage application of PCT/EP2018/063167, filed May 18, 2018, which claims priority to European Patent Application No. 17172393.5, filed May 23, 2017. The content of these applications is incorporated herein by reference.

TECHNICAL FIELD

The present invention relates to an organic electronic device comprising an organic semiconductor layer, an organic semiconductor layer and a method of manufacturing the same.

BACKGROUND ART

Organic electronic devices, such as organic light-emitting diodes OLEDs, which are self-emitting devices, have a wide viewing angle, excellent contrast, quick response, high brightness, excellent operating voltage characteristics, and color reproduction. A typical OLED comprises an anode, a hole transport layer HTL, an emission layer EML, an electron transport layer ETL, and a cathode, which are sequentially stacked on a substrate. In this regard, the HTL, the EML, and the ETL are thin films formed from organic compounds.

When a voltage is applied to the anode and the cathode, holes injected from the anode move to the EML, via the HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency and/or a long lifetime.

Performance of an organic light emitting diode may be affected by characteristics of the organic semiconductor layer, and among them, may be affected by characteristics of an organic material of the organic semiconductor layer. Particularly, development for an organic material being capable of increasing electron mobility and simultaneously increasing electrochemical stability is needed so that the organic electronic device, such as an organic light emitting diode, may be applied to a large-size flat panel display.

WO2017089399 relates to an. organic semiconductive layer which is an electron transport layer and/or an electron injection layer and/or an n-type charge generation layer, the organic semiconductive layer comprising at least one compound of formula (1)

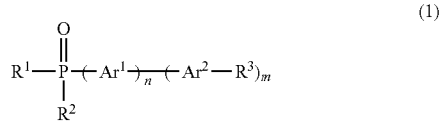
(1)

wherein R1 and R2 are each independently selected from C1 to C16 alkyl; Ar1 is selected from C6 to C14 arylene or C3 to C12 heteroarylene; Ar2 is independently selected from C14 to C40 arylene or C8 to C40 heteroarylene; R3 is independently selected from H, C1 to C12 alkyl or C10 to C20 aryl; wherein each of Ar1, Ar2 and R3 may each independently be unsubstituted or substituted with at least one C1 to C12 alky group; n is 0 or 1; and m is 1 in case of n=0; and m is 1 or 2 in case of n=1, phosphine oxide compounds comprised therein and to organic electroluminescent devices comprising such layers and compounds.

US2017141324 provides an electronic device including a novel structured interface material capable of improving interface properties of the electronic device, and the novel interface material, and more specifically, an electronic device including the interface material of the present disclosure to allow easy extraction and injection of electrons, thereby exhibiting excellent interface properties, and a phosphine oxide functionalized triazine derivative having a structure in which an electron acceptor phosphine oxide group is substituted in 1,3,5-triazine-based skeleton, which is the interface material.

EP2452946 relates new compounds and to an organic electronic device comprising at least one substantially organic layer comprising a non fully conjugated chemical compound, which compound is preferably used in electron transport layers, electron injection layers. The invention also includes a process for preparing an organic electronic device, wherein the substantially organic layer comprising a non fully conjugated chemical compound is deposited on a first layer, and a second layer is deposited on the substantially organic layer, preferably a cathode being deposited on the substantially organic layer comprising the non fully conjugated chemical compound.

There remains a need to improve performance of organic semiconductor layers, organic semiconductor materials, as well as organic electronic devices thereof, in particular to achieve higher efficiency and/or longer lifetime through improving the characteristics of the compounds comprised therein.

In particular there is a need for organic semiconductor materials and organic semiconductor layer as well as organic electronic devices with improved conductivity and thereby reduced operating voltage.

There is a need for a reduced operating voltage and thereby reduced power consumption and increased battery life of for example mobile electronic devices, as well as for increased efficiency and lifetime in such devices.

DISCLOSURE

An aspect of the present invention provides an organic electronic device comprising an organic semiconductor layer, wherein at least one organic semiconductor layer comprises a compound of formula 1:

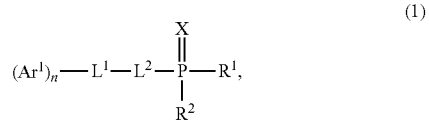
(1)

wherein
X is selected from O, S or Se;
Ar¹ is selected from unsubstituted or substituted $C_2$ to $C_{60}$ heteroarylene, and wherein the substituted $C_2$ to $C_{60}$ heteroarylene comprises at least about one to about six substituents, wherein the substituent of the substituted $C_2$ to $C_{60}$ heteroarylene are independently selected from $C_1$ to $C_{12}$ alkyl, $C_1$ to $C_{12}$ alkoxy, CN, OH, halogen, $C_6$ to $C_{36}$ arylene, or $C_2$ to $C_{25}$ heteroarylene;

n is 1 or 2;

$L^1$ is selected from a single bond, $C_1$ to $C_4$ alkyl, substituted or unsubstituted $C_6$ to $C_{36}$ arylene, wherein the substituent of substituted $C_6$ to $C_{36}$ arylene is selected from $C_1$ to $C_{12}$ alkyl, $C_6$ to $C_{18}$ arylene;

$L^2$ is selected from a single bond or $C_1$ to $C_6$ alkyl, $R^1$, $R^2$ are independently selected from substituted or unsubstituted $C_1$ to $C_{16}$ alkyl, wherein the substituent of substituted $C_1$ to $C_{16}$ alkyl is selected from $C_6$ to $C_{18}$ arylene or $C_2$ to $C_{12}$ heteroarylene, wherein the compound of formula 1 comprises:

at least about 4 of $C_6$-arylene rings, a molecular mass of at least about 400 g/mol to about 1800 g/mol.

According to one embodiment, the organic electronic device comprises an organic semiconductor layer, wherein at least one organic semiconductor layer comprises a compound of formula 1:

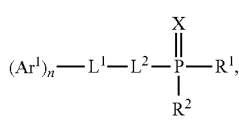

(1)

wherein

X is selected from O, S or Se;

$Ar^1$ is selected from unsubstituted or substituted $C_2$ to $C_{60}$ heteroarylene, and wherein the substituted $C_2$ to $C_{60}$ heteroarylene comprises at least about one to about six substituents, wherein the substituent of the substituted $C_2$ to $C_{60}$ heteroarylene are independently selected from $C_1$ to $C_{12}$ alkyl, $C_1$ to $C_{12}$ alkoxy, CN, OH, halogen, $C_6$ to $C_{36}$ arylene, or $C_2$ to $C_{25}$ heteroarylene;

n is 1 or 2;

$L^1$ is selected from a single bond, $C_1$ to $C_4$ alkyl, substituted or unsubstituted $C_6$ to $C_{36}$ arylene, wherein the substituent of substituted $C_6$ to $C_{36}$ arylene is selected from $C_1$ to $C_{12}$ alkyl, $C_6$ to $C_{18}$ arylene;

$L^2$ is selected from a single bond or $C_1$ to $C_6$ alkyl, $R^1$, $R^2$ are independently selected from substituted or unsubstituted $C_1$ to $C_{16}$ alkyl, wherein the substituent of substituted $C_1$ to $C_{16}$ alkyl is selected from $C_6$ to $C_{18}$ arylene or $C_2$ to $C_{12}$ heteroarylene, wherein the compound of formula 1 comprises at least one hetereoarylene ring with at least two N-atoms, preferably three N-atoms and in addition:

at least about 5 of $C_6$-arylene rings, and preferably 6 of $C_6$-arylene rings, a molecular mass of at least about 400 g/mol to about 1800 g/mol.

According to the present description a $C_6$-arylene ring is free of a heteroatom.

According to one embodiment the following compounds are excluded:

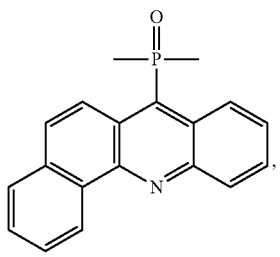

1c

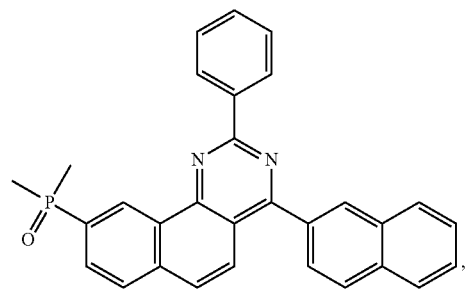

1d

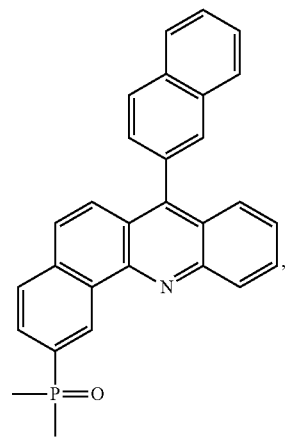

1e

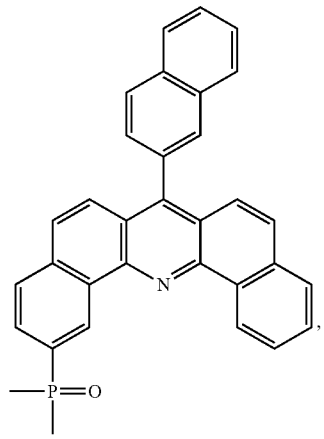

1f

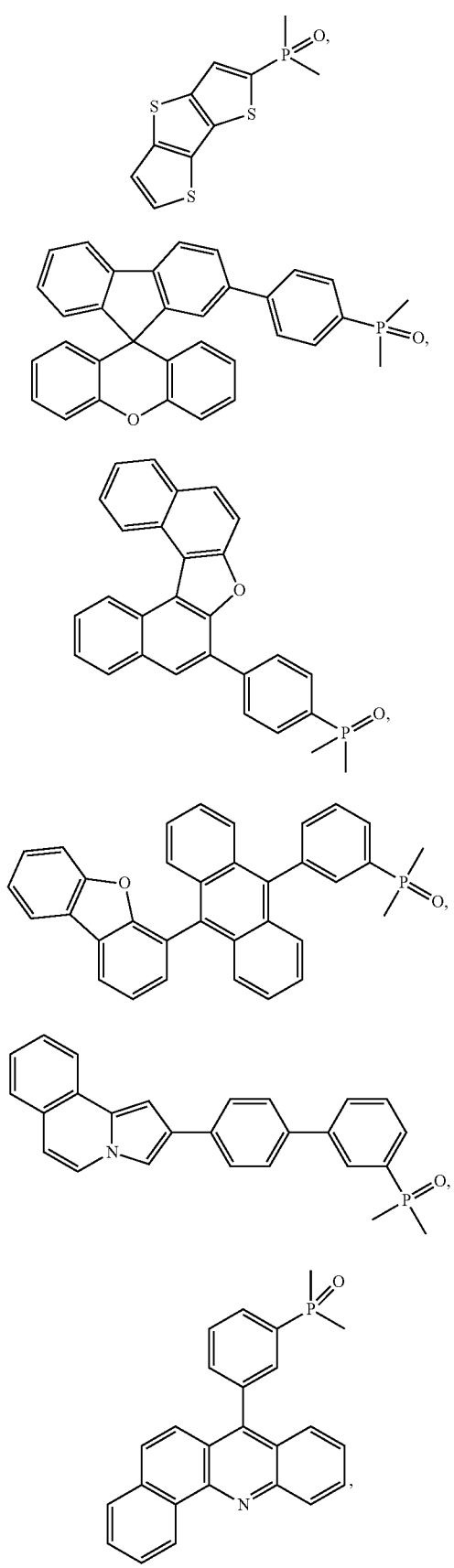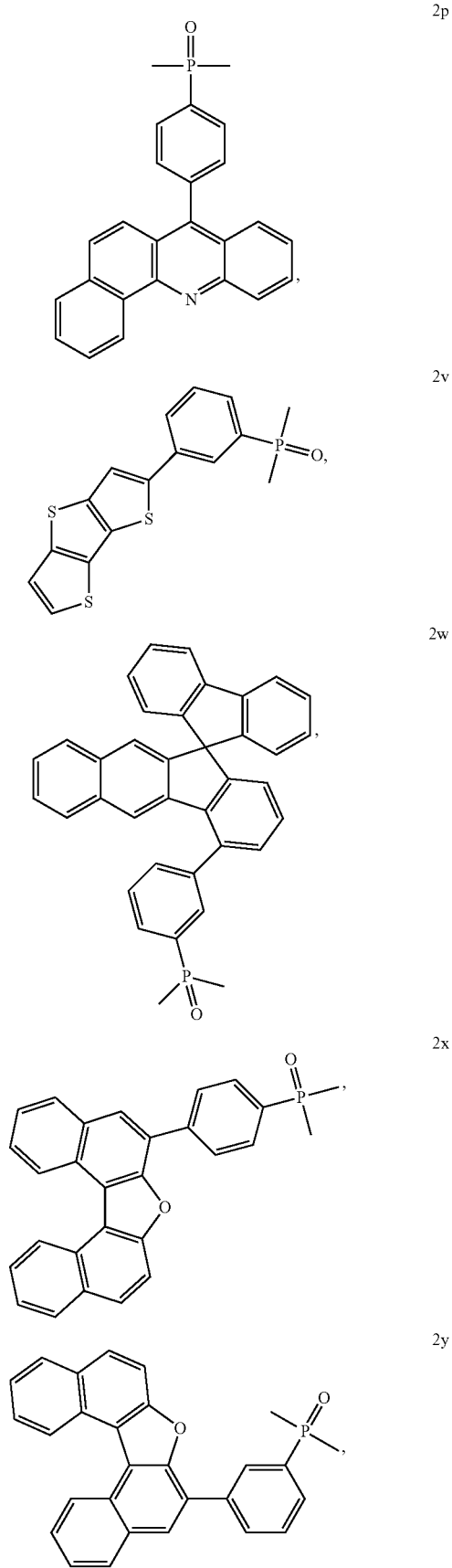

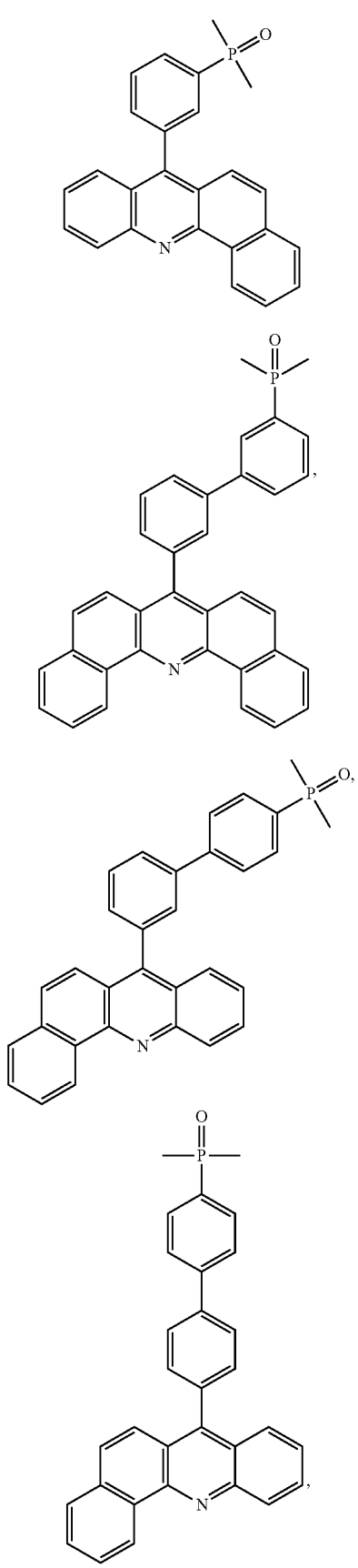
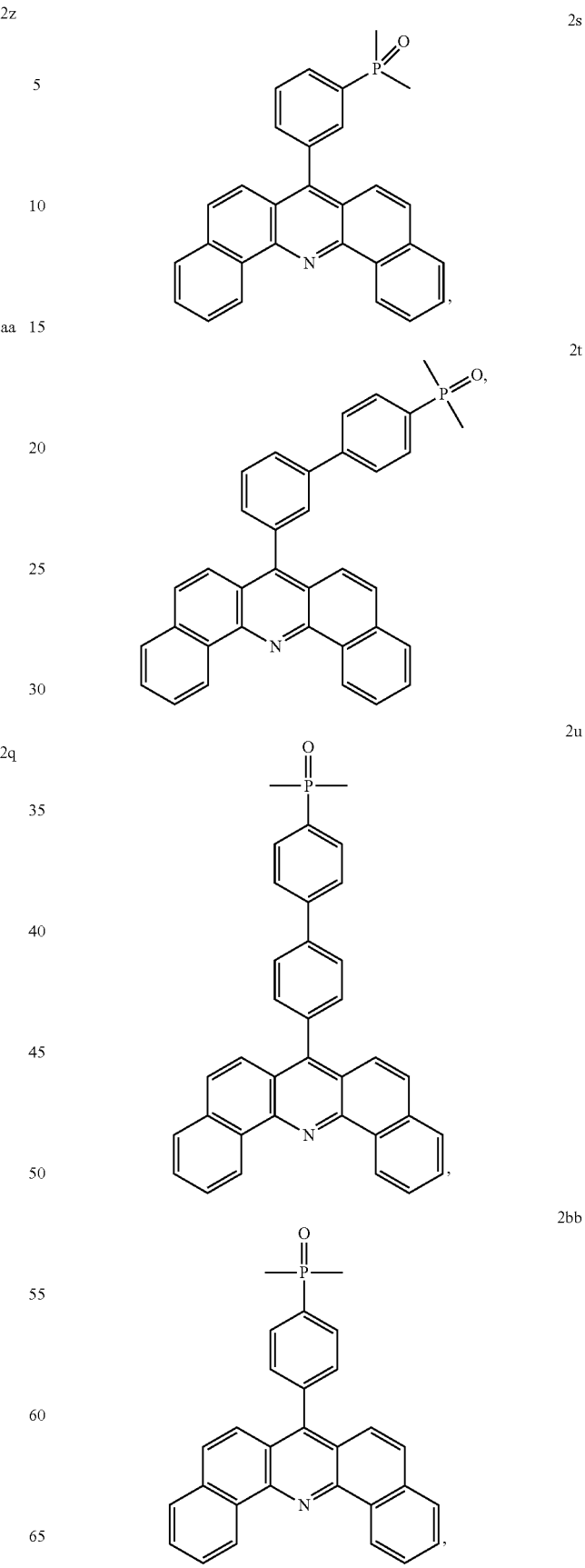

2cc 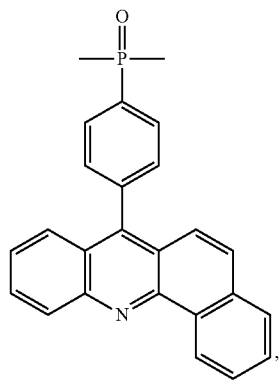
2ff 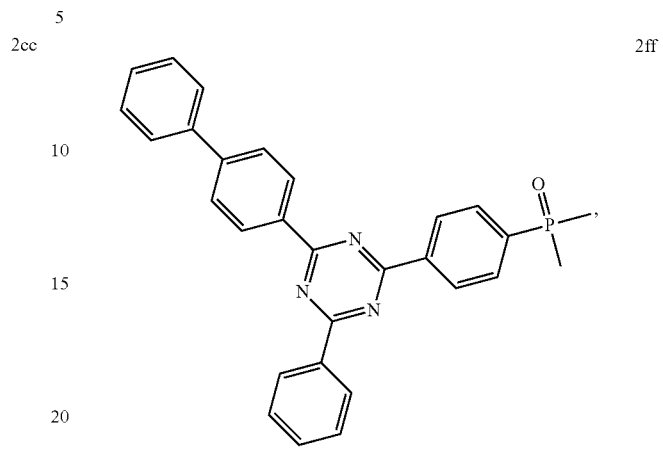
2dd 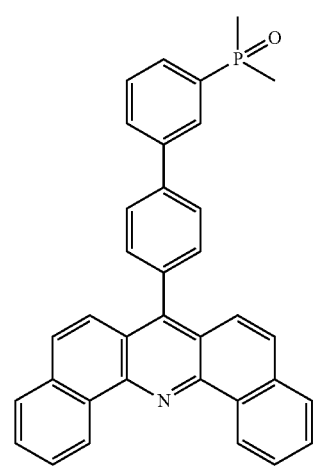
2gg 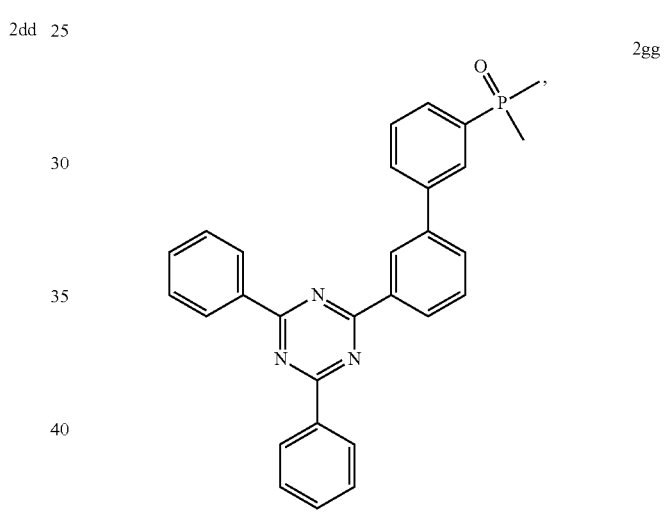
2ee 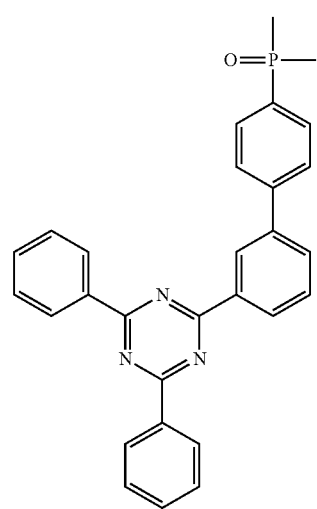
3hh 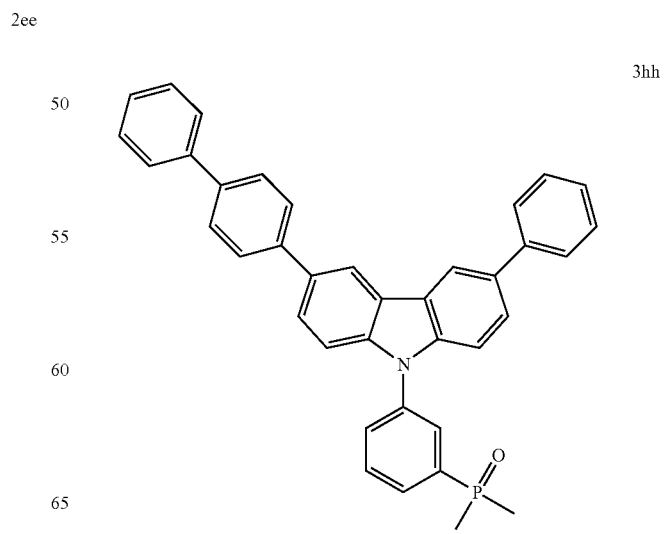

3ii
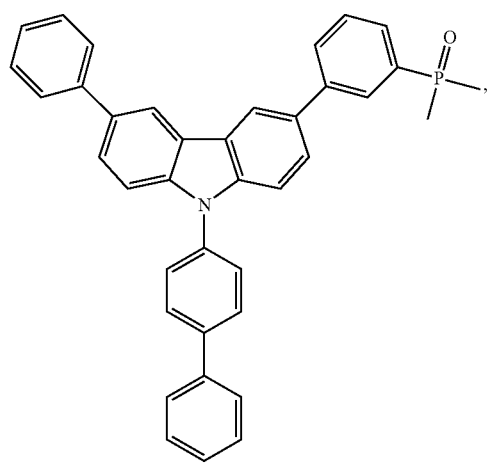
3ll
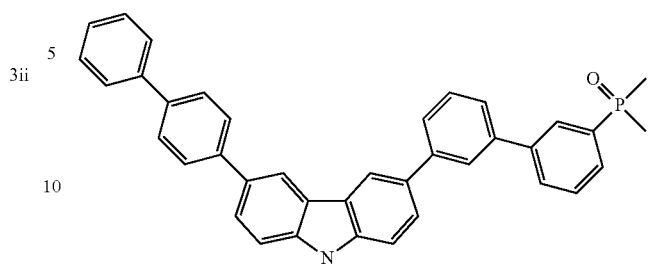
3mm
3jj
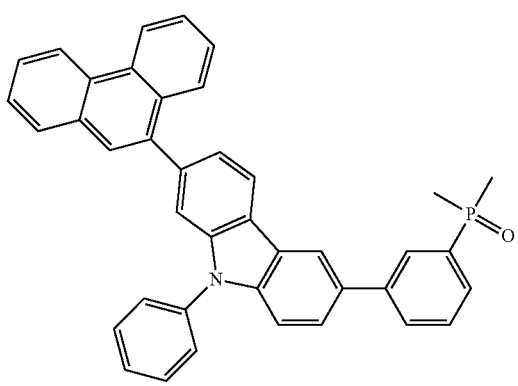
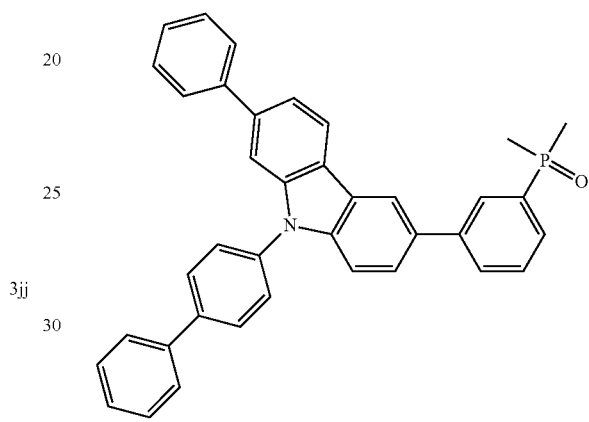
3nn
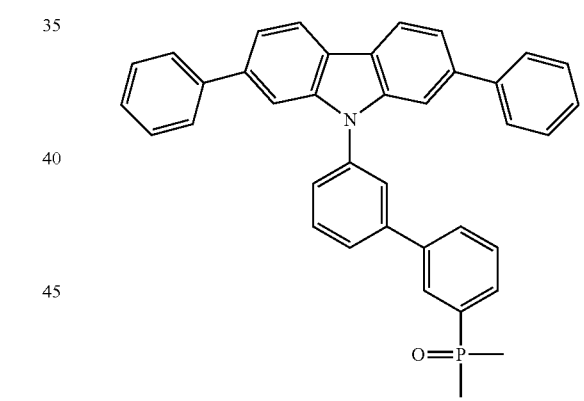
3kk
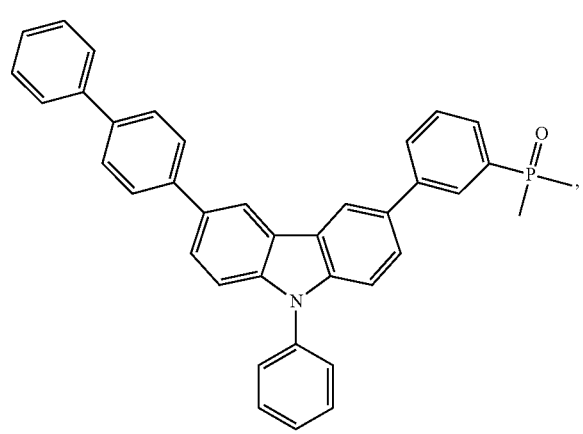
3oo
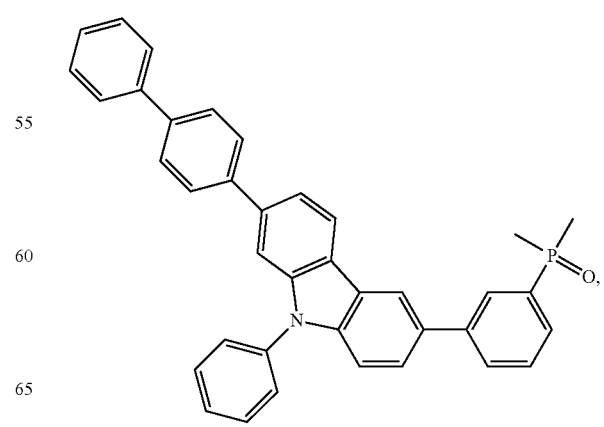

-continued

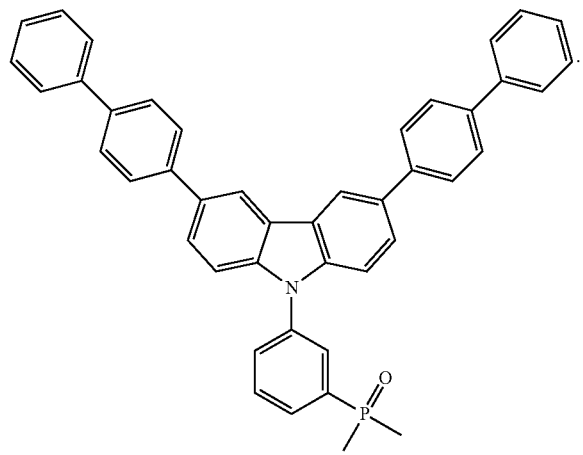

3pp

According to another embodiment, the organic electronic device may comprises an organic semiconductor layer, wherein at least one organic semiconductor layer comprises a compound of formula 1:

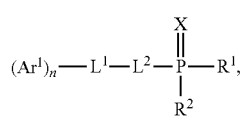

(1)

wherein
  X is selected from O, S or Se;
  $Ar^1$ is selected from unsubstituted or substituted $C_2$ to $C_{60}$ heteroarylene, and wherein the substituted $C_2$ to $C_{60}$ heteroarylene comprises at least about one to about six substituents,
    wherein the substituent of the substituted $C_2$ to $C_{60}$ heteroarylene are independently selected from $C_1$ to $C_{12}$ alkyl, $C_1$ to $C_{12}$ alkoxy, CN, OH, halogen, $C_6$ to $C_{36}$ arylene, or $C_2$ to $C_{25}$ heteroarylene;
  n is 1 or 2;
  $L^1$ is selected from a single bond, $C_1$ to $C_4$ alkyl, substituted or unsubstituted $C_6$ to $C_{36}$ arylene,
    wherein the substituent of substituted $C_6$ to $C_{36}$ arylene is selected from $C_1$ to $C_{12}$ alkyl, $C_6$ to $C_{18}$ arylene;
  $L^2$ is selected from a single bond or $C_1$ to $C_6$ alkyl,
  $R^1$, $R^2$ are independently selected from substituted or unsubstituted $C_1$ to $C_{16}$ alkyl,
    wherein the substituent of substituted $C_1$ to $C_{16}$ alkyl is selected from $C_6$ to $C_{18}$ arylene or $C_2$ to $C_{12}$ heteroarylene,
  wherein the compound of formula 1 comprises:
    at least about 4 of $C_6$-arylene rings,
    a molecular mass of at least about 400 g/mol to about 1800 g/mol; and wherein the following compounds are excluded:

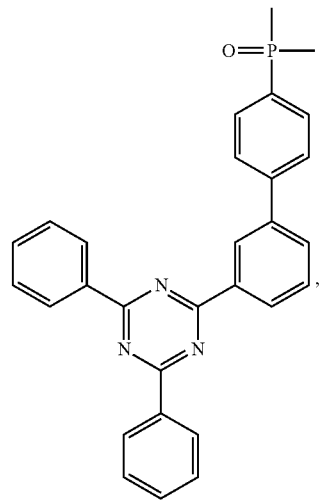

2ee

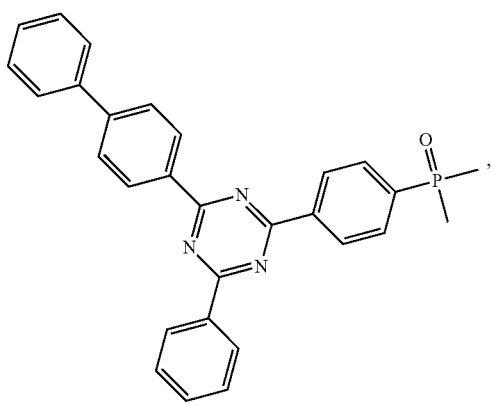

2ff

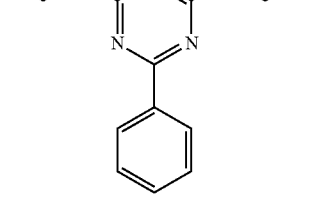

2gg

According to another embodiment, in addition the following compounds can be excluded:

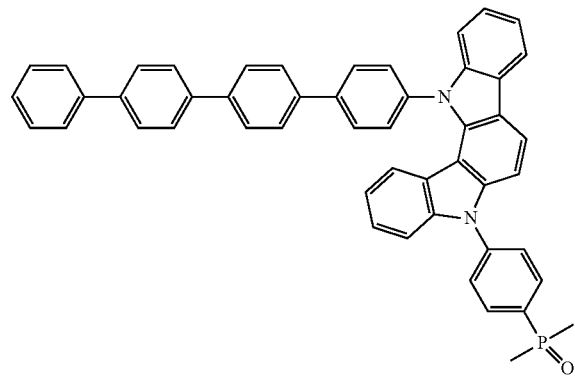

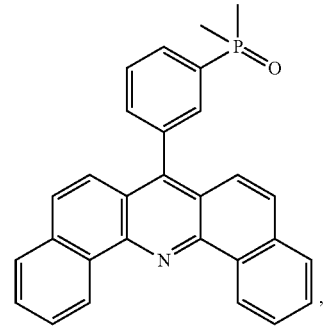

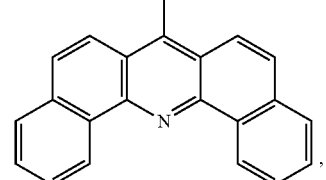

and

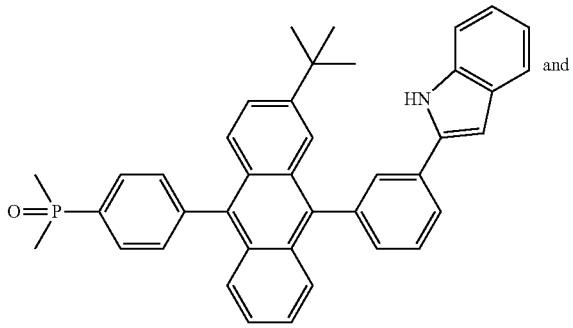

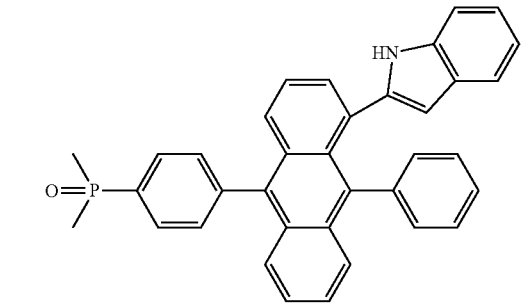

According to another embodiment, the compound of formula 1 comprises at least one hetereoarylene ring with at least two N-atoms and in addition:
- at least about 6 of C$_6$-arylene rings, and
- a molecular mass of at least about 400 g/mol to about 1800 g/mol.

According to another embodiment, the compound of formula 1 comprises at least one hetereoarylene ring with at least three N-atoms and in addition:
- at least about 5 of C$_6$-arylene rings, preferably 6 of C$_6$-arylene rings, and
- a molecular mass of at least about 400 g/mol to about 1800 g/mol.

According to another embodiment, the compound of formula 1 comprises at least one hetereoarylene ring with at least two N-atoms, wherein the following compounds are excluded:

1d

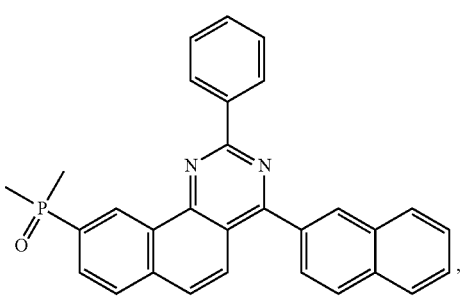

2ee

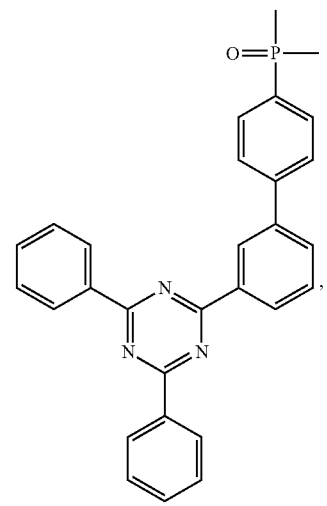

2ff

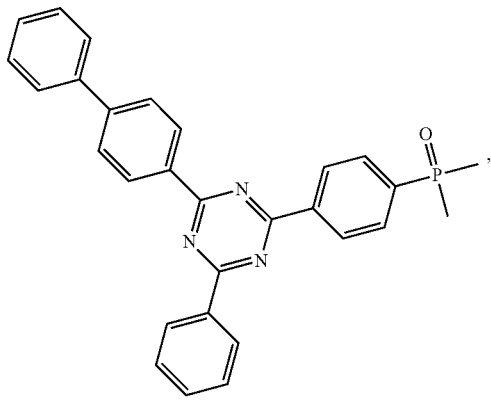

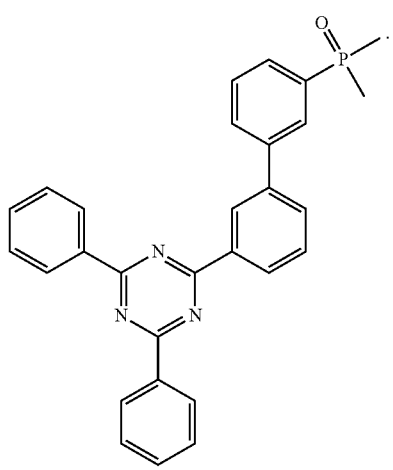

2gg

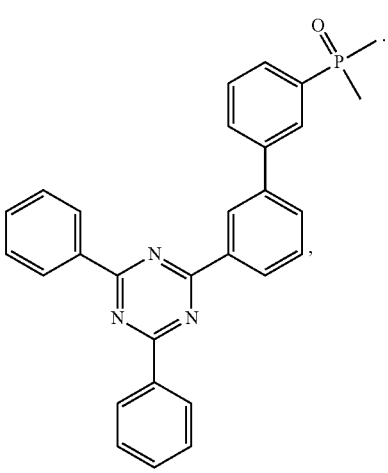

2gg

According to another embodiment, the compound of formula 1 comprises at least one hetereoarylene ring with at least three N-atoms, wherein the following compounds are excluded:

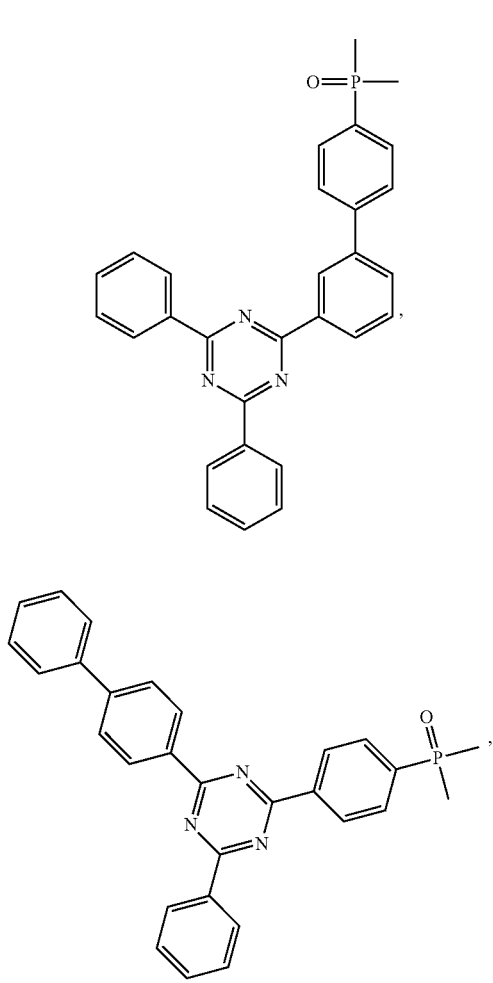

2ee

2ff

According to another embodiment of the organic electronic device that comprises an organic semiconductor layer, wherein at least one organic semiconductor layer comprises a compound of formula 1:

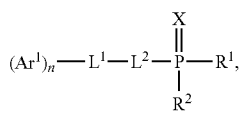

(1)

wherein

X is selected from O, S or Se;

Ar$^1$ is selected from unsubstituted or substituted C$_2$ to C$_{60}$ heteroarylene, and wherein the substituted C$_2$ to C$_{60}$ heteroarylene comprises at least about one to about six substituents, wherein the substituent of the substituted C$_2$ to C$_{60}$ heteroarylene are independently selected from C$_1$ to C$_{12}$ alkyl, C$_1$ to C$_{12}$ alkoxy, CN, OH, halogen, C$_6$ to C$_{36}$ arylene, C$_2$ to C$_{25}$ heteroarylene;

n is 1 or 2;

L$^1$ is selected from a single bond, C$_1$ to C$_4$ alkyl, substituted or unsubstituted C$_6$ to C$_{36}$ arylene, wherein the substituent of substituted C$_6$ to C$_{36}$ arylene is selected from C$_1$ to C$_{12}$ alkyl, C$_6$ to C$_{18}$ arylene;

L$^2$ is selected from a single bond or C$_1$ to C$_6$ alkyl,

R$^1$, R$^2$ are independently selected from substituted or unsubstituted C$_1$ to C$_{16}$ alkyl, wherein the substituent of substituted C$_1$ to C$_{16}$ alkyl is selected from C$_6$ to C$_{18}$ arylene or C$_2$ to C$_{12}$ heteroarylene, wherein the compound of formula 1 comprises:

at least about 4 to about 12 of C$_6$-arylene rings and/or at least about 4 to about 12 condensed C$_6$-arylene rings, a molecular mass of at least about 400 g/mol to about 1800 g/mol; and wherein the following compounds are excluded:

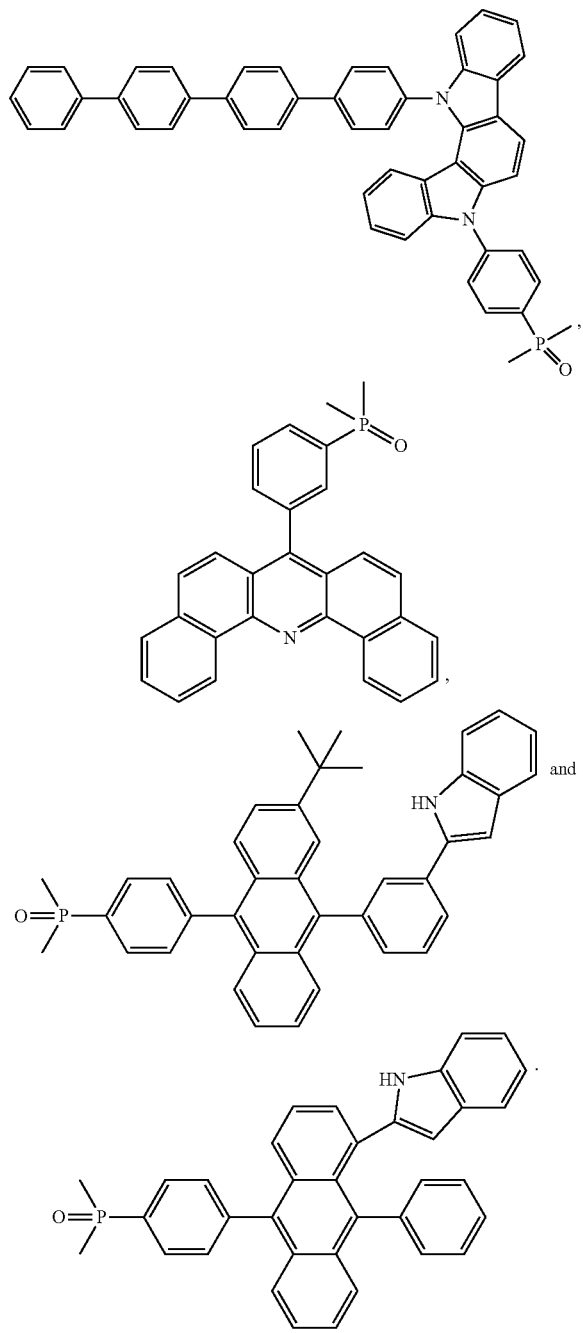

According to another embodiment of the organic electronic device that comprises an organic semiconductor layer, wherein in formula 1:
$L^1$ is selected from $C_1$ to $C_4$ alkyl, substituted or unsubstituted $C_6$ to $C_{36}$ arylene, wherein the substituent of substituted $C_6$ to $C_{36}$ arylene is selected from $C_1$ to $C_{12}$ alkyl, $C_6$ to $C_{18}$ arylene.

According to another embodiment of the organic electronic device that comprises an organic semiconductor layer, wherein in formula 1: the heteroarylene of $Ar^1$, which bonds directly via a single bond to $L^1$, comprises at least two hetero-atoms, preferably two N atoms.

According to another embodiment of the organic electronic device that comprises an organic semiconductor layer, wherein in formula 1: $L^1$ comprises at least about 2 to about 10 $C_6$-arylene rings or at least about 3 to about 9 $C_6$-arylene rings or at least about 4 to about 8 $C_6$-arylene rings.

According to another embodiment of the organic electronic device that comprises an organic semiconductor layer, wherein in formula 1: $L^1$ comprises at least about 2 to about 10 condensed $C_6$-arylene rings or at least about 3 to about 9 condensed $C_6$-arylene rings or at least about 4 to about 8 condensed $C_6$-arylene rings.

According to another embodiment of the organic electronic device that comprises an organic semiconductor layer, wherein in formula 1:
the heteroarylene of $Ar^1$, which bonds directly via a single bond to $L^1$, comprises at least two hetero-atoms, preferably two N atoms; and
$L^1$ comprises at least about 2 to about 10 of $C_6$-arylene rings.

The compound represented by formula 1, and an organic semiconductor layer as well as organic electronic device comprising the compound of formula 1, have strong electron transport characteristics to increase charge mobility and/or stability and thereby to improve luminance efficiency, voltage characteristics, and/or life-span characteristics.

The compound represented by formula 1, and an organic semiconductor layer as well as organic electronic device comprising the compound of formula 1 have high electron mobility and a low operating voltage.

Without being bounded to a specific theory, it is assumed that the low operating voltage can be achieved for arylene and heteroarylene compounds with an alkyl PO group bonded thereto. This may be due to the reduced steric hindrance of the alkyl PO group compared to a phenyl PO groups. Thereby, a higher density of electron transporting arylene and heteroarylene groups may be achieved.

The organic semiconductor layer comprising a compound for formula 1 may be used as an electron transport layer as well as an emission layer.

According to another embodiment, the organic semiconductor layer may further comprise an emitter compound.

According to another embodiment, the organic semiconductor layer may consist of compound of formula 1.

According to another embodiment, the organic semiconductor layer may be:
essentially non-emissive or non-emissive, and/or
free of covalently bound metal, and/or
free of ionically bound metal, wherein the metal is selected from the group consisting of group III to VI, rare earth and transition metal.

The organic semiconductor layer may be essentially non-emissive or non-emissive.

In the context of the present specification the term "essentially non-emissive" or "non-emissive" means that the contribution of the compound or layer to the visible emission spectrum from the device is less than 10%, preferably less than 5% relative to the visible emission spectrum. The visible emission spectrum is an emission spectrum with a wavelength of about ≥380 nm to about ≤780 nm.

Preferably, the organic semiconductor layer comprising the compound of formula 1 is essentially non-emissive or non-emissive.

According to another embodiment, the organic semiconductor layer comprising the compound of formula 1 is free of group III to VI, rare earth and transition metal compounds.

According to another embodiment, the organic semiconductor layer comprising the compound of formula 1 is free of metal, metal salts and metal complexes.

The term "free of", "does not contain", "does not comprise" does not exclude impurities which may be present in the compounds prior to deposition. Impurities have no technical effect with respect to the object achieved by the present invention.

The operating voltage, also named U, is measured in Volt (V) at 10 milliAmpere per square centimeter (mA/cm2).

The candela per Ampere efficiency, also named cd/A efficiency, is measured in candela per ampere at 10 milli-Ampere per square centimeter (mA/cm2).

The external quantum efficiency, also named EQE, is measured in percent (%).

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The term "OLED", "organic light emitting diode", "light emitting device", "organic optoelectronic device" and "organic light-emitting diode" are simultaneously used and have the same meaning.

The term "transition metal" means and comprises any element in the d-block of the periodic table, which comprises groups 3 to 12 elements on the periodic table.

The term "group III to VI metal" means and comprises any metal in groups III to VI of the periodic table.

The term "life-span" and "lifetime" are simultaneously used and have the same meaning.

As used herein, "weight percent", "wt.-%", "percent by weight", "% by weight", and variations thereof refer to a composition, component, substance or agent as the weight of that composition, component, substance or agent of the respective electron transport layer divided by the total weight of the composition thereof and multiplied by 100. It is understood that the total weight percent amount of all components, substances or agents of the respective electron transport layer are selected such that it does not exceed 100 wt.-%.

As used herein, "volume percent", "vol.-%", "percent by volume", "% by volume", and variations thereof refer to an elemental metal, a composition, component, substance or agent as the volume of that elemental metal, component, substance or agent of the respective electron transport layer divided by the total volume of the respective electron transport layer thereof and multiplied by 100. It is understood that the total volume percent amount of all elemental metal, components, substances or agents of the respective cathode electrode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not, modified by the term "about", the claims include equivalents to the quantities.

It should be noted that, as used in this specification and the appended claims, the singular forms "a", "an", and "the" include plural referents unless the content clearly dictates otherwise.

The anode electrode and cathode electrode may be described as anode electrode/cathode electrode or anode electrode/cathode electrode or anode electrode layer/cathode electrode layer.

According to another aspect, an organic optoelectronic device comprises an anode layer and a cathode layer facing each other and at least one organic semiconductor layer between the anode layer and the cathode layer, wherein the organic semiconductor layer comprises the compound of formula 1.

According to yet another aspect, a display device comprising the organic optoelectronic device is provided.

In the present specification, when a definition is not otherwise provided, an "alkyl group" may refers to an aliphatic hydrocarbon group. The alkyl group may refer to "a saturated alkyl group" without any double bond or triple bond.

The alkyl group may be a $C_1$ to $C_{12}$ alkyl group. More specifically, the alkyl group may be a $C_1$ to $C_{10}$ alkyl group or a $C_1$ to $C_6$ alkyl group. For example, a $C_1$ to $C_4$ alkyl group comprises 1 to 4 carbons in alkyl chain, and may be selected from methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

In the present specification "arylene group" may refer to a group comprising at least one hydrocarbon aromatic moiety, and all the elements of the hydrocarbon aromatic moiety may have p-orbitals which form conjugation, for example a phenyl group, a naphthyl group, an anthracenyl group, a phenanthrenyl group, a pyrenyl group, a fluorenyl group and the like.

The arylene group may include a monocyclic, polycyclic or fused ring polycyclic (i.e., rings sharing adjacent pairs of carbon atoms) functional group.

The term "heteroarylene" refers to aromatic heterocycles with at least one heteroatom, and all the elements of the hydrocarbon heteroaromatic moiety may have p-orbitals which form conjugation.

The heteroatom may be selected from N, O, S, B, Si, P, Se, preferably from N, O and S. The term "heteroarylene" as used herewith shall encompass pyridine, quinoline, quinozaline, pyridine, triazine, benzimidazole, benzothiazole, benzo[4,5]thieno[3,2-d]pyrimidine, carbazole, xanthene, phenoxazine, benzoacridine, dibenzoacridine and the like.

According to one embodiment the "heteroarylene" as used herewith may exclude benzoacridine and/or dibenzoacridine.

In the present specification, the single bond refers to a direct bond.

The term "$C_6$-arylene rings" means single $C_6$-arylene rings and $C_6$-arylene rings, which form condensed ring systems. For example, a naphthylene group would be counted as a two condensed $C_6$-arylene rings.

According to another aspect of the present invention, an organic electronic device is provided comprising an organic semiconductor layer, wherein at least one organic semiconductor layer comprising a compound of formula 1:

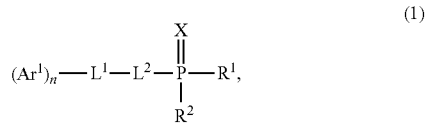

(1)

wherein
X is selected from O, S or Se;
Ar¹ is selected from unsubstituted or substituted $C_2$ to $C_{60}$ heteroarylene, and wherein the substituted $C_2$ to $C_{60}$ heteroarylene comprises at least about one to about six substituents,
wherein the substituent of the substituted $C_2$ to $C_{60}$ heteroarylene are independently selected from $C_1$ to $C_{12}$ alkyl, $C_1$ to $C_{12}$ alkoxy, CN, OH, halogen, $C_6$ to $C_{36}$ arylene, $C_2$ to $C_{25}$ heteroarylene;
n is 1 or 2;
L¹ is selected from a single bond, $C_1$ to $C_4$ alkyl, substituted or unsubstituted $C_6$ to $C_{36}$ arylene,
wherein the substituent of substituted $C_6$ to $C_{36}$ arylene is selected from $C_1$ to $C_{12}$ alkyl, $C_6$ to $C_{18}$ arylene;
L² is selected from a single bond or $C_1$ to $C_6$ alkyl,
R¹, R² are independently selected from substituted or unsubstituted $C_1$ to $C_{16}$ alkyl,
wherein the substituent of substituted $C_1$ to $C_{16}$ alkyl is selected from $C_6$ to $C_{18}$ arylene or $C_2$ to $C_{12}$ heteroarylene,
wherein the compound of formula 1 comprises:
least about 4 $C_6$-arylene rings and/or at least about 4 condensed $C_6$-arylene rings,
a molecular mass of at least about 400 g/mol to about 1800 g/mol; and
wherein the following compounds are excluded:
a) a compound according to formula (I):

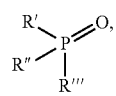

(I)

wherein
R', R" and R'" are independently selected from $C_1$-$C_{30}$-alkyl, $C_3$-$C_{30}$ cycloalkyl, $C_2$-$C_{30}$-heteroalkyl, and from structural unit having general formula E-A-;
wherein
A is a $C_6$-$C_{30}$ phenylene spacer unit, and
E is an electron transport unit having the structure (Ia), (Ib) and/or (Ic):

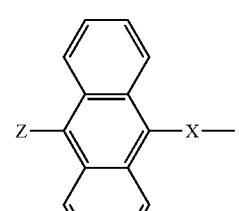

(Ia)

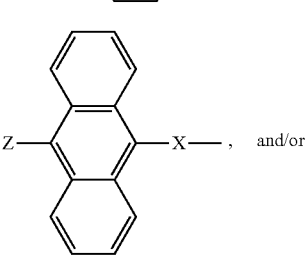

(Ib) and/or

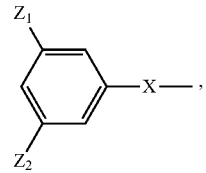

(Ic)

wherein in structure (Ia)
X is a single bond and
Z is selected from a group comprising dibenzo[b,d]furanyl, dibenzo[b,d]thiophenyl;
wherein in structure (Ib)
X is selected from a group comprising, phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl; and
Z is selected from a group comprising, dibenzo[b,d]furanyl, dibenzo[b,d]thiophenyl, 9-anthranyl;
wherein in structure (Ic)
X is a single bond; and
$Z_1$ and $Z_2$ are independently selected from a group comprising dibenzo[b,d]furanyl, dibenzo[b,d]thiophenyl;
b) compounds of formula 1,

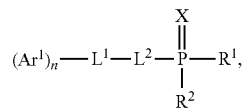

(1)

wherein Ar¹ is selected from carbazole, indolo[3,2-a]carbazole, or dibenzo[c,h]acridine; and
c) compounds G1 to G5:

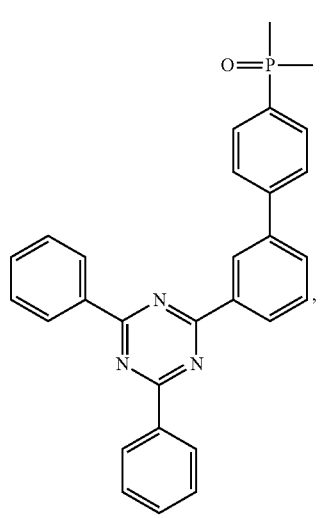

(G1)

-continued (G2)
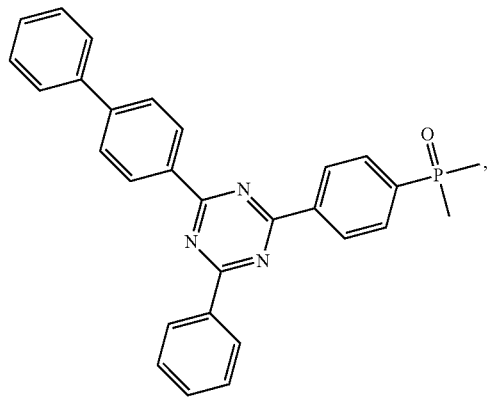

(G3)
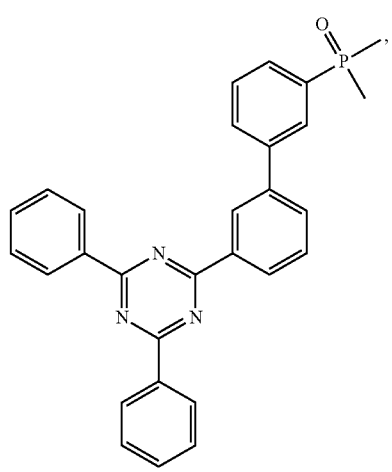

(G4)
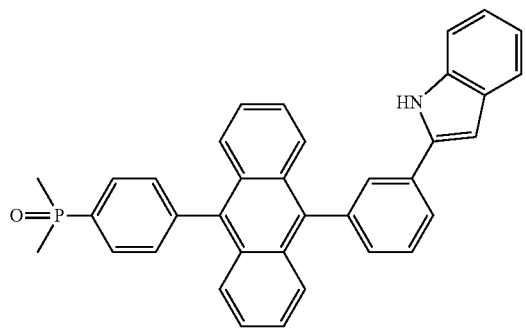
and (G5)
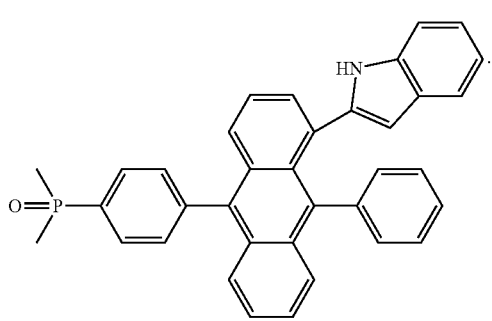

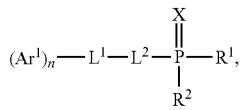

(1)

wherein
X is selected from O, S or Se;
Ar$^1$ is selected from unsubstituted or substituted C$_2$ to C$_{60}$ heteroarylene, and wherein the substituted C$_2$ to C$_{60}$ heteroarylene comprises at least about one to about six substituents,
  wherein the substituent of the substituted C$_2$ to C$_{60}$ heteroarylene are independently selected from C$_1$ to C$_{12}$ alkyl, C$_1$ to C$_{12}$ alkoxy, CN, OH, halogen, C$_6$ to C$_{36}$ arylene, C$_2$ to C$_{25}$ heteroarylene;
n is 1 or 2;
L$^1$ is selected from a single bond, C$_1$ to C$_4$ alkyl, substituted or unsubstituted C$_6$ to C$_{36}$ arylene,
  wherein the substituent of substituted C$_6$ to C$_{36}$ arylene is selected from C$_1$ to C$_{12}$ alkyl, C$_6$ to C$_{18}$ arylene;
L$^2$ is selected from a single bond or C$_1$ to C$_6$ alkyl,
R$^1$, R$^2$ are independently selected from substituted or unsubstituted C$_1$ to C$_{16}$ alkyl,
  wherein the substituent of substituted C$_1$ to C$_{16}$ alkyl is selected from C$_6$ to C$_{18}$ arylene or C$_2$ to C$_{12}$ heteroarylene,
wherein the compound of formula 1 comprises:
  least about 4 C$_6$-arylene rings and/or at least about 4 condensed C$_6$-arylene rings,
  a molecular mass of at least about 400 g/mol to about 1800 g/mol; and
  wherein the following compounds are excluded:
a) a compound according to formula (I):

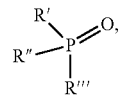

(I)

wherein
R', R" and R'" are independently selected from C$_1$-C$_{30}$-alkyl, C$_3$-C$_{30}$ cycloalkyl, C$_2$-C$_{30}$-heteroalkyl, C$_6$-C$_{30}$-aryl, C$_2$-C$_{30}$-heteroaryl, C$_1$-C$_{30}$-alkoxy, C$_3$-C$_{30}$-cycloalkyloxy, C$_6$-C$_{30}$-aryloxy, and from structural unit having general formula E-A-;
wherein
A is a C$_6$-C$_{30}$ phenylene spacer unit, and
E is an electron transporting unit that is selected from C$_{10}$-C$_{60}$ aryl and C$_6$-C$_{60}$ heteroaryl comprising up to 6 heteroatoms independently selected from O, S, P, Si and B and that comprises a conjugated system of at least 10 delocalized electrons, and
at least one group selected from R', R" and R'" has the general formula E-A-;
b) compounds of formula 1,

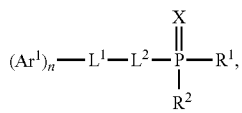

(1)

According to another aspect of the present invention, an organic electronic device is provided comprising an organic semiconductor layer, wherein at least one organic semiconductor layer comprising a compound of formula 1:

wherein Ar¹ is selected from carbazole, indolo[3,2-a]carbazole, or dibenzo[c,h]acridine; and c) compounds G1 to G5:

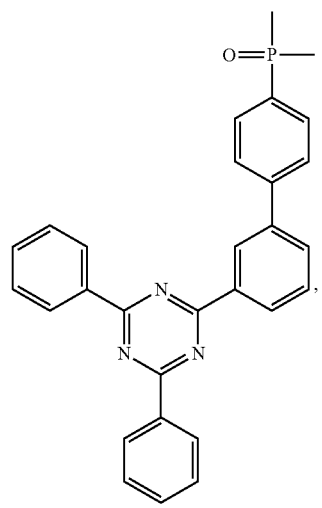
(G1)

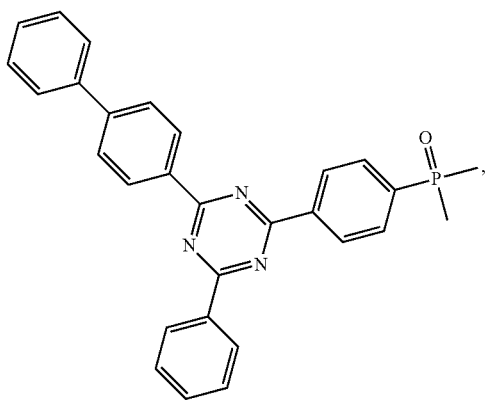
(G2)

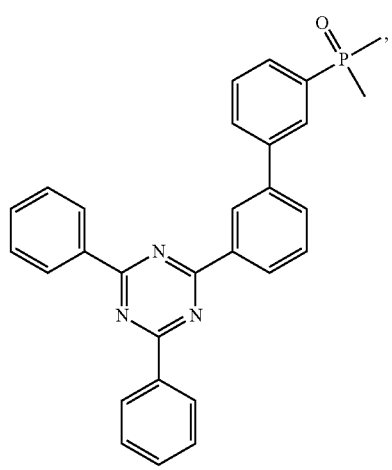
(G3)

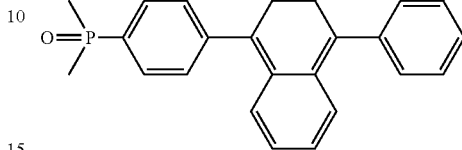
(G4)

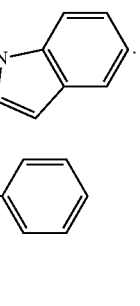
(G5)

According to another aspect of the present invention, an organic electronic device is provided comprising an organic semiconductor layer, wherein at least one organic semiconductor layer consisting of a compound of formula 1:

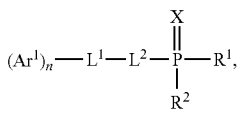
(1)

wherein
  X is selected from O, S or Se;
  Ar¹ is selected from unsubstituted or substituted $C_2$ to $C_{60}$ heteroarylene, and wherein the substituted $C_2$ to $C_{60}$ heteroarylene comprises at least about one to about six substituents,
    wherein the substituent of the substituted $C_2$ to $C_{60}$ heteroarylene are independently selected from $C_1$ to $C_{12}$ alkyl, $C_1$ to $C_{12}$ alkoxy, CN, OH, halogen, $C_6$ to $C_{36}$ arylene, $C_2$ to $C_{25}$ heteroarylene;
  n is 1 or 2;
  L¹ is selected from a single bond, $C_1$ to $C_4$ alkyl, substituted or unsubstituted $C_6$ to $C_{36}$ arylene,
    wherein the substituent of substituted $C_6$ to $C_{36}$ arylene is selected from $C_1$ to $C_{12}$ alkyl, $C_6$ to $C_{18}$ arylene;
  L² is selected from a single bond or $C_1$ to $C_6$ alkyl,
  R¹, R² are independently selected from substituted or unsubstituted $C_1$ to $C_{16}$ alkyl,
    wherein the substituent of substituted $C_1$ to $C_{16}$ alkyl is selected from $C_6$ to $C_{18}$ arylene or $C_2$ to $C_{12}$ heteroarylene,
wherein the compound of formula 1 comprises:
  at least about 4 $C_6$-arylene rings and/or at least about 4 condensed $C_6$-arylene rings,
  a molecular mass of at least about 400 g/mol to about 1800 g/mol; and wherein the following compounds are excluded:

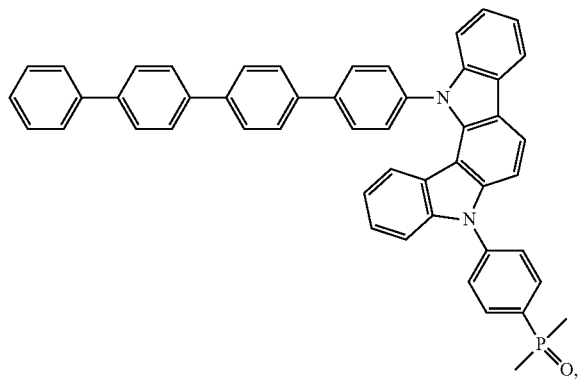

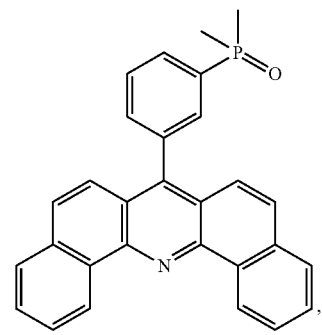

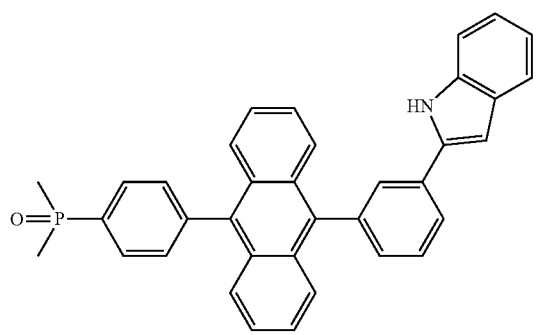

and

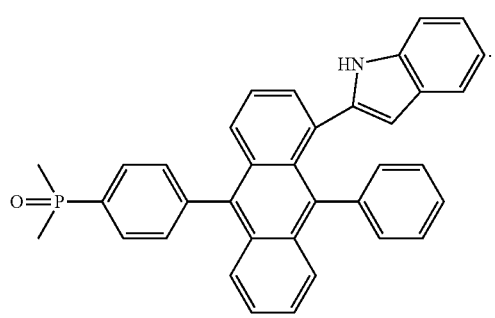

According to one embodiment the organic electronic device comprises an organic semiconductor layer, wherein at least one organic semiconductor layer comprises a compound of formula 1:

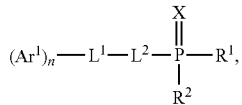

(1)

wherein
- X is selected from O, S or Se;
- $Ar^1$ is selected from unsubstituted or substituted $C_2$ to $C_{60}$ heteroarylene, and wherein the substituted $C_2$ to $C_{60}$ heteroarylene comprises at least about one to about six substituents,
  - wherein the substituent of the substituted $C_2$ to $C_{60}$ heteroarylene are independently selected from, $C_1$ to $C_{12}$ alkyl, $C_1$ to $C_{12}$ alkoxy, CN, OH, halogen, $C_6$ to $C_{36}$ arylene, $C_2$ to $C_{25}$ heteroarylene;
- n is 1 or 2;
- $L^1$ is selected from a single bond, $C_1$ to $C_4$ alkyl, substituted or unsubstituted $C_6$ to $C_{36}$ arylene,
  - wherein the substituent of substituted $C_6$ to $C_{36}$ arylene is selected from $C_1$ to $C_{12}$ alkyl, $C_6$ to $C_{18}$ arylene, wherein $L^1$ comprises at least one to six aromatic-6-member rings;
- $L^2$ is selected from a single bond or $C_1$ to $C_6$ alkyl,
- $R^1$, $R^2$ are independently selected from substituted or unsubstituted $C_1$ to $C_{16}$ alkyl,
  - wherein the substituent of substituted $C_1$ to $C_{16}$ alkyl is selected from $C_6$ to $C_{18}$ arylene or $C_2$ to $C_{12}$ heteroarylene;
wherein $L^1$ is bonded via a single bond to a 5 or 6 member heteroaryl ring of $Ar^1$;
wherein the compound of formula 1 comprises:
  - least about 4 $C_6$-arylene rings and/or at least about 4 condensed $C_6$-arylene rings,
  - a molecular mass of at least about 400 g/mol to about 1800 g/mol; and
wherein the following compounds are excluded:

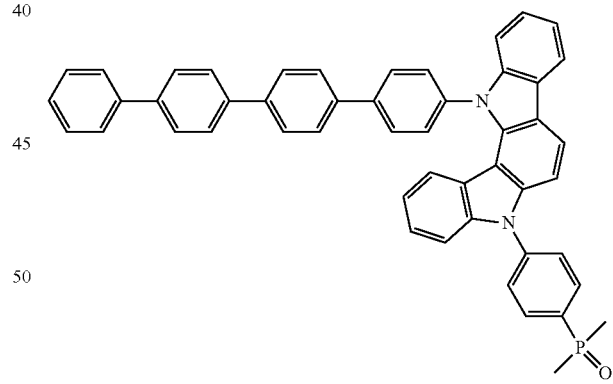

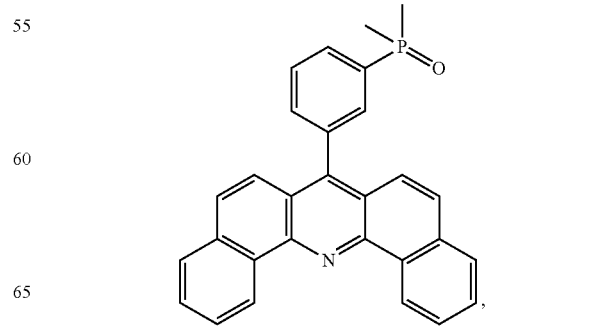

-continued

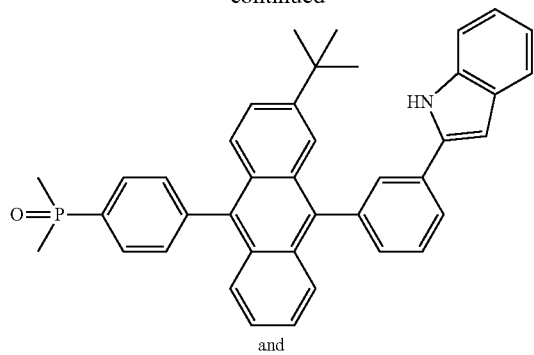
and

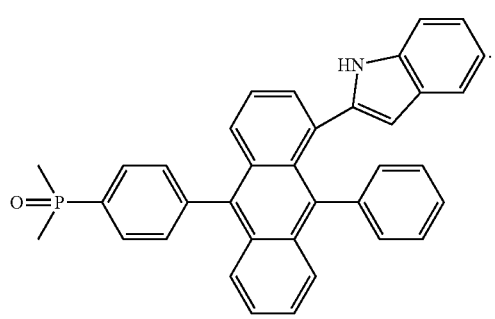

According to one embodiment of the organic electronic device comprising an organic semiconductor layer, wherein at least one organic semiconductor layer comprises a compound of formula 1:

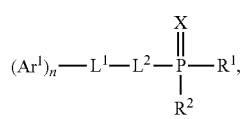  (1)

wherein
X is selected from O, S or Se;
Ar¹ is selected from unsubstituted or substituted $C_2$ to $C_{60}$ heteroarylene, and wherein the substituted $C_2$ to $C_{60}$ heteroarylene comprises at least about one to about six substituents,
  wherein the substituent of the substituted $C_2$ to $C_{60}$ heteroarylene are independently selected from, $C_1$ to $C_{12}$ alkyl, $C_1$ to $C_{12}$ alkoxy, CN, OH, halogen, $C_6$ to $C_{36}$ arylene, $C_2$ to $C_{25}$ heteroarylene;
n is 1 or 2;
L¹ is selected from substituted or unsubstituted $C_6$ to $C_{36}$ arylene,
  wherein the substituent of substituted $C_6$ to $C_{36}$ arylene is selected from $C_1$ to $C_{12}$ alkyl, $C_6$ to $C_{18}$ arylene;
L² is selected from a single bond or $C_1$ to $C_6$ alkyl,
R¹, R² are independently selected from substituted or unsubstituted $C_1$ to $C_{16}$ alkyl,
  wherein the substituent of substituted $C_1$ to $C_{16}$ alkyl is selected from $C_6$ to $C_{18}$ arylene or $C_2$ to $C_{12}$ heteroarylene;
wherein L¹ is bonded via a single bond to a 5 or 6 member heteroaryl ring of Ar¹
wherein the compound of formula 1 comprises:
  at least about 4 $C_6$-arylene rings and/or at least about 4 condensed $C_6$-arylene rings, a molecular mass of at least about 400 g/mol to about 1800 g/mol; and
wherein the following compounds are excluded:

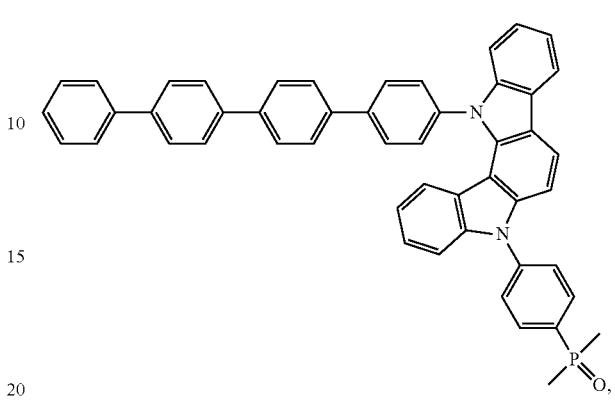

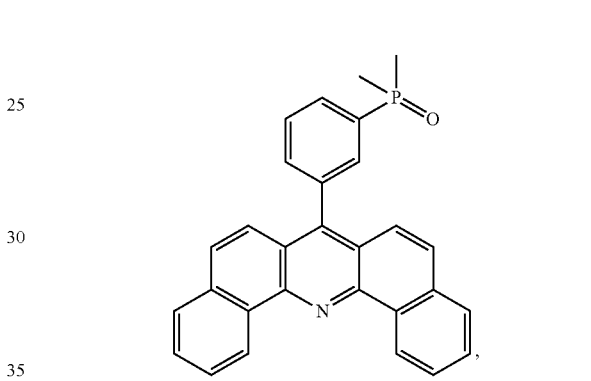

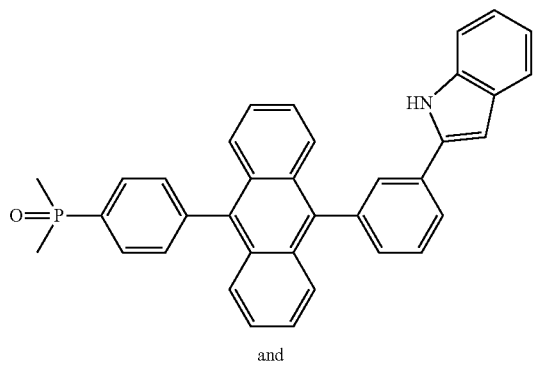
and

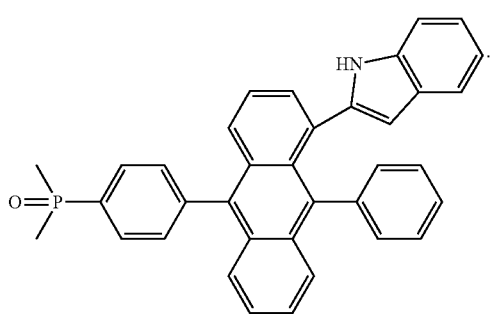

According to one embodiment of the organic electronic device comprising an organic semiconductor layer, wherein at least one organic semiconductor layer comprises a compound of formula 1:

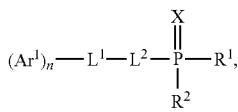
(1)

wherein
X is selected from O, S or Se;
Ar¹ is selected from unsubstituted or substituted $C_2$ to $C_{60}$ heteroarylene, and wherein the substituted $C_2$ to $C_{60}$ heteroarylene comprises at least about one to about six substituents,
wherein the substituent of the substituted $C_2$ to $C_{60}$ heteroarylene are independently selected from, $C_1$ to $C_{12}$ alkyl, $C_1$ to $C_{12}$ alkoxy, CN, OH, halogen, $C_6$ to $C_{36}$ arylene, $C_2$ to $C_{25}$ heteroarylene;
n is 1 or 2;
L¹ is selected from substituted or unsubstituted $C_{12}$ to $C_{36}$ arylene,
wherein the substituent of substituted $C_{12}$ to $C_{36}$ arylene is selected from $C_1$ to $C_{12}$ alkyl, $C_6$ to $C_{18}$ arylene;
L² is selected from a single bond or $C_1$ to $C_6$ alkyl,
R¹, R² are independently selected from substituted or unsubstituted $C_1$ to $C_{16}$ alkyl,
wherein the substituent of substituted $C_1$ to $C_{16}$ alkyl is selected from $C_6$ to $C_{18}$ arylene or $C_2$ to $C_{12}$ heteroarylene;
wherein L¹ is bonded via a single bond to a 5 or 6 member heteroaryl ring of Ar¹
wherein the compound of formula 1 comprises:
at least about 4 to about 12 $C_6$-arylene rings and/or at least about 4 to about 12 condensed $C_6$-arylene rings,
a molecular mass of at least about 400 g/mol to about 1800 g/mol; and
wherein the following compounds are excluded:

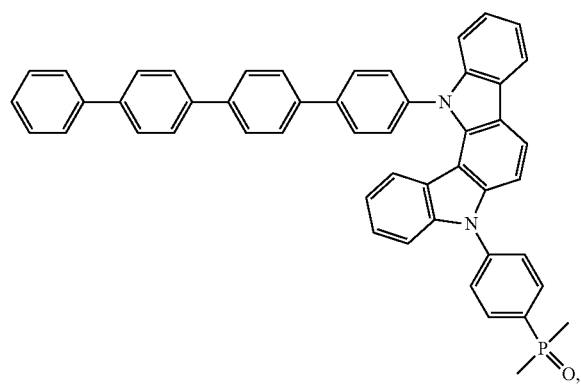

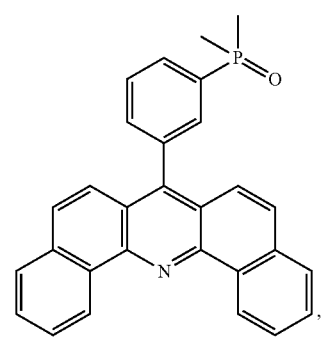

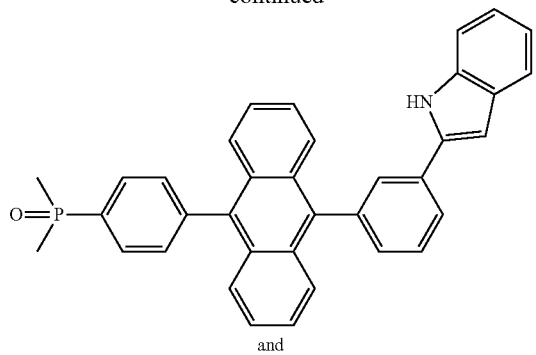

and

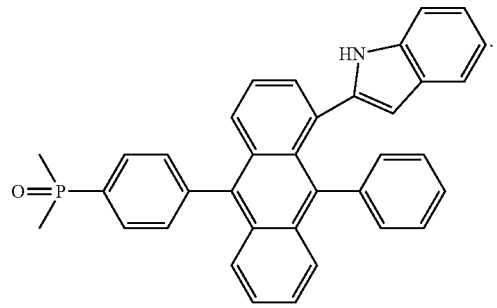

According to one embodiment the organic electronic device comprises an organic semiconductor layer, wherein at least one organic semiconductor layer comprises a compound of formula 1:

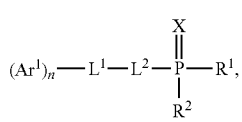
(1)

wherein
X is selected from O, S or Se;
Ar¹ is selected from unsubstituted or substituted $C_2$ to $C_{60}$ heteroarylene, and wherein the substituted $C_2$ to $C_{60}$ heteroarylene comprises at least about one to about six substituents,
wherein the substituent of the substituted $C_2$ to $C_{60}$ heteroarylene are independently selected from, $C_1$ to $C_{12}$ alkyl, $C_1$ to $C_{12}$ alkoxy, CN, OH, halogen, $C_6$ to $C_{36}$ arylene, $C_2$ to $C_{25}$ heteroarylene;
n is 1 or 2;
L¹ is selected from $C_1$ to $C_4$ alkyl, substituted or unsubstituted $C_6$ to $C_{36}$ arylene,
wherein the substituent of substituted $C_6$ to $C_{36}$ arylene is selected from $C_1$ to $C_{12}$ alkyl, $C_6$ to $C_{18}$ arylene, wherein L¹ comprises at least one to six aromatic-6-member rings;
L² is selected from a single bond or $C_1$ to $C_6$ alkyl,
R¹, R² are independently selected from substituted or unsubstituted $C_1$ to $C_{16}$ alkyl,
wherein the substituent of substituted $C_1$ to $C_{16}$ alkyl is selected from $C_6$ to $C_{18}$ arylene or $C_2$ to $C_{12}$ heteroarylene;

wherein $L^1$ is bonded via a single bond to a 5 or 6 member heteroaryl ring of $Ar^1$;
wherein the compound of formula 1 comprises:
at least about 4 to about 12 $C_6$-arylene rings and/or at least about 4 to about 12 condensed $C_6$-arylene rings,
a molecular mass of at least about 400 g/mol to about 1800 g/mol, and
$Ar^1$ comprises at least two hetero-atoms, preferably at least two N atoms.

According to another embodiment, wherein in formula 1:
X is selected from O or S, preferably O;
$Ar^1$ is selected from unsubstituted or substituted $C_3$ to $C_{51}$ heteroarylene,
wherein the substituted $C_3$ to $C_{51}$ heteroarylene comprises at least one to three substituents,
wherein the substituent of the substituted $C_3$ to $C_{51}$ heteroarylene are independently selected from $C_1$ to $C_{12}$ alkyl, CN, $C_6$ to $C_{36}$ arylene or $C_2$ to $C_{25}$ heteroarylene;
n is 1 or 2;
$L^1$ is selected from unsubstituted $C_6$ to $C_{36}$ arylene,
wherein $L^1$ comprises at least one to six aromatic-6-member rings;
$L^2$ is selected from a single bond or $C_1$ to $C_6$ alkyl;
$R^1$, $R^2$ are independently selected from unsubstituted $C_1$ to $C_4$ alkyl.

According to another embodiment, wherein in formula 1:
X is selected from O;
$Ar^1$ is selected from unsubstituted or substituted $C_3$ to $C_{51}$ heteroarylene, and
wherein the substituted $C_3$ to $C_{51}$ heteroarylene comprises at least one to three substituents,
wherein the substituent of the substituted $C_3$ to $C_{51}$ heteroarylene are independently selected from $C_1$ to $C_{12}$ alkyl, CN, $C_6$ to $C_{36}$ arylene or $C_2$ to $C_{25}$ heteroarylene;
n is 1 or 2;
$L^1$ is selected from unsubstituted $C_6$ to $C_{36}$ arylene,
wherein $L^1$ comprises at least one to six aromatic-6-member rings;
$L^2$ is a single bond;
$R^1$, $R^2$ are $C_1$ alkyl.

According to another embodiment, wherein in formula 1:
X is selected from O;
$Ar^1$ is selected from unsubstituted or substituted $C_3$ to $C_{51}$ heteroarylene, and
wherein the substituted $C_3$ to $C_{51}$ heteroarylene comprises at least one to three substituents,
wherein the substituent of the substituted $C_3$ to $C_{51}$ heteroarylene are independently selected from $C_1$ to $C_{12}$ alkyl, CN, $C_6$ to $C_{36}$ arylene or $C_2$ to $C_{25}$ heteroarylene;
n is 1;
$L^1$ is selected from unsubstituted $C_6$ to $C_{36}$ arylene,
wherein $L^1$ comprises at least one to six aromatic-6-member rings;
$L^2$ is a single bond;
$R^1$, $R^2$ are $C_1$ alkyl.

According to another embodiment of formula 1, wherein $Ar^1$ of formula 1 comprises at least about 1 to about 3 heteroarylene groups.

According to another embodiment of formula 1, wherein $L^1$ of formula 1 comprises at least about 1 to about 10 arylene groups, preferably about 2 to about 8 arylene groups, further preferred 3 to 6 arylene groups.

According to another embodiment of formula 1, wherein $L^1$ of formula 1 is a single bond.

According to another embodiment, $L^1$ is selected from arylene groups, preferably phenylene, biphenylene, fluorene, naphthalene.

According to another embodiment, $Ar^1$ is selected from heteroarylene groups, preferably heteroarylene groups comprising at least one nitrogen or oxygen atom, preferably pyridine, quinoline, quinozaline, pyridine, triazine, benzimidazole, benzothiazole, benzo[4,5]thieno[3,2-d]pyrimidine, carbazole, xanthene, phenoxazine, benzoacridine, dibenzoacridine, triazole, preferably selected from triazine and pyrimidine.

According to another embodiment of formula 1, wherein $Ar^1$ comprises at least one N-heteroaryl group selected from the group comprising or consisting of a triazine, quinazoline, quinoline, benzimidazole, benzothiazole, benzo[4,5]thieno [3,2-d]pyrimidine, pyrimidine and pyridine, most preferred $Ar^1$ comprises a triazine group.

According to another embodiment of formula 1: $R^1$, $R^2$ may be independently selected from substituted or unsubstituted $C_1$ to $C_{14}$ alkyl, wherein the substituent of substituted or unsubstituted $C_1$ to $C_{14}$ alkyl is selected from $C_6$ to $C_{14}$ arylene or $C_2$ to $C_{10}$ heteroarylene.

According to another embodiment of formula 1: $R^1$, $R^2$ may be independently selected from substituted or unsubstituted $C_2$ to $C_{10}$ alkyl, wherein the substituent of substituted or unsubstituted $C_2$ to $C_{10}$ alkyl is selected from $C_6$ to $C_{12}$ arylene or $C_6$ to $C_{12}$ heteroarylene.

According to another embodiment of formula 1: $R^1$, $R^2$ are independently selected from $C_1$ to $C_{16}$ alkyl, preferably $C_1$ to $C_6$ alkyl, further preferred $C_1$ to $C_2$ alkyl, more preferred $R^1$ and $R^2$ are selected the same and further more preferred $R^1$ and $R^2$ are $C_1$ alkyl.

According to another embodiment of formula 1: $Ar^1$ are independently selected from substituted or unsubstituted $C_2$ to $C_{30}$ heteroarylene, wherein the substituent of the substituted heteroarylene is selected from $C_1$ to $C_{10}$ alkyl, $C_1$ to $C_{10}$ alkoxy, CN, halogen, OH, $C_6$ to $C_{20}$ arylene and $C_2$ to $C_{17}$ heteroarylene.

According to another embodiment of formula 1: $Ar^1$ are independently selected from substituted or unsubstituted $C_6$ to $C_{20}$ heteroarylene, wherein the substituent of the substituted $C_6$ to $C_{20}$ heteroarylene is selected from $C_2$ to $C_8$ alkyl, $C_2$ to $C_8$ alkoxy, CN, halogen, OH, $C_6$ to $C_{20}$ arylene and $C_6$ to $C_{17}$ heteroarylene.

According to another embodiment of formula 1: Ar1 comprises:
at least about 1 to about 5 heteroarylenes selected from 5 or 6 member rings, preferably about 1 to about 3 heteroarylenes selected from 5 or 6 member rings, further preferred one 6 member heteroarylene ring; and/or
at least about 1 to 12 arylenes selected from 5 or 6 member rings, preferably at least about 2 to 10 arylenes selected from 5 or 6 member rings, preferably at least about 2 to 8 arylenes selected from 6 member rings and in addition preferred about 3 to about 6 arylenes selected from 6 member rings; and/or
at least 1 to 6 condensed 5 or 6 member rings of arylenes and/or heteroarylenes, preferably about 2 to about 4 condensed 5 or 6 member rings of arylenes and/or heteroarylenes, further preferred further 2 to about 4 condensed 5 or 6 member arylenes and one 5 or 6 member heteroarylene.

According to another embodiment of formula 1: X is preferably O.

According to another embodiment of formula 1: the compound of formula 1 comprises at least about 4 to about 12 $C_6$-arylene groups.

According to another embodiment of formula 1: $L^1$ bonds via a single bond directly on a heteroarylene group of $Ar^1$, wherein the heteroarylene group comprises preferably about 1 to about 3 N-atoms, further preferred 2 to 3 N-atoms and in addition preferred about 3 N-atoms.

According to an embodiment of formula 1, wherein $Ar^1$ has the chemical structure B1, B2, B3, B4, B5, B6, B7, B8, B9, B10, B11 or B12:

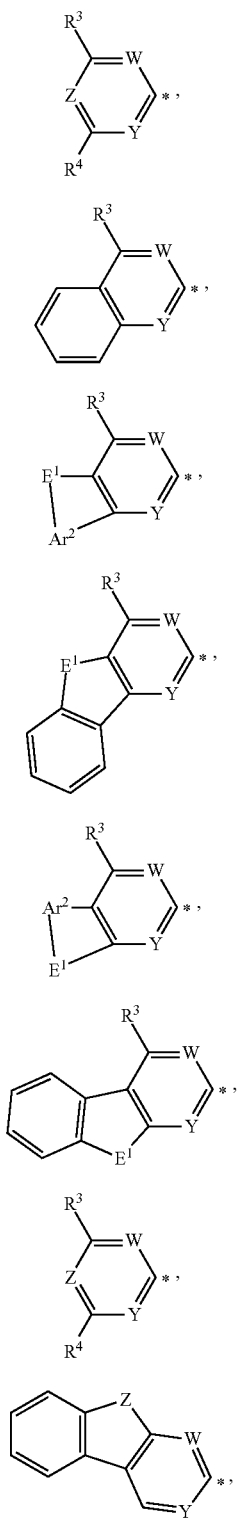

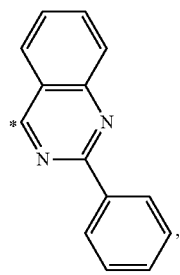

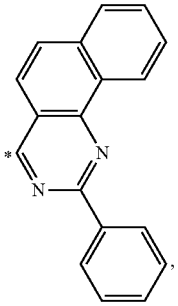

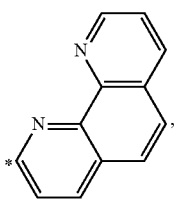

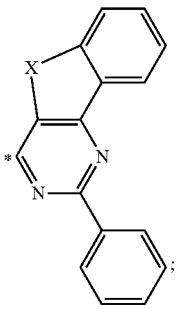

wherein
$Ar^1$ is bonded at "*" to $L^1$ via a single bond; and
wherein
W, Y, Z are independently selected from N, S, O, CH or $CR^3$, wherein
at least one W, Y and/or Z is selected from N, S or O, preferably at least W and Y are N;
$E^1$ is selected from $N-Ar^2$, O or S;
$R^3$ and $R^4$ are independently selected from H, $C_1$ to $C_{16}$ alkyl, or $Ar^2$;
$Ar^2$ is independently selected from substituted or unsubstituted $C_6$ to $C_{36}$ arylene, $C_2$ to $C_{25}$ heteroarylene, wherein in structure B3 and structure B5 at least two ring atoms of the arylene or heteroarylene of $Ar^2$ forms with $E^1$ at least a five member ring, and wherein the substituent of the substituted $C_6$ to $C_{36}$ arylene and substituted $C_2$ to $C_{25}$ heteroarylene are selected from $C_1$ to $C_{12}$ alkyl and $C_1$ to $C_{12}$ alkoxy.

According to an embodiment of formula 1, wherein $Ar^1$ comprise at least about one group, preferably about one to about 4 groups, selected from phenyl, biphenyl, terpyhenyl, quarterphenyl, naphthyl, phenanthryl, dibenzofuranyl, dibenzothiophenyl, or a group selected from chemical structures D1 to D7:

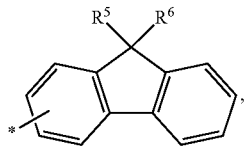
(D1)

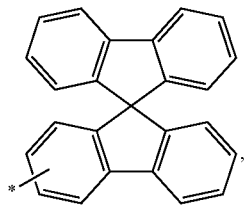
(D2)

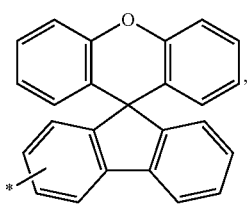
(D3)

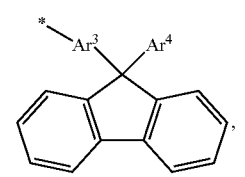
(D4)

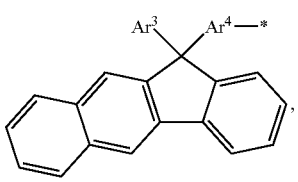
(D5)

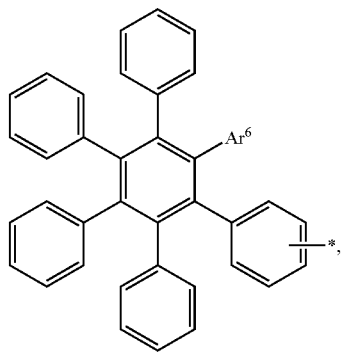
(D6)

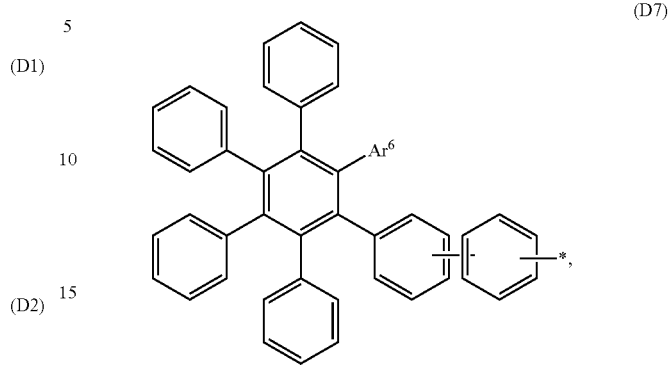
(D7)

wherein
Ar$^1$ is bonded at "*" to L$^1$, so that between Ar$^1$ and L$^1$ a single bond is formed; and wherein
R$^5$ and R$^6$ are independently selected from C$_1$ to C$_{16}$ alkyl, or Ar$^2$; and Ar$^4$ and Ar$^5$ are independently selected from C$_1$ to C$_{16}$ alkyl or substituted or unsubstituted C$_6$ to C$_{36}$ arylene, C$_2$ to C$_{25}$ heteroarylene, wherein
the substituent of the substituted C$_6$ to C$_{36}$ arylene, C$_2$ to C$_{25}$ heteroarylene is selected from C$_1$ to C$_{12}$ alkyl, C$_1$ to C$_{12}$ alkoxy; and Ar$^6$ is selected from H or phenyl.

Preferably, the D1 to D7 are bonded to substituted or unsubstituted C$_2$ to C$_{60}$ heteroarylene via a direct bond or via a direct bond to a phenylene or biphenylene group.

According to another embodiment of formula 1, wherein Ar$^1$ is selected from the chemical structures F1 to F31, and is connected with L$^1$ at "*" via a single bond:

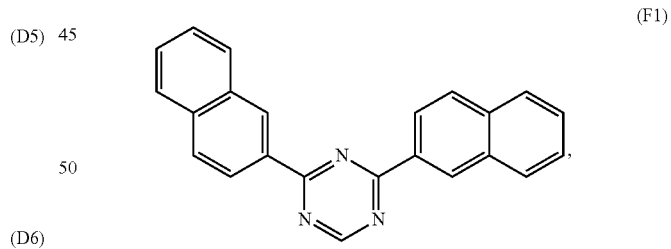
(F1)

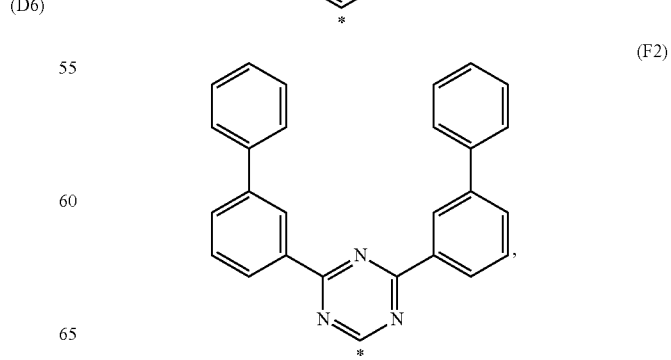
(F2)

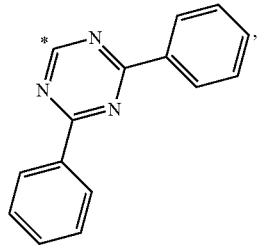
(F3)
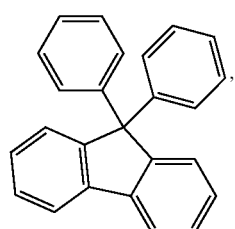
(F4)
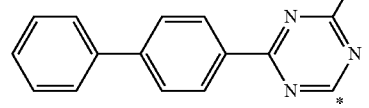
(F5)
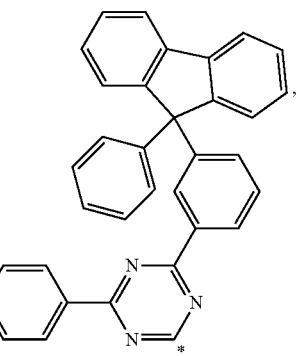
(F6)
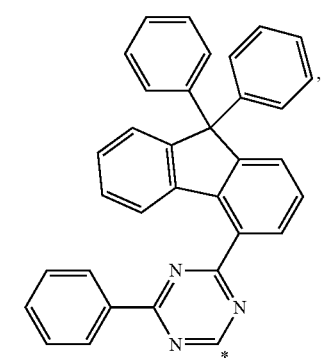
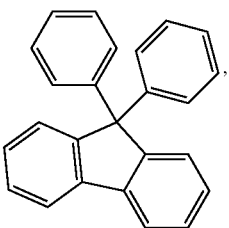
(F7)
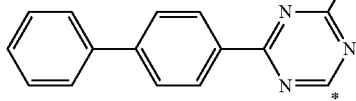
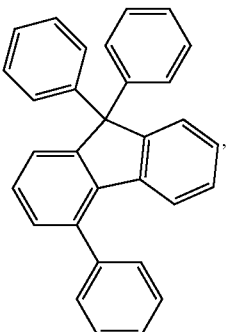
(F8)
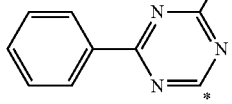
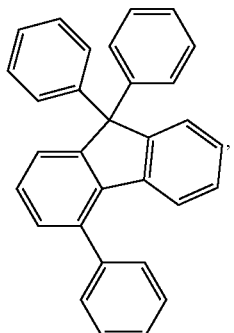
(F9)
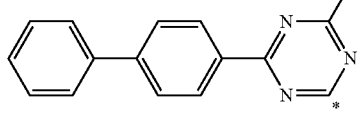
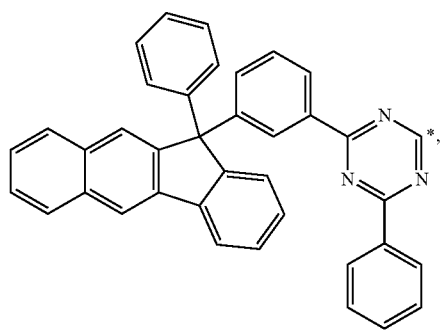
(F10)

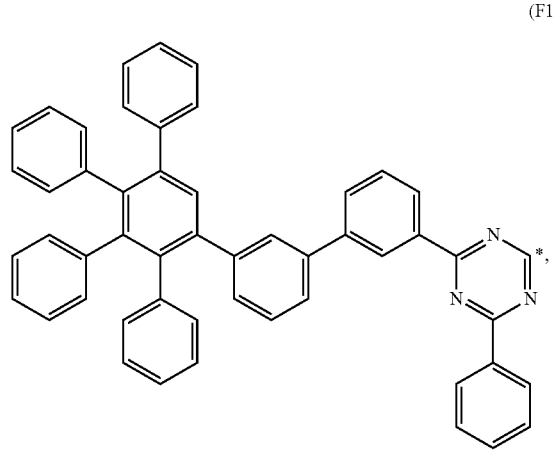
(F11)
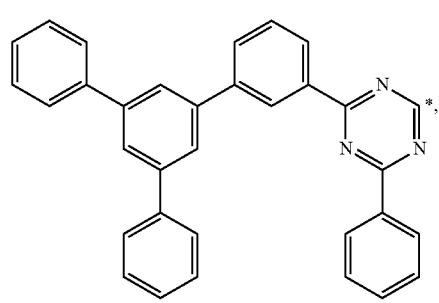
(F12)
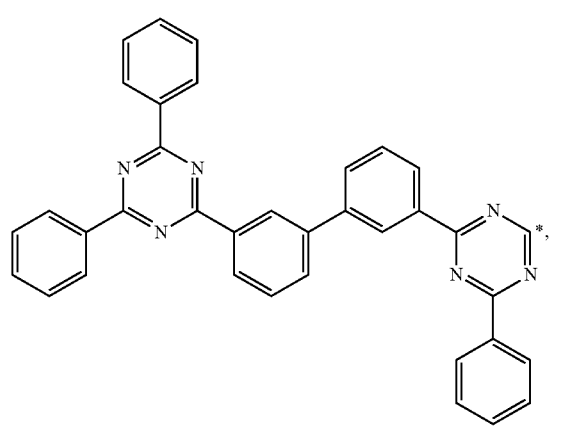
(F13)
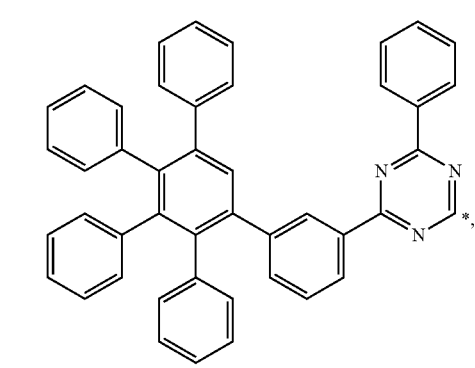
(F14)
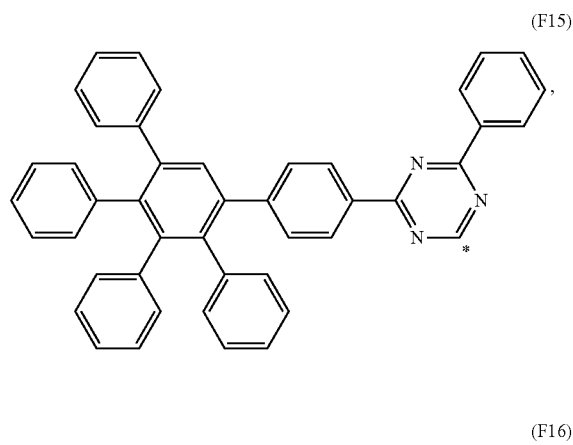
(F15)
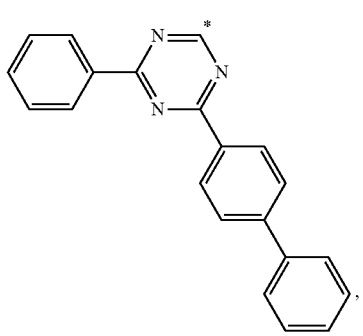
(F16)
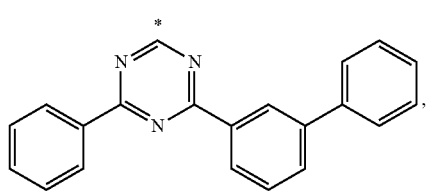
(F17)
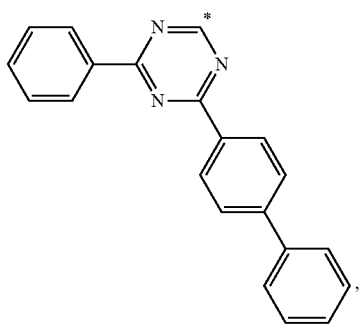
(F18)
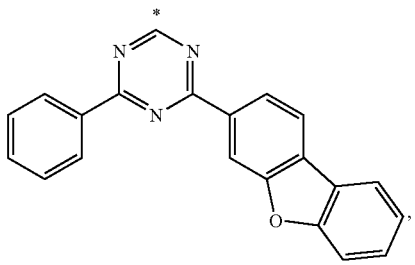
(F19)

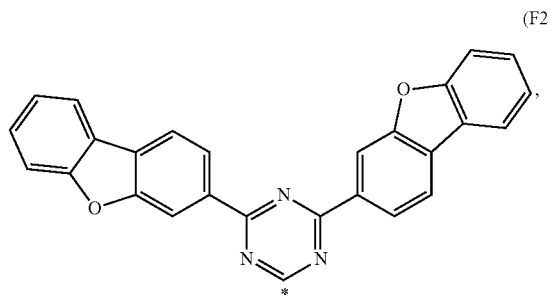
(F20)
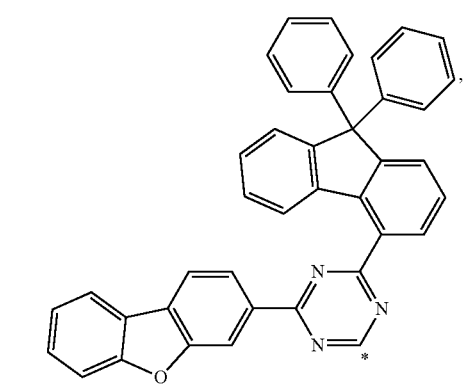
(F21)
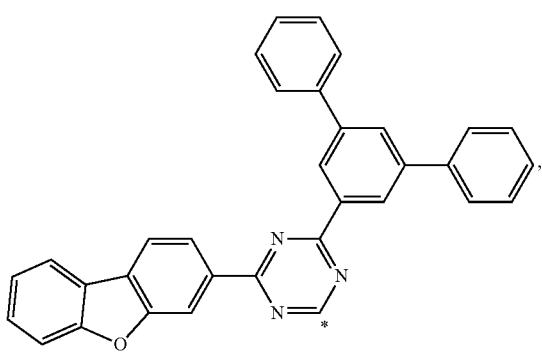
(F22)
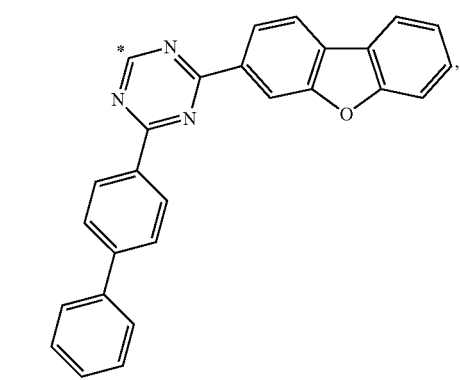
(F23)
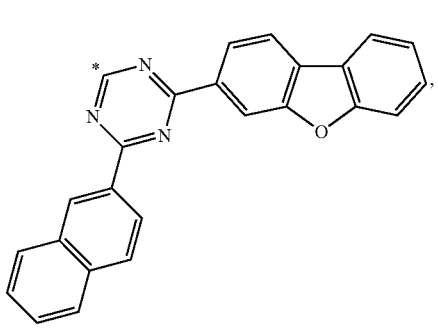
(F24)
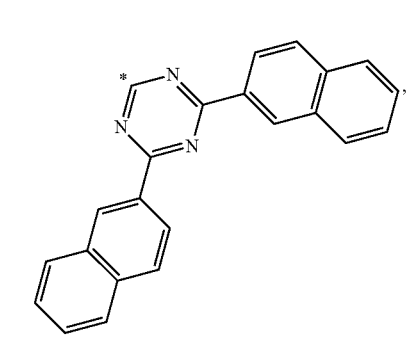
(F25)
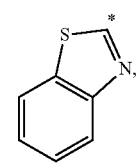
(F26)
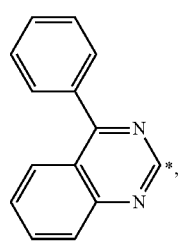
(F27)
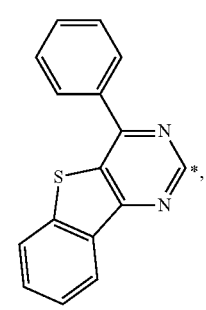
(F28)
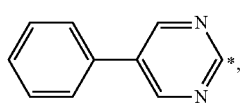
(F29)

(F30)
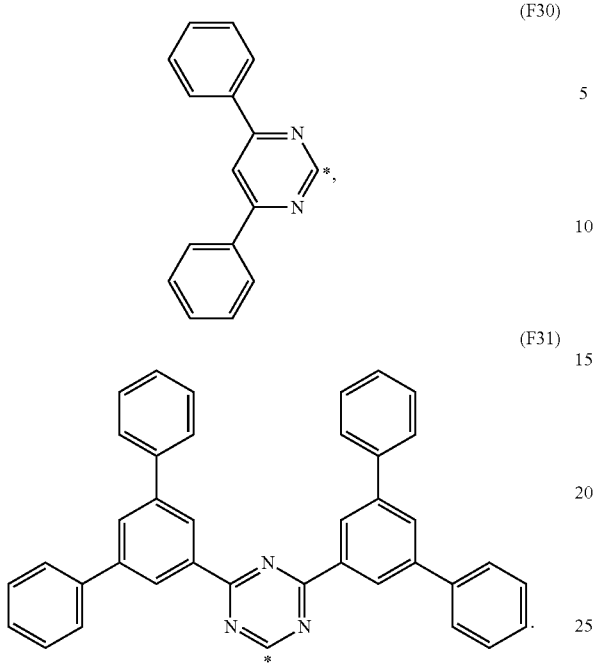
(F31)
According to another embodiment of formula 1, wherein for n=2 the compound has the chemical formula 2:
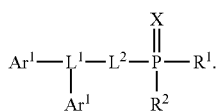
(2)
According to another embodiment of chemical formula 1:
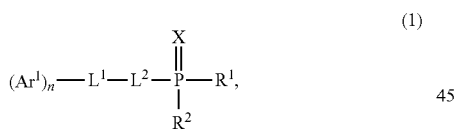
(1)
wherein
L$^1$ is selected from the group of structures G1 to G13, wherein
L$^1$ is connected via a single bond to L$^2$ at "*$^1$", and L$^1$ is connected via a single bond to Ar$^1$ at "*$^2$":
a) for n=1
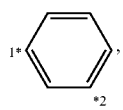
(G1)
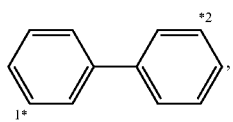
(G2)
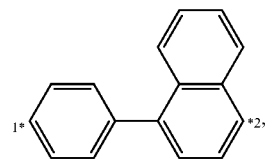
(G3)
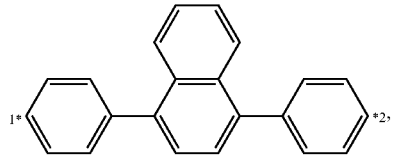
(G4)
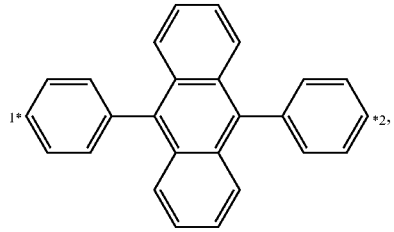
(G5)
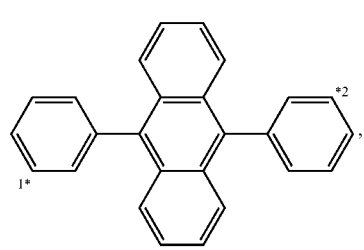
(G6)
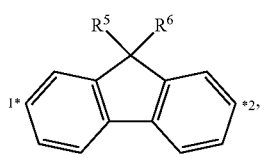
(G7)
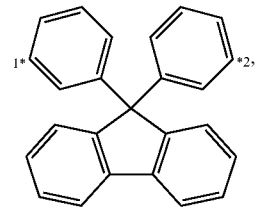
(G8)
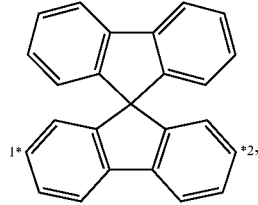
(G9)
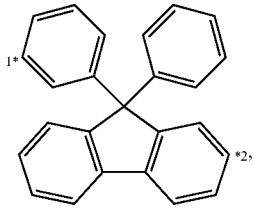
(G10)

-continued (G11)
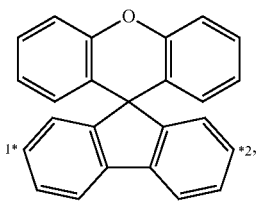

(G12)
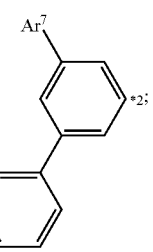

b) for n=2

(G13)
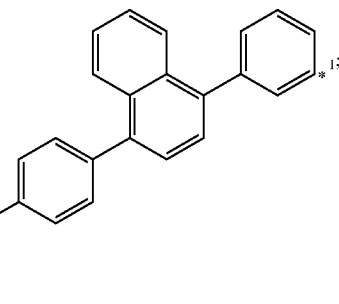

wherein $Ar^7$ is selected from $C_{10}$ to $C_{16}$ aryl.

Preferably $Ar^7$ is selected from naphthyl, phenanthryl, or pyrenyl.

According to another embodiment, wherein for the compound according to chemical formula 1:

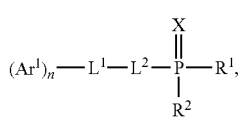 (1)

X is O;
$R^1$, $R^2$ are $C_1$ to $C_4$ alkyl, preferably methyl;
$L^1$ is selected from a group of G1 to G13;
$L^2$ is a single bond;
$Ar^1$ is from a group of F1 to F31; and
n is 1 or 2.

According to another embodiment, wherein for the compound according to chemical formula 1:

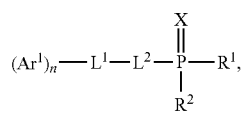 (1)

X is O;
$R^1$, $R^2$ are $C_1$ to $C_4$ alkyl, preferably methyl;
$L^1$ is selected from a group of G1 to G12;
$L^2$ is a single bond;
$Ar^1$ is F19, F23 or F24; and
n is 1.

According to another embodiment, wherein for the compound according to chemical formula 1:

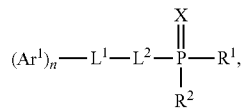 (1)

X is O;
$R^1$, $R^2$ are $C_1$ to $C_4$ alkyl, preferably methyl;
$L^1$ is selected from G2;
$L^2$ is a single bond;
$Ar^1$ is from a group of F1 to F31, preferably from F4 to F9; and
n is 1.

According to another embodiment, wherein for the compound according to chemical formula 1:

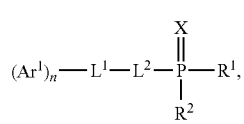 (1)

X is O;
$R^1$, $R^2$ are $C_1$ to $C_4$ alkyl, preferably methyl;
$L^1$ is selected from G5 or G6, preferably G6;
$L^2$ is a single bond;
$Ar^1$ is from a group of F1 to F31, preferably from F1 to F3; and
n is 1.

According to another embodiment, the reduction potential of the compound of formula 1 may be selected more negative than −1.9 V and less negative than −2.6 V against Fc/Fc⁺ in tetrahydrofuran, preferably more negative than −2 V and less negative than −2.5 V.

The reduction potential may be determined by cyclic voltammetry with potentiostatic device Metrohm PGSTAT30 and software Metrohm Autolab GPES at room temperature. The redox potentials are measured in an argon de-aerated, anhydrous 0.1M THF solution of the compound of formula 1, under argon atmosphere, with 0.1M tetrabutylammonium hexafluorophosphate as supporting electrolyte, between platinum working electrodes and with an Ag/AgCl pseudo-standard electrode (Metrohm Silver rod electrode), consisting of a silver wire covered by silver chloride and immersed directly in the measured solution, with the scan rate 100 mV/s. The first run is done in the broadest range of the potential set on the working electrodes, and the range is then adjusted within subsequent runs appropriately. The final three runs are done with the addition of ferrocene (in 0.1M concentration) as the standard. The average of potentials corresponding to cathodic and anodic peak of the compound is determined through subtraction of the average of cathodic and anodic potentials observed for the standard $Fc^+/Fc$ redox couple.

Particularly good electron injection and/or electron transport into the emission layer and/or stability may be achieved if the reduction potential is selected in this range.

According to another embodiment the compound of formula 1 has a glass transition temperature Tg of about ≥120° C. and about ≤380° C., preferably about ≥130° C. and about ≤350° C., further preferred about ≥150° C. and about ≤320° C.

The glass transition temperature is measured under nitrogen and using a heating rate of 10 K per min in a Mettler Toledo DSC 822e differential scanning calorimeter as described in DIN EN ISO 11357, published in March 2010.

According to another embodiment the compound of formula 1 has a rate onset temperature $T_{RO}$ of about ≥180° C. and ≤400° C., preferably about ≥200° C. and about ≤380° C.

Weight loss curves in TGA (thermogravimetric analysis) are measured by means of a Mettler Toledo TGA-DSC 1 system, heating of samples from room temperature to 600° C. with heating rate 10 K/min under a stream of pure nitrogen. 9 to 11 mg sample are placed in a 100 μL Mettler Toledo aluminum pan without lid. The temperature is determined at which 0.5 wt.-% weight loss occurs.

Room temperature, also named ambient temperature, is 23° C.

The rate onset temperature for transfer into the gas phase is determined by loading 100 mg compound into a VTE source. As VTE source a point source for organic materials is used as supplied by Kurt J. Lesker Company (www.lesker.com) or CreaPhys GmbH (http://www.creaphys.com). The VTE (vacuum thermal evaporation) source temperature is determined through a thermocouple in direct contact with the compound in the VTE source. The VTE source is heated at a constant rate of 15 K/min at a pressure of $10^{-7}$ to $10^{-8}$ mbar in the vacuum chamber and the temperature inside the source measured with a thermocouple. Evaporation of the compound is detected with a QCM detector which detects deposition of the compound on the quartz crystal of the detector. The deposition rate on the quartz crystal is measured in Ångstrom per second. To determine the rate onset temperature, the deposition rate on a logarithmic scale is plotted against the VTE source temperature. The rate onset is the temperature at which noticeable deposition on the QCM detector occurs (defined as a rate of 0.02 Å/s. The VTE source is heated and cooled three time and only results from the second and third run are used to determine the rate onset temperature.

The rate onset temperature is an indirect measure of the volatility of a compound. The higher the rate onset temperature the lower is the volatility of a compound.

According to another embodiment, wherein the compound of formula 1 is selected from the group of H1 to H60:

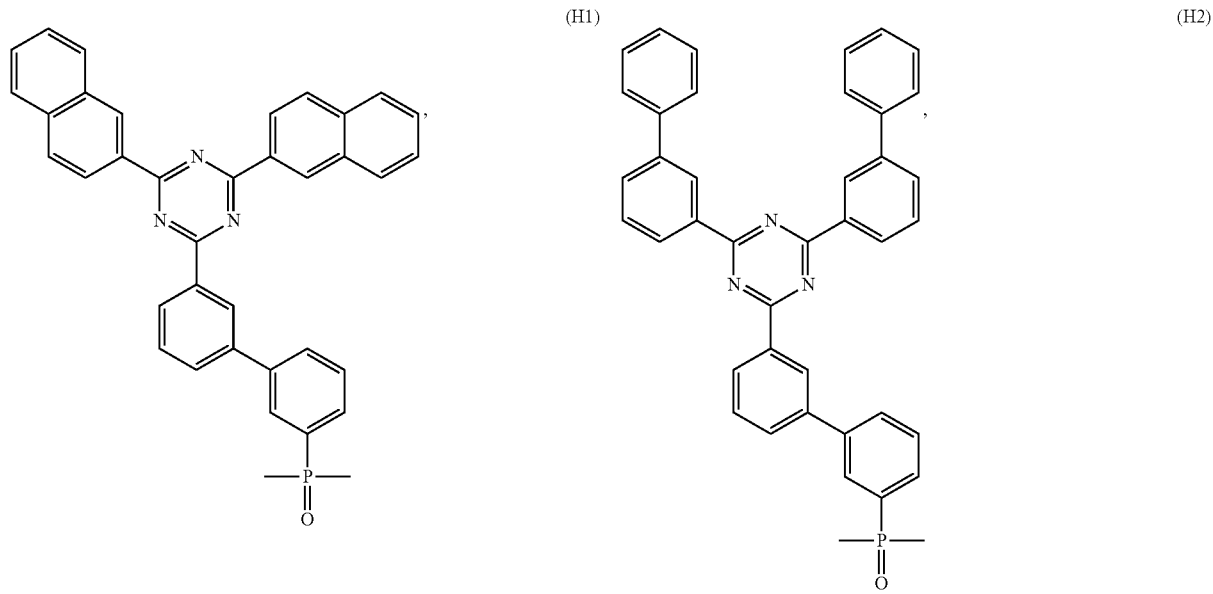

-continued
(H3)
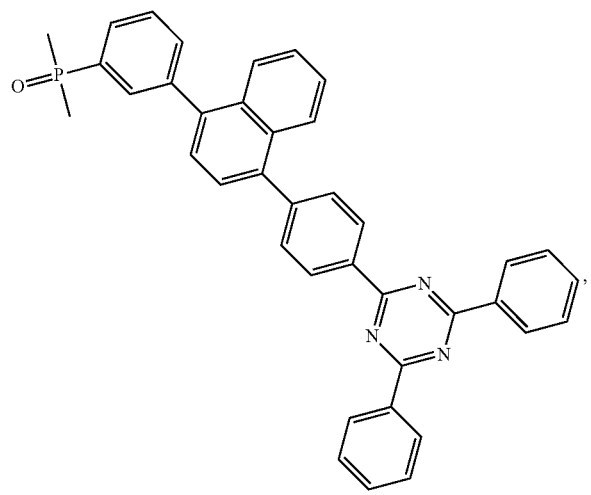
(H4)
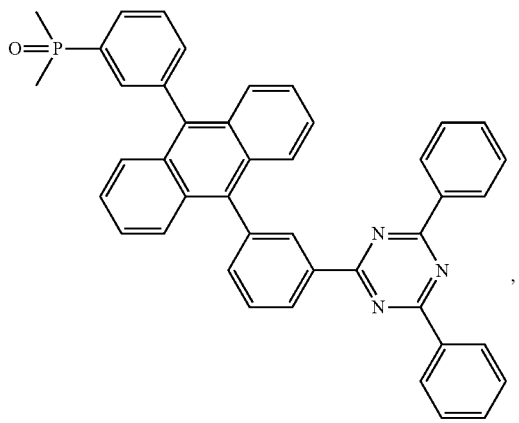
(H5)
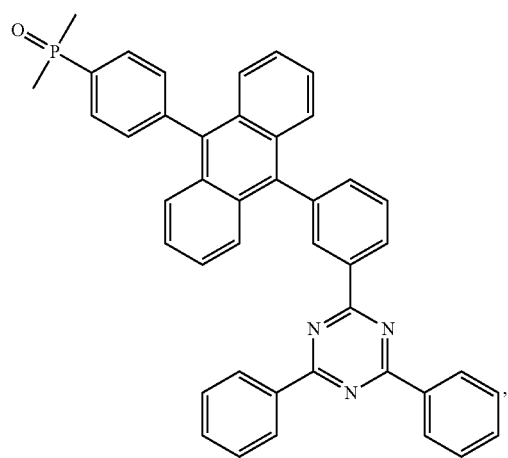
(H6)
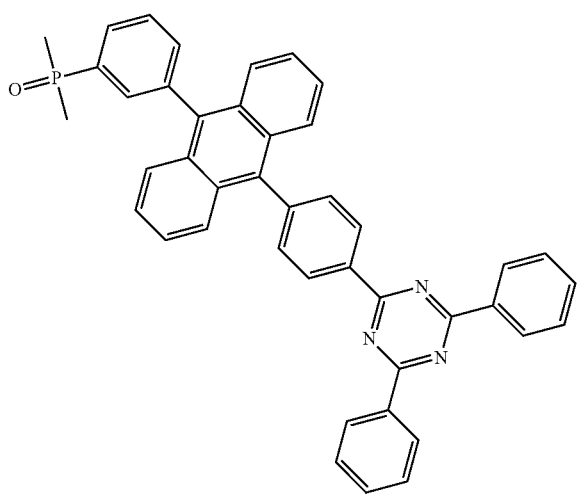
(H7)
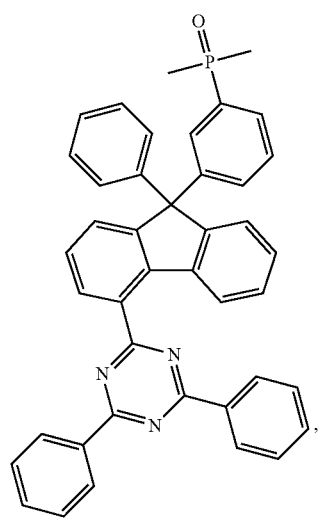
(H8)
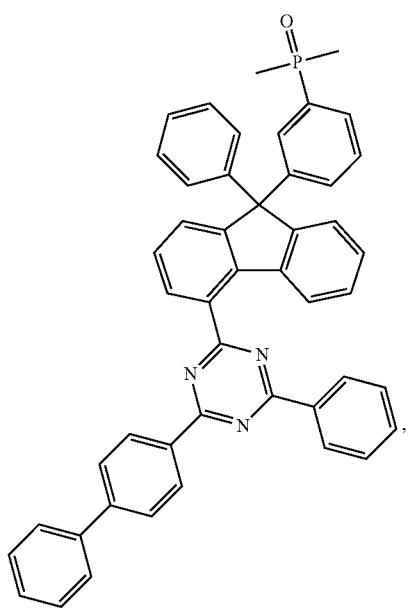

-continued
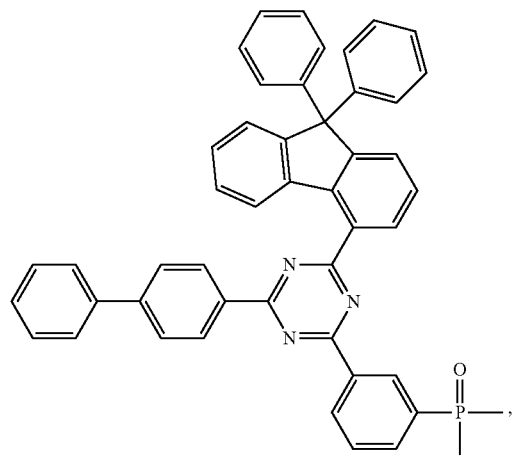
(H9)
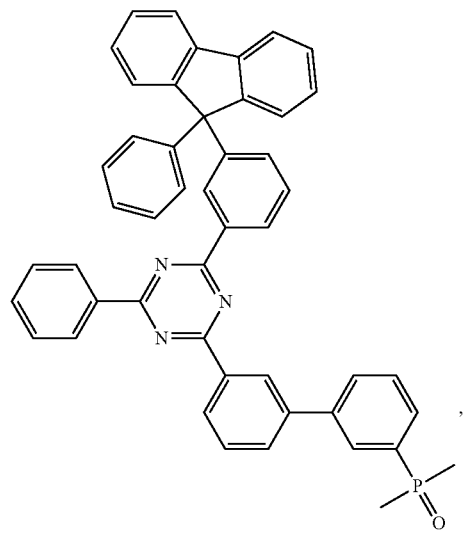
(H10)
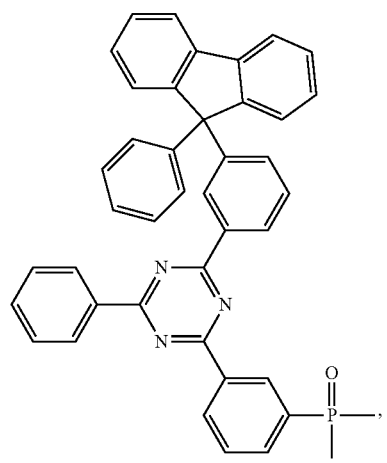
(H11)
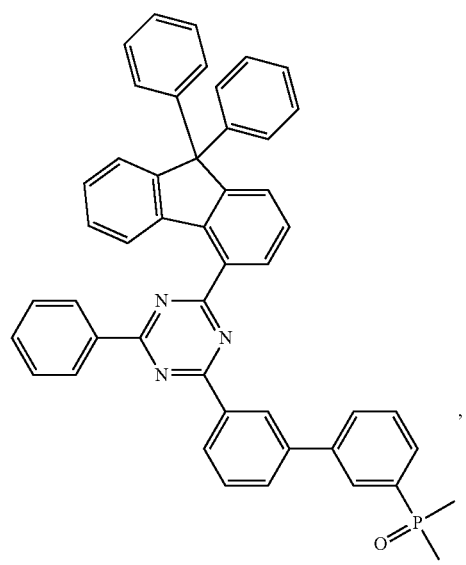
(H12)

(H13)
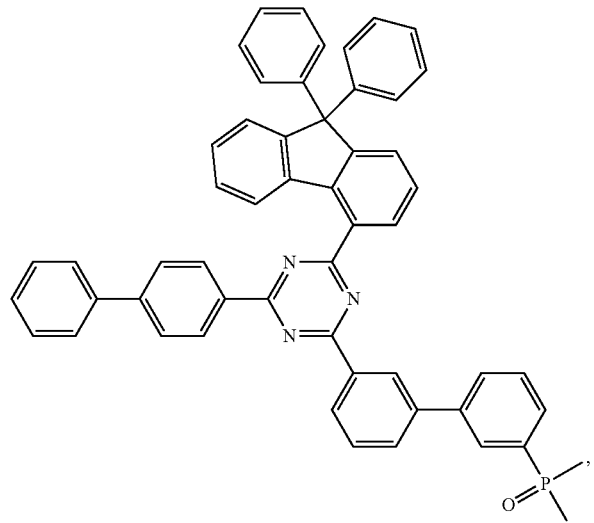
(H14)
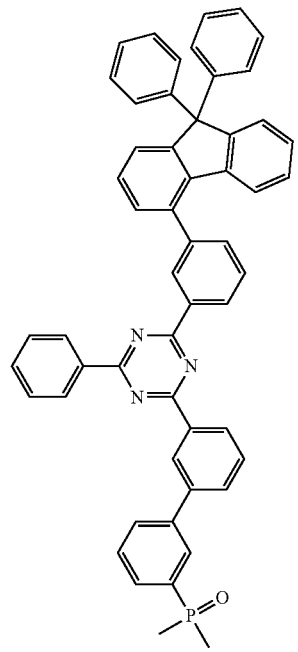
(H15)
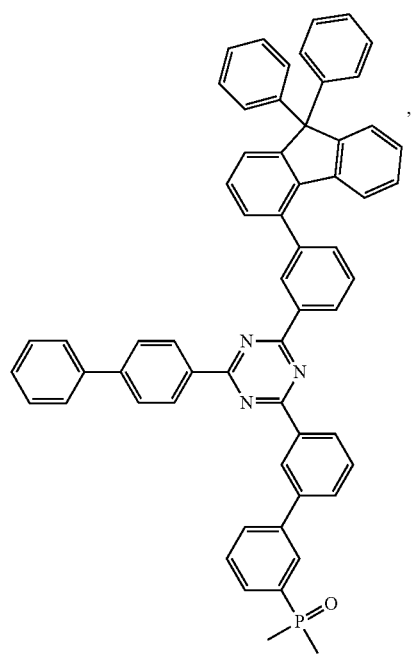
(H16)
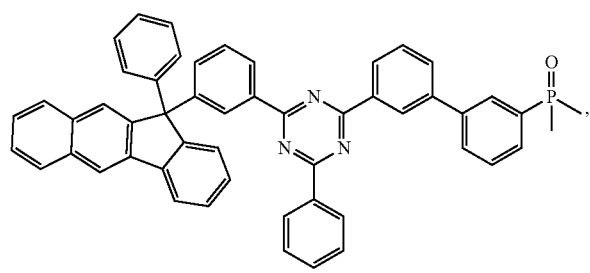

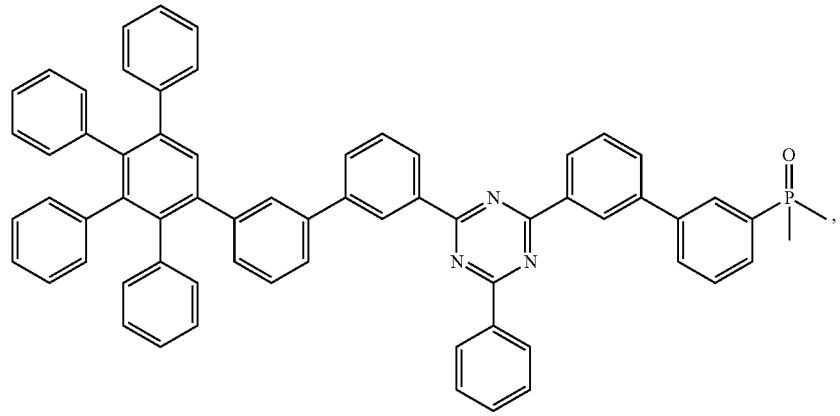
(H17)
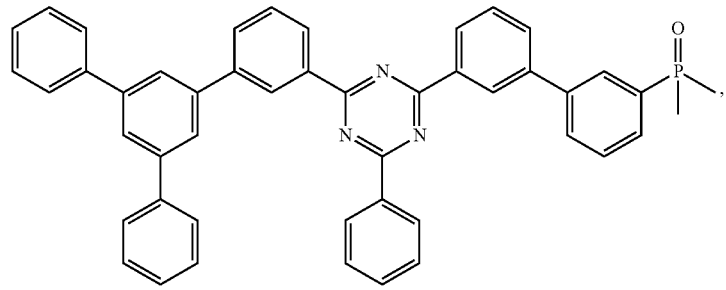
(H18)
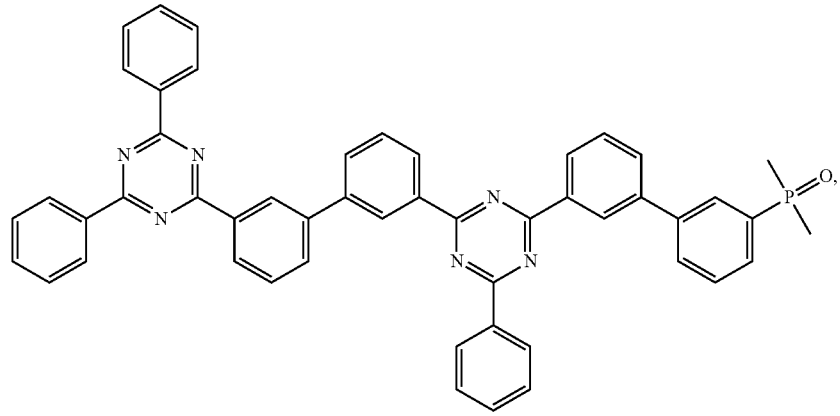
(H19)
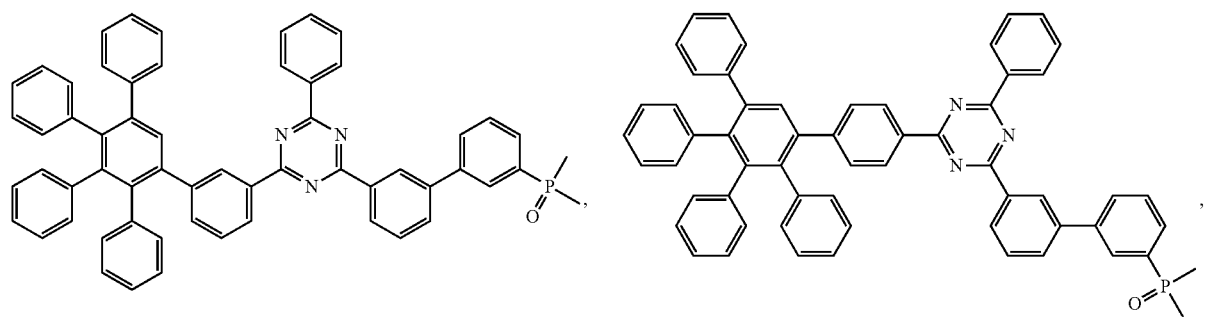
(H20) (H21)

-continued
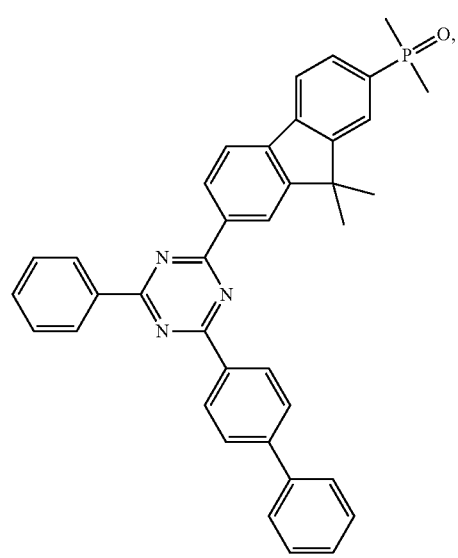
(H22)
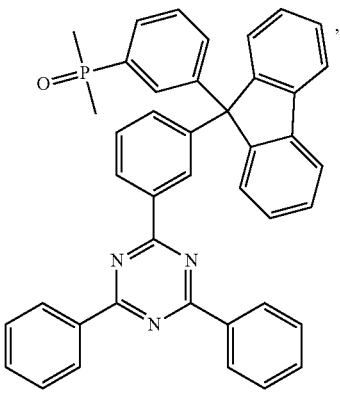
(H23)
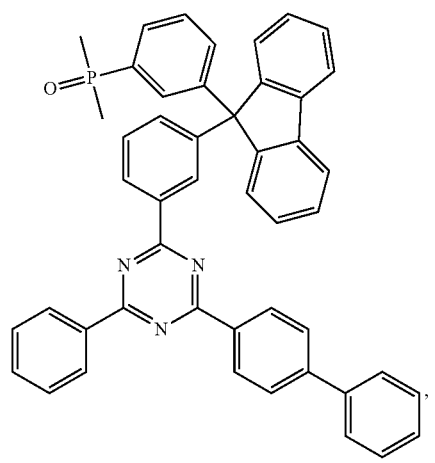
(H24)
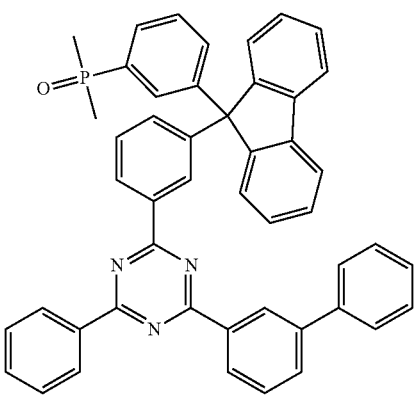
(H25)
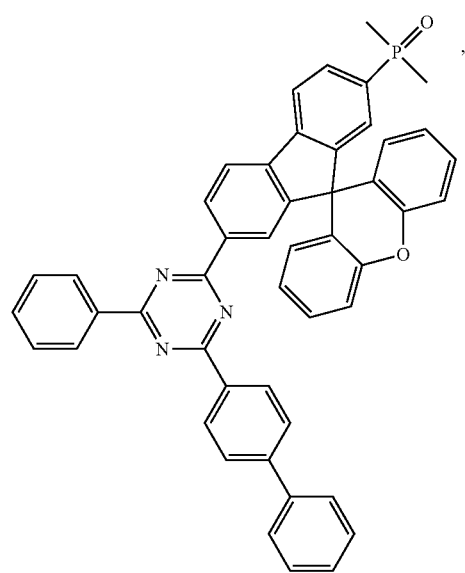
(H26)
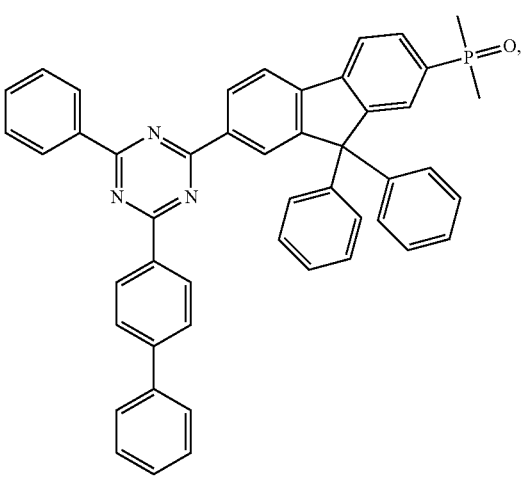
(H27)

-continued
(H28)
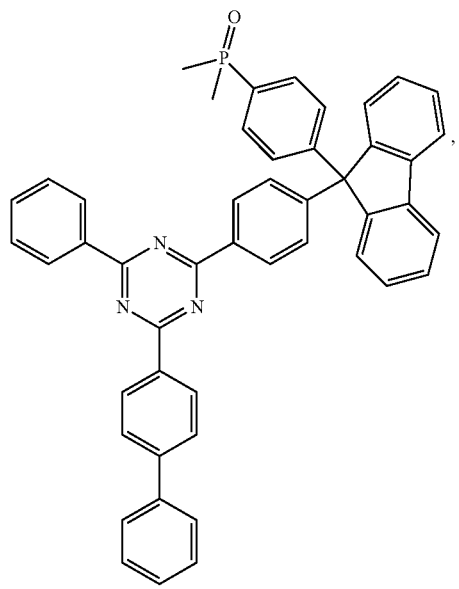
(H29)
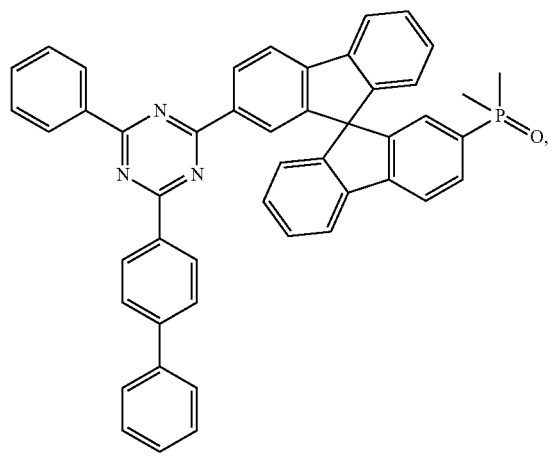
(H30)
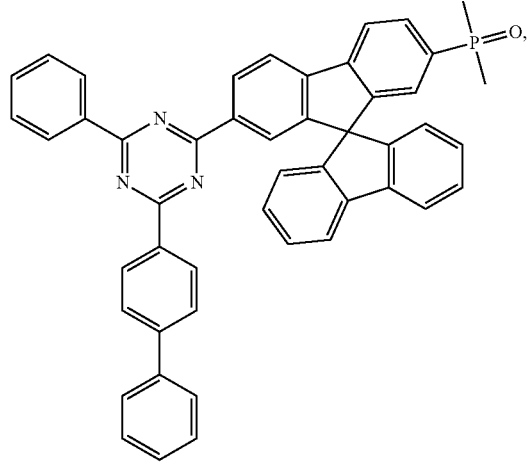
(H31)
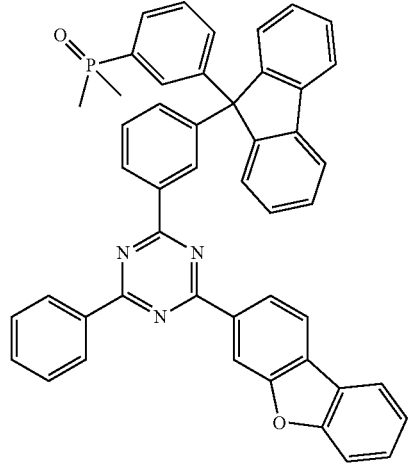
(H32)
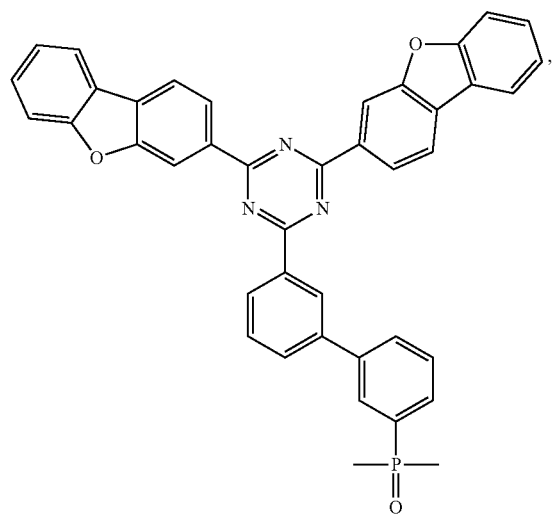
(H33)
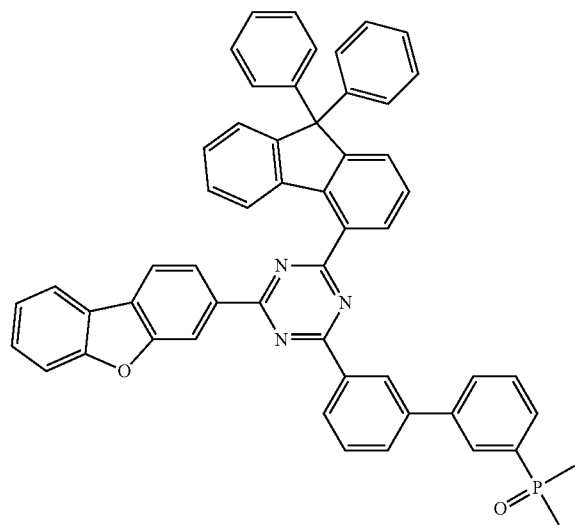

(H34)
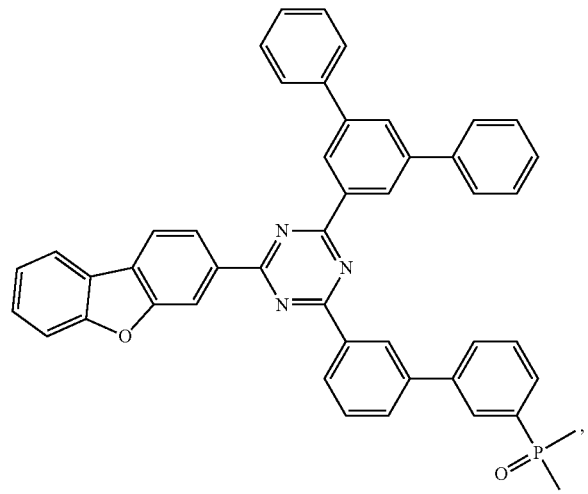
(H35)
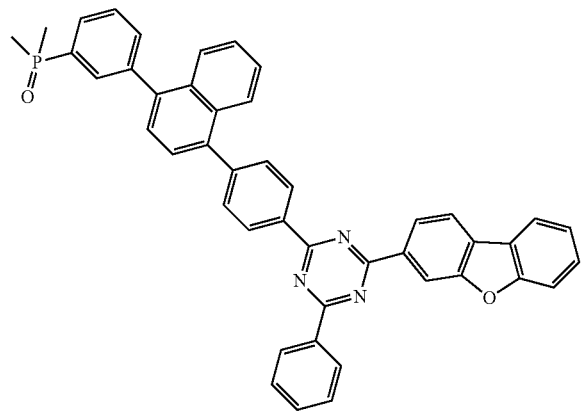
(H36)
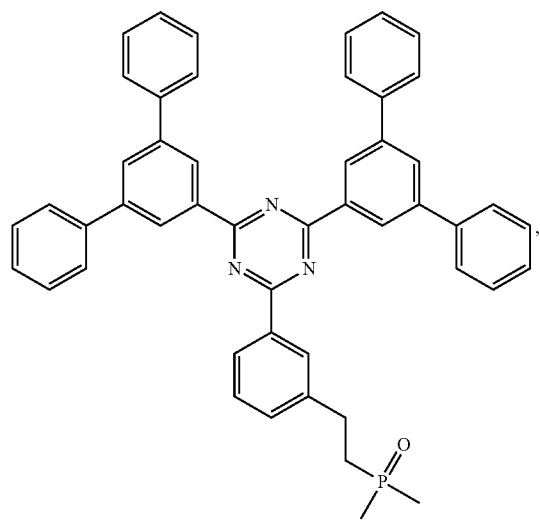
(H37)
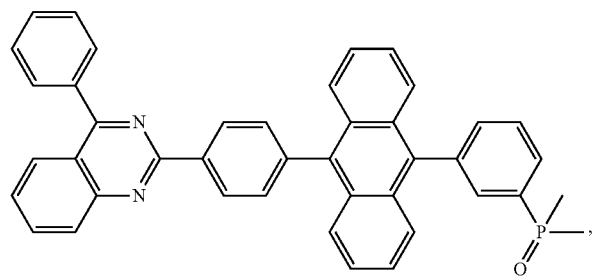
(H38)
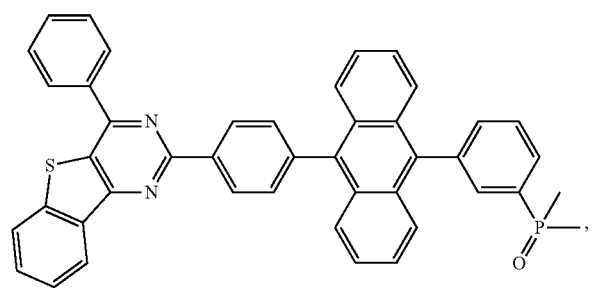
(H39)
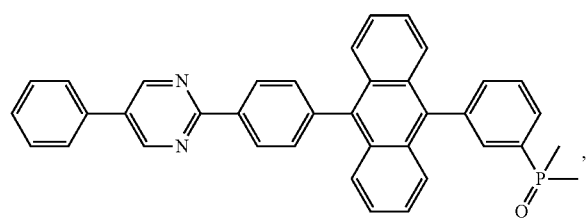

-continued
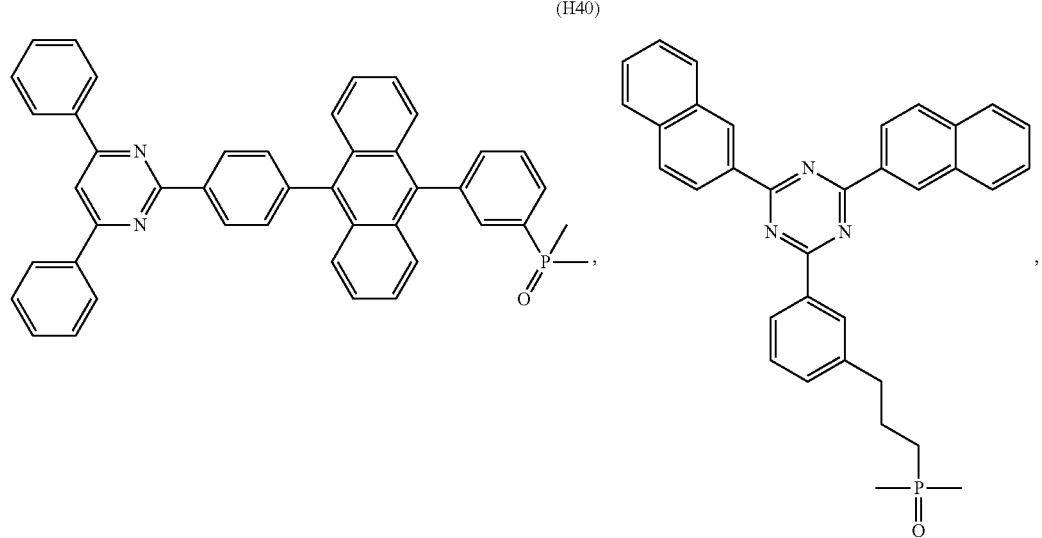
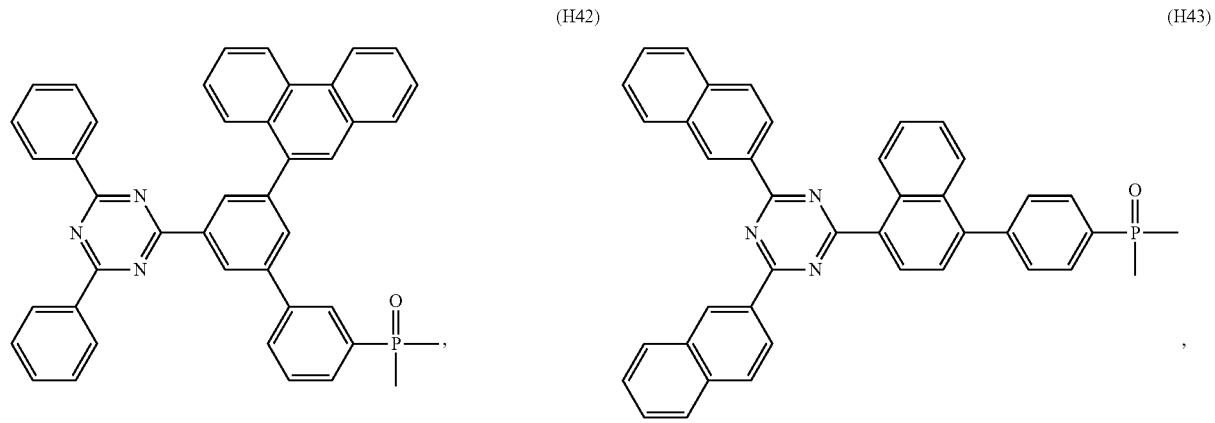
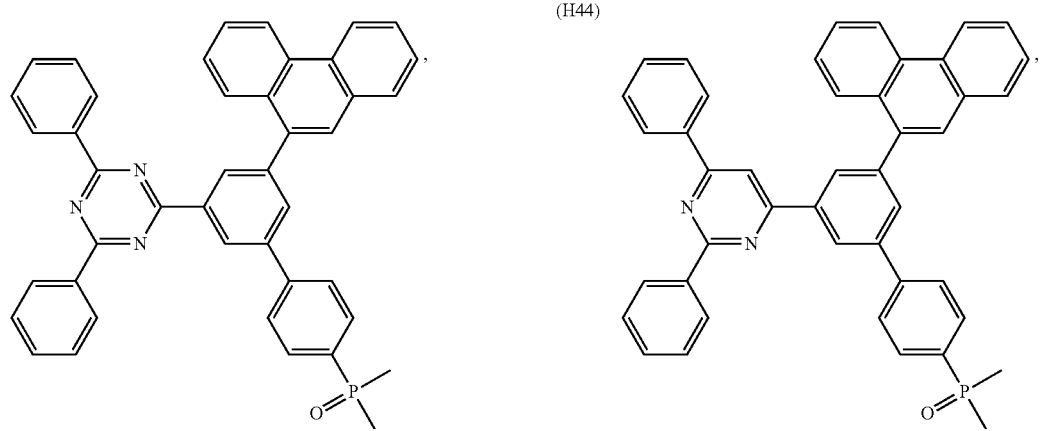

(H46) 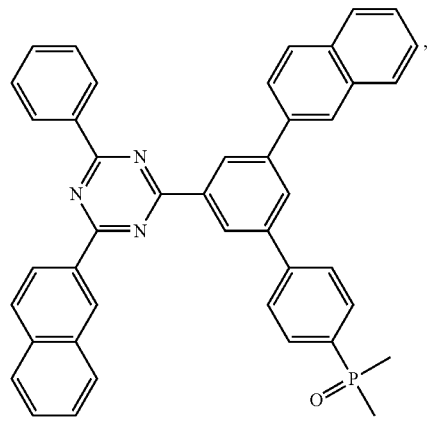
(H47) 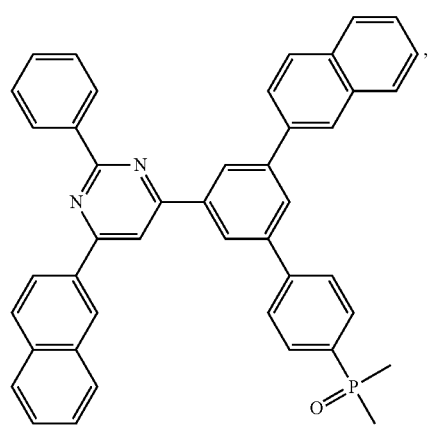
(H48) 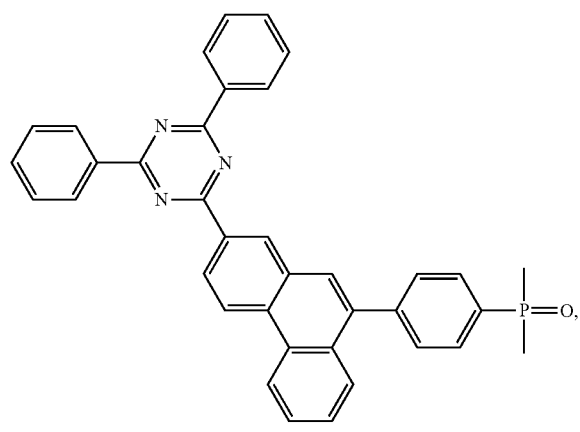
(H49) 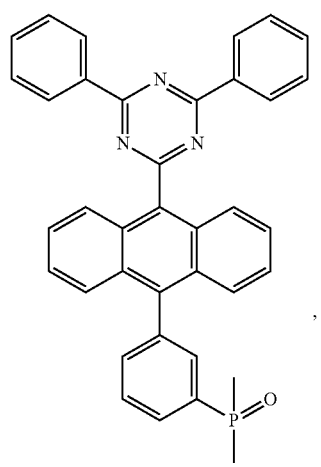
(H50) 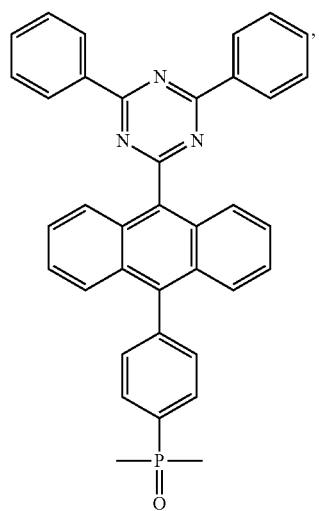
(H51) 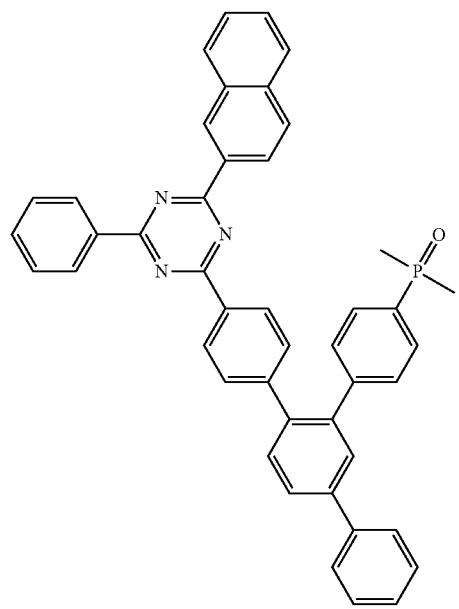

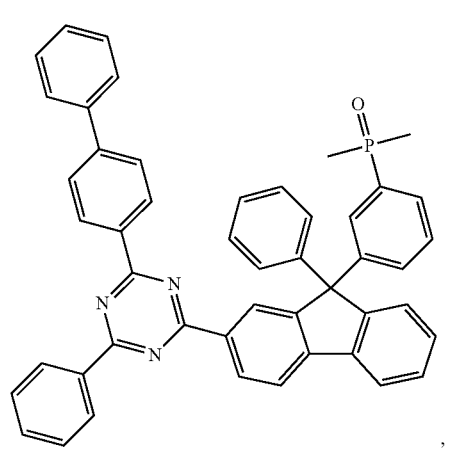
(H52)
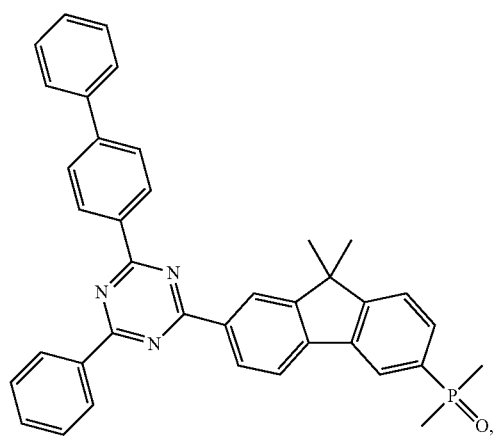
(H53)
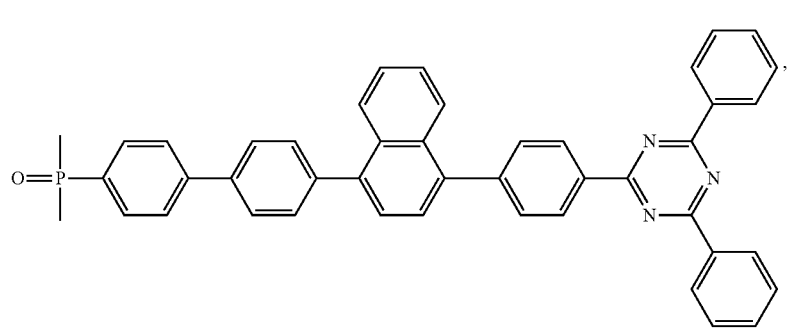
(H54)
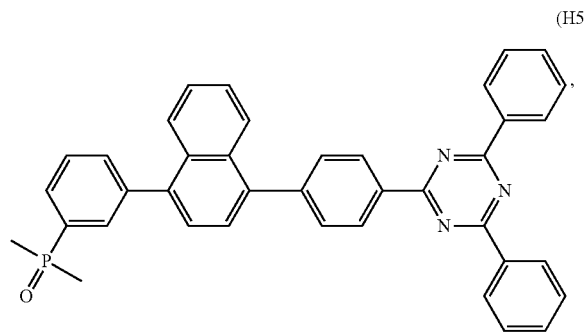
(H55)
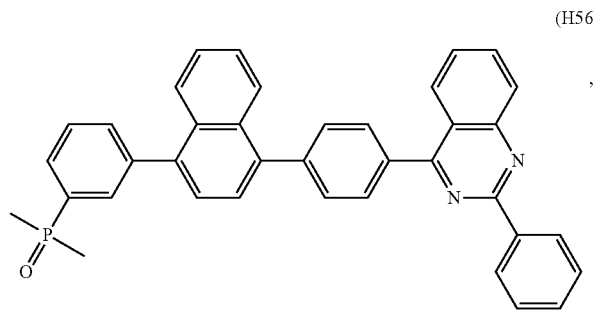
(H56)
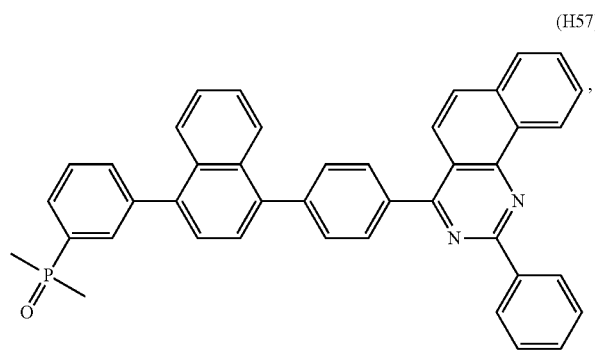
(H57)
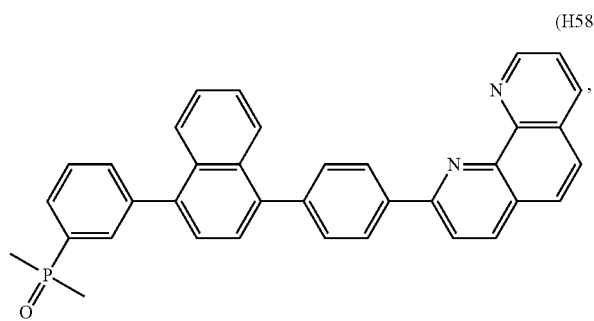
(H58)

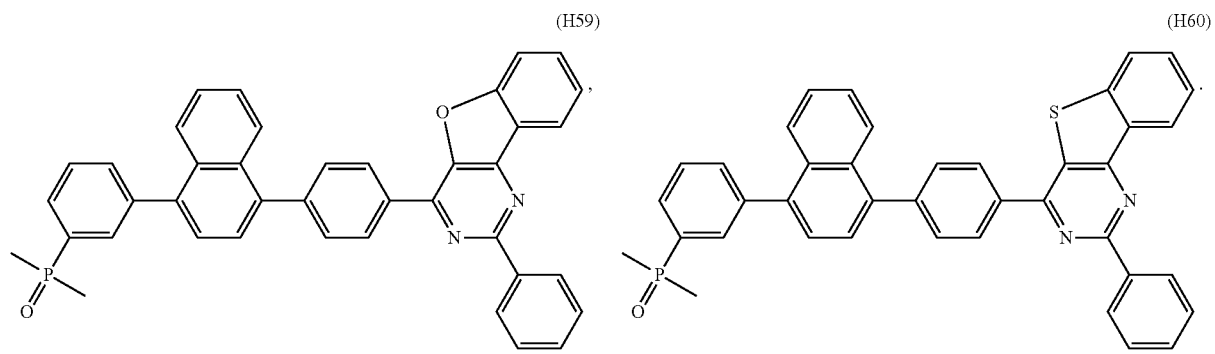

According to another embodiment, wherein the compound of formula 1 is selected from the group of H7 to H60.

According to another embodiment, wherein the compounds selected from the group of H1 to H6 are excluded.

According to another embodiment an organic semiconductor material comprising the compound of formula 1 is provided.

According to another embodiment an electronic device comprising the compound of formula 1 is provided.

According to another embodiment an electronic device comprising an organic semiconductor material comprising the compound of formula 1 is provided.

According to another embodiment a device comprising an organic light-emitting diode comprising the compound of formula 1 is provided.

According to another embodiment a display device comprising the compound of formula 1 is provided.

According to another embodiment a method of manufacturing the same is provided.

According to another embodiment of the organic electronic device, wherein the organic semiconductor layer comprises a compound of formula 1.

According to another embodiment of the organic electronic device, wherein the organic semiconductor layer is an electron transport layer.

According to another embodiment of the organic electronic device, wherein the at least one organic semiconductor layer further comprises at least one alkali halide or alkali organic complex.

According to yet another embodiment, a display device comprising the organic optoelectronic device is provided.

According to another embodiment, an organic optoelectronic device comprises an anode layer and a cathode layer facing each other and at least one organic semiconductor layer between the anode layer and the cathode layer, wherein the organic semiconductor layer comprises the compound of formula 1.

According to another embodiment of the organic electronic device, wherein the organic semiconductor layer is arranged between a photoactive layer and the cathode layer.

A photoactive layer can be an emission layer or a light-absorbing layer.

According to another embodiment of the organic electronic device, wherein the organic semiconductor layer is arranged between an emission layer or light-absorbing layer and the cathode layer.

According to another embodiment of the organic electronic device, wherein the organic semiconductor layer is arranged between a photoactive layer and a cathode layer, preferably between an emission layer or light-absorbing layer and the cathode layer, preferably the organic semiconductor layer is an electron transport layer.

The organic semiconductor layer can be an electron transport layer.

According to another embodiment of the organic electronic device, wherein the electronic device comprises at least one organic semiconductor layer, at least one anode layer, at least one cathode layer and at least one emission layer, wherein the organic semiconductor layer is preferably arranged between the emission layer and the cathode layer.

Preferably, the organic semiconductor layer is arranged between the emission layer and the cathode layer and is essentially non-emissive or non-emissive.

Preferably, the organic semiconductor layer is arranged between the emission layer and the cathode layer and free of group III to VI, rare earth and transition metal compounds.

Preferably, the organic semiconductor layer is arranged between the emission layer and the cathode layer and is essentially non-emissive or non-emissive, wherein the organic semiconductor layer, the emission layer and the cathode layer may differ in their components and composition.

According to another embodiment, the organic semiconductor layer comprising the compound of formula 1 is in direct contact with the cathode electrode.

According to another embodiment, the organic semiconductor layer comprising the compound of formula 1 is in direct contact with the emission layer.

According to another embodiment, the organic semiconductor layer comprising the compound of formula 1 is in direct contact with the hole blocking layer.

According to another embodiment, the organic semiconductor layer comprising the compound of formula 1 is in direct contact with an electron transport auxiliary layer, wherein the electron transport auxiliary layer is in direct contact with the emission layer.

According to another embodiment, the organic semiconductor layer comprising the compound of formula 1 is in direct contact with the electron injection layer.

According to another embodiment, the organic semiconductor layer comprising the compound of formula 1 is contacting sandwiched between the electron transport auxiliary layer and the electron injection layer.

According to another embodiment, the organic semiconductor layer comprising the compound of formula 1 is contacting sandwiched between the electron transport auxiliary layer and the electron injection layer and the organic semiconductor layer further comprises an alkali halide or alkali organic complex.

According to another embodiment, the organic semiconductor layer comprising the compound of formula 1 is contacting sandwiched between the electron transport auxiliary layer and the cathode layer.

According to another embodiment, the organic semiconductor layer comprising the compound of formula 1 is contacting sandwiched between the electron transport auxiliary layer and the cathode layer and the organic semiconductor layer further comprises an alkali halide or alkali organic complex.

Hereinafter, an organic optoelectronic device according to another embodiment is described.

An organic optoelectronic device according to another embodiment comprises an anode layer and a cathode layer facing each other and at least one organic semiconductor layer between the anode layer and the cathode layer and the organic semiconductor layer comprises the compound for an organic optoelectronic device.

The compound for an organic optoelectronic device represented by formula 1 may be appropriate for an organic semiconductor layer of an organic optoelectronic device, for example, a host of an emission layer, an electron transport layer, an electron injection layer or an electron transport auxiliary layer.

According to another embodiment of the organic electronic device, wherein the electronic device is a light emitting device, thin film transistor, a battery, a display device or a photovoltaic cell and preferably a light emitting device.

According to another aspect a compound according to formula 1 is provided, wherein Ar$^1$ that is selected from substituted and unsubstituted dibenzo[c,h]acridine, benzo[c]acridine, carbazole, indolo[3,2-a]carbazole, 1,3,5,2,4,6-triazatriphosphinine, and the following compounds are excluded:

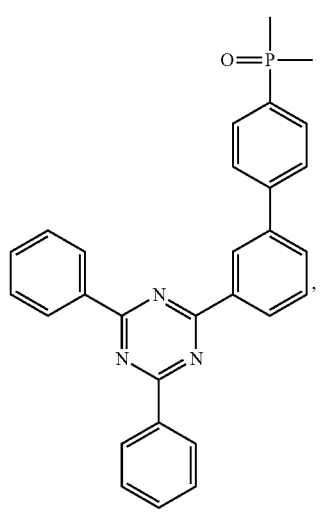

(G1)

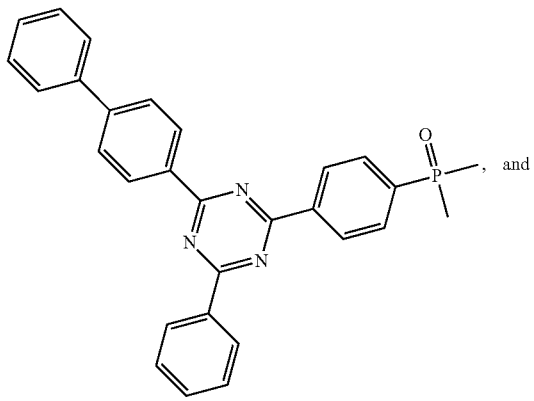

(G2)

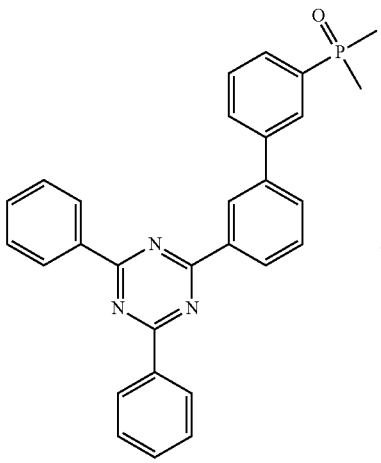

(G3)

According to another aspect a compound according to formula 1 is provided, wherein Ar$^1$ is selected from substituted and unsubstituted dibenzo[c,h]acridine, benzo[c]acridine, carbazole, indolo[3,2-a]carbazole, 1,3,5,2,4,6-triazatriphosphinine, wherein the following compounds are excluded:

a) a compound according to formula (I):

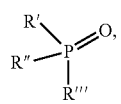

(I)

wherein

R', R" and R''' are independently selected from $C_1$-$C_{30}$-alkyl, $C_3$-$C_{30}$ cycloalkyl and from structural unit having general formula E-A-;

wherein

A is a $C_6$-$C_{30}$ phenylene spacer unit, and

E is an electron transport unit having the structure (Ia), (Ib) and/or (Ic):

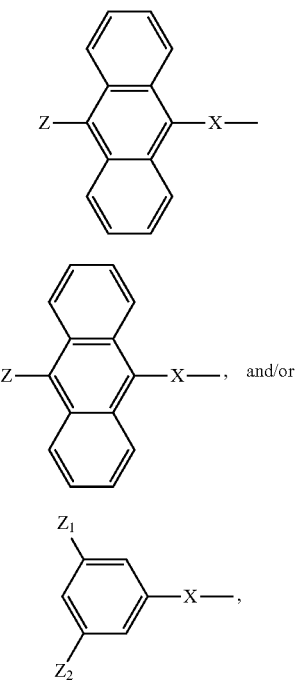

wherein in structure (Ia)
X is a single bond and
Z is selected from a group comprising dibenzo[b,d]furanyl, dibenzo[b,d]thiophenyl; wherein in structure (Ib)
X is selected from a group comprising, phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl; and
Z is selected from a group comprising, dibenzo[b,d]furanyl, dibenzo[b,d]thiophenyl, 9-anthranyl;
wherein in structure (Ic)
X is a single bond; and
$Z_1$ and $Z_2$ are independently selected from a group comprising dibenzo[b,d]furanyl, dibenzo[b,d]thiophenyl; and
b) at least one compound of formula (II):

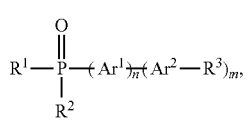

wherein
$R^1$ and $R^2$ are each independently selected from $C_1$ to $C_{16}$ alkyl;
$Ar^1$ is selected from $C_6$ to $C_{14}$ arylene or $C_3$ to $C_{12}$ heteroarylene;
$Ar^2$ is independently selected from $C_{14}$ to $C_{40}$ arylene or $C_8$ to $C_{40}$ heteroarylene;
$R^3$ is independently selected from H, $C_1$ to $C_{12}$ alkyl or $C_{10}$ to $C_{20}$ aryl;
wherein
each of $Ar^1$, $Ar^2$ and $R^3$ may each independently be unsubstituted or substituted with at least one $C_1$ to $C_{12}$ alky group;
n is 0 or 1; and
m is 1 in case of n=0; and m is 1 or 2 in case of n=1.

According to another embodiment, the compound of formula 1 is free of:
metal cations and/or
NR', SR' and/or $NO_2$ groups,
wherein R' is selected from H, alkyl or aryl.

According to another aspect a compound according to formula 1 is provided, wherein $Ar^1$ is selected from substituted and unsubstituted dibenzo[c,h]acridine, benzo[c]acridine, carbazole, indolo[3,2-a]carbazole, 1,3,5,2,4,6-triazatriphosphinine, wherein the following compounds are excluded:

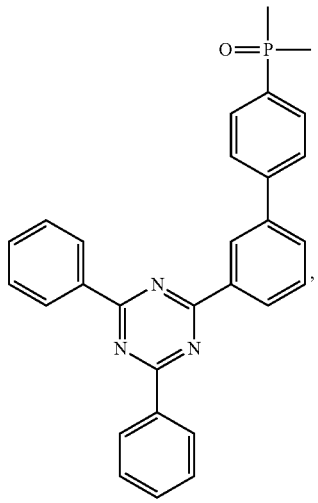

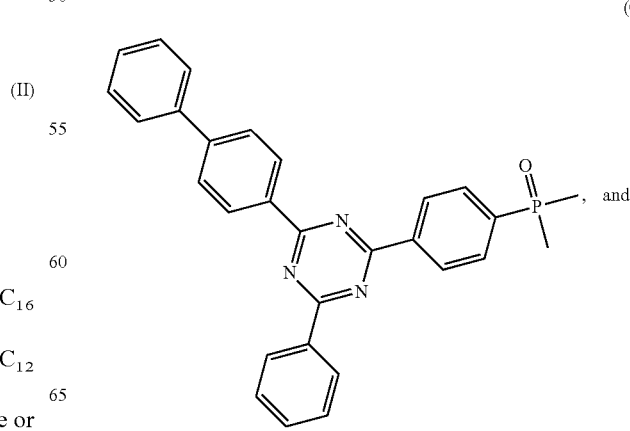

and a) a compound according to formula (I):

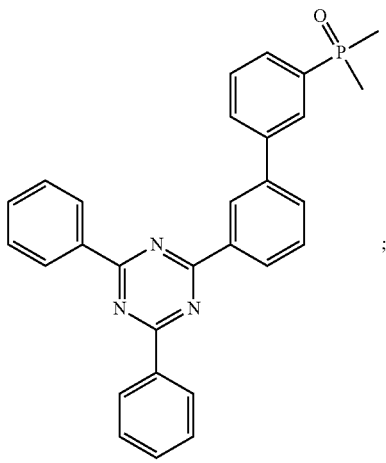
(G3)

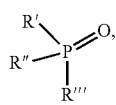
(I)

wherein

R', R" and R'" are independently selected from $C_1$-$C_{30}$-alkyl, $C_3$-$C_{30}$ cycloalkyl and from structural unit having general formula E-A-;

wherein

A is a $C_6$-$C_{30}$ phenylene spacer unit, and

E is an electron transport unit having the structure (Ia), (Ib) and/or (Ic):

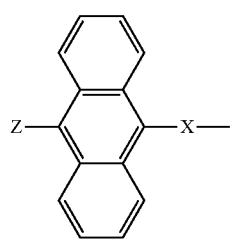
(Ia)

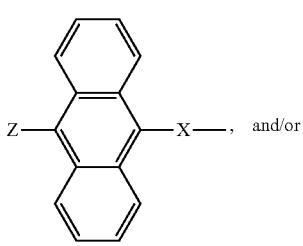
(Ib) and/or

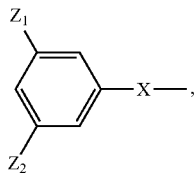
(Ic)

wherein in structure (Ia)

X is a single bond and

Z is selected from a group comprising dibenzo[b,d]furanyl, dibenzo[b,d]thiophenyl; wherein in structure (Ib)

X is selected from a group comprising, phenylene, biphenyl, naphthalen-1,8-diyl, naphthalen-2,6-diyl, 9,9'-dialkylfluoren-2,7-diyl, 9,9'-diarylfluoren-2,7-diyl, 9-alkyl-9'-arylfluoren-2,7-diyl, 9,9'-dialkylfluoren-3,6-diyl, 9,9'-diarylfluoren-3,6-diyl and 9-alkyl-9'-arylfluoren-3,6-diyl; and Z is selected from a group comprising, dibenzo[b,d]furanyl, dibenzo[b,d]thiophenyl, 9-anthranyl;

wherein in structure (Ic)

X is a single bond; and $Z_1$ and $Z_2$ are independently selected from a group comprising dibenzo[b,d]furanyl, dibenzo[b,d]thiophenyl; and b) at least one compound of formula (II):

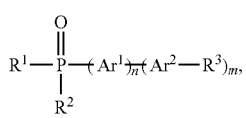
(II)

wherein $R^1$ and $R^2$ are each independently selected from $C_1$ to $C_{16}$ alkyl;

$Ar^1$ is selected from $C_6$ to $C_{14}$ arylene or $C_3$ to $C_{12}$ heteroarylene;

$Ar^2$ is independently selected from $C_{14}$ to $C_{40}$ arylene or $C_8$ to $C_{40}$ heteroarylene;

$R^3$ is independently selected from H, $C_1$ to $C_{12}$ alkyl or $C_{10}$ to $C_{20}$ aryl;

wherein each of $Ar^1$, $Ar^2$ and $R^3$ may each independently be unsubstituted or substituted with at least one $C_1$ to $C_{12}$ alky group;

n is 0 or 1; and m is 1 in case of n=0; and m is 1 or 2 in case of n=1; and c) wherein the compound of formula 1 is free of:

metal cations and/or

NR', SR' and/or $NO_2$ groups, wherein R' is selected from H, alkyl or aryl.

According to another aspect a compound according to formula 1 is provided, wherein $Ar^1$ is selected from substituted and unsubstituted dibenzo[c,h]acridine, benzo[c]acridine, carbazole, indolo[3,2-a]carbazole, 1,3,5,2,4,6-triazatriphosphinine, wherein the following compounds are excluded:

a) G1 to G3:

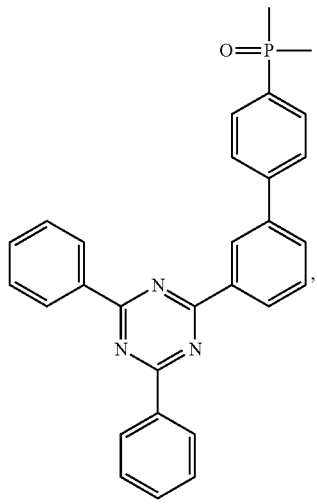
(G1)

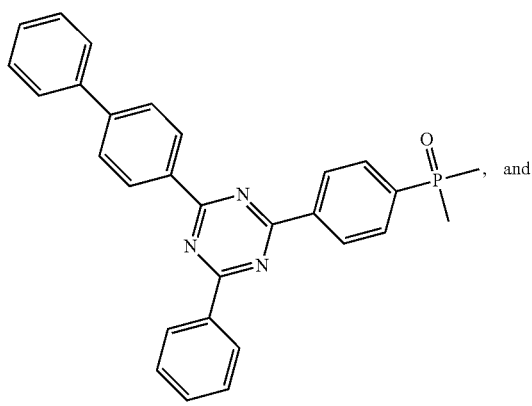
(G2), and

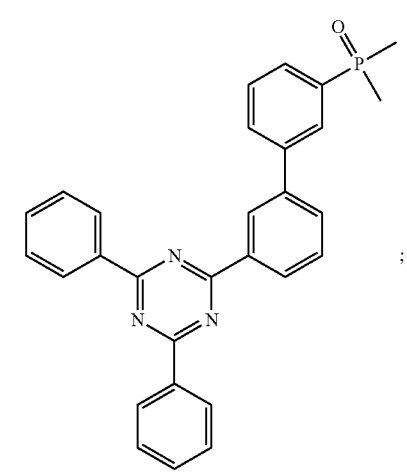
(G3)

and b) Ar¹ that is selected from substituted and unsubstituted dibenzo[c,h]acridine, benzo[c]acridine, carbazole, indolo[3,2-a]carbazole, 1,3,5,2,4,6-triazatriphosphinine; and c) a compound according to formula (I):

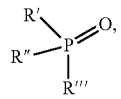
(I)

wherein
R', R" and R'" are independently selected from $C_1$-$C_{30}$-alkyl, $C_3$-$C_{30}$ cycloalkyl, $C_2$-$C_{30}$-heteroalkyl, $C_6$-$C_{30}$-aryl, $C_2$-$C_{30}$-heteroaryl, $C_1$-$C_{30}$-alkoxy, $C_3$-$C_{30}$-cycloalkyloxy, $C_6$-$C_{30}$-aryloxy, and from structural unit having general formula E-A-;

wherein
A is a $C_6$-$C_{30}$ phenylene spacer unit, and
E is an electron transporting unit that is selected from $C_{10}$-$C_{60}$ aryl and $C_6$-$C_{60}$ heteroaryl comprising up to 6 heteroatoms independently selected from O, S, P, Si and B and that comprises a conjugated system of at least 10 delocalized electrons, and
at least one group selected from R', R" and R'" has the general formula E-A-; and d) at least one compound of formula (II):

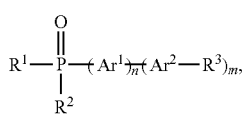
(II)

wherein
$R^1$ and $R^2$ are each independently selected from $C_1$ to $C_{16}$ alkyl;
$Ar^1$ is selected from $C_6$ to $C_{14}$ arylene or $C_3$ to $C_{12}$ heteroarylene;
$Ar^2$ is independently selected from $C_{14}$ to $C_{40}$ arylene or $C_8$ to $C_{40}$ heteroarylene;
$R^3$ is independently selected from H, $C_1$ to $C_{12}$ alkyl or $C_{10}$ to $C_{20}$ aryl;

wherein
each of $Ar^1$, $Ar^2$ and $R^3$ may each independently be unsubstituted or substituted with at least one $C_1$ to $C_{12}$ alky group;
n is 0 or 1; and
m is 1 in case of n=0; and m is 1 or 2 in case of n=1; and wherein
e) the compound of formula 1 is free of:
metal cations and/or
NR', SR' and/or $NO_2$ groups,
wherein R' is selected from H, alkyl or aryl.

Advantageous Effects

Surprisingly, it was found that the compounds of formula 1 and the inventive organic electronic device solve the problem underlying the present invention by being superior over the organic electroluminescent devices and compounds known in the art, in particular with respect to glass transition temperature, conductivity and operating voltage. A high glass transition temperature is important for improved thermal stability of a layer formed from the compound of formula 1, and thereby improved thermal stability of an electronic device. Increased conductivity and reduced operating voltage are important for low power consumption and increased battery life, for example in a mobile display device.

The inventors have surprisingly found that particular good performance can be achieved when using the organic electroluminescent device as a fluorescent blue device.

The specific arrangements mentioned herein as preferred were found to be particularly advantageous.

Likewise, some compounds falling within the scope of the broadest definition of the present invention have surprisingly been found to be particularly well performing with respect to the mentioned properties of glass transition temperature, conductivity and operating voltage. These compounds are discussed herein to be particularly preferred.

Further an organic optoelectronic device having high efficiency and/or long life-span may be realized.

Hereinafter, a compound for an organic optoelectronic device according to an embodiment is described.

A compound for an organic optoelectronic device according to an embodiment is represented by formula 1 according to the invention.

The compound of the invention of formula 1 may help injection or transport of electrons or increases a glass transition temperature of the compound, and thus luminance efficiency may be increased due to suppression of an intermolecular interaction, and the compound may have a low deposition temperature relative to the molecular weight.

Therefore, when the compound of formula 1 are used for an organic optoelectronic device these compounds may decrease the operating voltage of the device due to excellent electron transport characteristics and increase luminance efficiency due to rapid injection of electrons into an emission layer. On the other hand, when the compound is mixed with a material having excellent hole injection and transport characteristics to form the emission layer, the compound may also decrease the operating voltage due to excellent electron transport capability and obtain excellent luminance efficiency due to efficient charge injection and formation of excitons. In addition, excellent electron injection and transport characteristics of the compound for an organic optoelectronic device represented by formula 1 may be obtained. In addition, the compound of formula 1 may still maintain excellent electron injection and transport characteristics even when used to from an electron injection auxiliary layer or to form an emission layer as a mixture with a compound having excellent hole characteristics.

The compound for an organic optoelectronic device represented by formula 1 may include at least 4 to about 15, preferably at least 5 to about 8, substituted or unsubstituted $C_6$ to $C_{18}$ arylene groups.

Particularly good performance characteristics are obtained when the compound of formula 1 is selected in this range.

The compound for an organic optoelectronic device represented by formula 1 may have a molecular weight (Mw) of ≥400 to ≤1800 g/mol, and preferably ≥420 to ≤1400 g/mol, more preferred ≥450 to ≤1000 g/mol, also preferred ≥420 to ≤850 g/mol.

If the molecular weight is selected in this range, particularly reproducible evaporation and deposition can be achieved in vacuum at temperatures where good long-term stability is observed.

Anode

A material for the anode may be a metal or a metal oxide, or an organic material, preferably a material with work function above about 4.8 eV, more preferably above about 5.1 eV, most preferably above about 5.3 eV. Preferred metals are noble metals like Pt, Au or Ag, preferred metal oxides are transparent metal oxides like ITO or IZO which may be advantageously used in bottom-emitting OLEDs having a reflective cathode.

In devices comprising a transparent metal oxide anode or a reflective metal anode, the anode may have a thickness from about 50 nm to about 100 nm, whereas semitransparent metal anodes may be as thin as from about 5 nm to about 15 nm.

Hole Injection Layer

The hole injection layer may improve interface properties between the anode and an organic material used for the hole transport layer, and is applied on a non-planarized anode and thus may planarize the surface of the anode. For example, the hole injection layer may include a material having a median value of the energy level of its highest occupied molecular orbital (HOMO) between the work function of the anode material and the energy level of the HOMO of the hole transport layer, in order to adjust a difference between the work function of the anode and the energy level of the HOMO of the hole transport layer.

When the hole transport region comprises a hole injection layer 36, the hole injection layer may be formed on the anode by any of a variety of methods, for example, vacuum deposition, spin coating, casting, Langmuir-Blodgett (LB) method, or the like.

When hole injection layer is formed using vacuum deposition, vacuum deposition conditions may vary depending on the material that is used to form the hole injection layer, and the desired structure and thermal properties of the hole injection layer to be formed and for example, vacuum deposition may be performed at a temperature of about 100° C. to about 500° C., a pressure of about $10^{-6}$ Pa to about $10^{-1}$ Pa, and a deposition rate of about 0.1 to about 10 nm/sec, but the deposition conditions are not limited thereto.

When the hole injection layer is formed using spin coating, the coating conditions may vary depending on the material that is used to form the hole injection layer, and the desired structure and thermal properties of the hole injection layer to be formed. For example, the coating rate may be in the range of about 2000 rpm to about 5000 rpm, and a temperature at which heat treatment is performed to remove a solvent after coating may be in a range of about 80° C. to about 200° C., but the coating conditions are not limited thereto.

The hole injection layer may further comprise a p-dopant to improve conductivity and/or hole injection from the anode.

P-Dopant

In another aspect, the p-dopant may be homogeneously dispersed in the hole injection layer.

In another aspect, the p-dopant may be present in the hole injection layer in a higher concentration closer to the anode and in a lower concentration closer to the cathode.

The p-dopant may be one of a quinone derivative, a radialene compound. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ).

Hole Transport Layer

Conditions for forming the hole transport layer and the electron blocking layer may be defined based on the above-described formation conditions for the hole injection layer.

A thickness of the hole transport part of the charge transport region may be from about 10 nm to about 1000 nm, for example, about 10 nm to about 100 nm. When the hole transport part of the charge transport region comprises the hole injection layer and the hole transport layer, a thickness of the hole injection layer may be from about 10 nm to about 1000 nm, for example about 10 nm to about 100 nm and a thickness of the hole transport layer may be from about 5 nm to about 200 nm, for example about 10 nm to about 150 nm. When the thicknesses of the hole transport part of the charge transport region, the HIL, and the HTL are within these ranges, satisfactory hole transport characteristics may be obtained without a substantial increase in operating voltage.

Hole transport matrix materials used in the hole transport region are not particularly limited. Preferred are covalent compounds comprising a conjugated system of at least 6 delocalized electrons, preferably organic compounds comprising at least one aromatic ring, more preferably organic compounds comprising at least two aromatic rings, even more preferably organic compounds comprising at least three aromatic rings, most preferably organic compounds comprising at least four aromatic rings. Typical examples of hole transport matrix materials which are widely used in hole transport layers are polycyclic aromatic hydrocarbons, triarylene amine compounds and heterocyclic aromatic compounds. Suitable ranges of frontier orbital energy levels of hole transport matrices useful in various layer of the hole transport region are well-known. In terms of the redox potential of the redox couple HTL matrix/cation radical of the HTL matrix, the preferred values (if measured for example by cyclic voltammetry against ferrocene/ferrocenium redox couple as reference) may be in the range 0.0-1.0 V, more preferably in the range 0.2-0.7 V, even more preferably in the range 0.3-0.5 V.

Buffer Layer

The hole transport part of the charge transport region may further include a buffer layer.

Buffer layer that can be suitable used are disclosed in U.S. Pat. Nos. 6,140,763, 6,614,176 and in US2016/248022.

The buffer layer may compensate for an optical resonance distance of light according to a wavelength of the light emitted from the EML, and thus may increase efficiency.

Emission Layer

The emission layer (EML) may be formed on the hole transport region by using vacuum deposition, spin coating, casting, LB method, or the like. When the emission layer is formed using vacuum deposition or spin coating, the conditions for deposition and coating may be similar to those for the formation of the hole injection layer, though the conditions for the deposition and coating may vary depending on the material that is used to form the emission layer. The emission layer may include an emitter host (EML host) and an emitter dopant (further only emitter).

Emitter Host

According to another embodiment, the emission layer comprises compound of formula 1 as emitter host.

The emitter host compound has at least three aromatic rings, which are independently selected from carbocyclic rings and heterocyclic rings.

Other compounds that can be used as the emitter host is an anthracene matrix compound represented by formula 400 below:

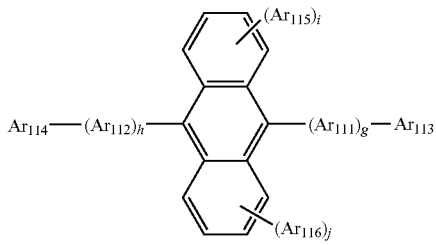

Formula 400

In formula 400, $A_{111}$ and $Ar_{112}$ may be each independently a substituted or unsubstituted $C_6$-$C_{60}$ aryleneene group; $Ar_{113}$ to $Ar_{116}$ may be each independently a substituted or unsubstituted $C_1$-$C_{10}$ alkyl group or a substituted or unsubstituted $C_6$-$C_{60}$ arylene group; and g, h, i, and j may be each independently an integer from 0 to 4.

In some embodiments, $Ar_{111}$ and $Ar_{112}$ in formula 400 may be each independently one of a phenylene group, a naphthylene group, a phenanthrenylene group, or a pyrenylene group; or a phenylene group, a naphthylene group, a phenanthrenylene group, a fluorenyl group, or a pyrenylene group, each substituted with at least one of a phenyl group, a naphthyl group, or an anthryl group.

In formula 400, g, h, i, and j may be each independently an integer of 0, 1, or 2.

In formula 400, $Ar_{113}$ to $Ar_{116}$ may be each independently one of a $C_1$-$C_{10}$ alkyl group substituted with at least one of a phenyl group, a naphthyl group, or an anthryl group;

a phenyl group, a naphthyl group, an anthryl group, a pyrenyl group, a phenanthrenyl group, or a fluorenyl group;

a phenyl group, a naphthyl group, an anthryl group, a pyrenyl group, a phenanthrenyl group, or a fluorenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, or a fluorenyl group

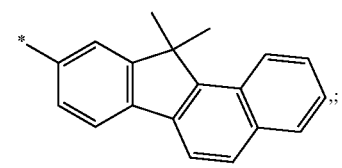 [SMILES: *c1ccc2c(c1)C(C)(C)c1c-2ccc2ccccc12]

or formulas 3 or 4

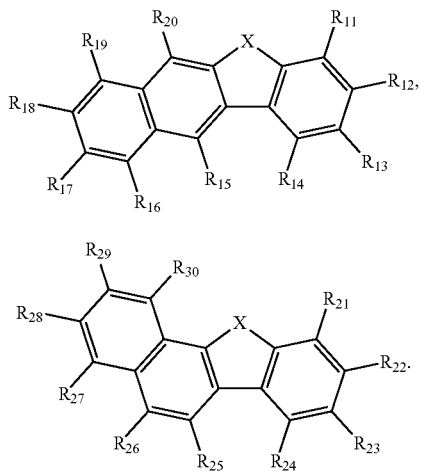

(3)

(4)

Wherein in the formulas 3 and 4, X is selected form an oxygen atom and a sulfur atom, but embodiments of the invention are not limited thereto.

In the formula 3, any one of $R_{11}$ to $R_{14}$ is used for bonding to $Ar_{111}$. $R_{11}$ to $R_{14}$ that are not used for bonding to $Ar_{111}$ and $R_{15}$ to $R_{20}$ are the same as $R_1$ to $R_8$.

In the formula 4, any one of $R_{21}$ to $R_{24}$ is used for bonding to $Ar_{111}$. $R_{21}$ to $R_{24}$ that are not used for bonding to $Ar_{111}$ and $R_{25}$ to $R_{30}$ are the same as $R_1$ to $R_8$.

Preferably, the EML host comprises between one and three heteroatoms selected from the group consisting of N, O or S. More preferred the EML host comprises one heteroatom selected from S or O.

The emitter host compound may have a dipole moment in the range from about ≥0 Debye to about ≤2.0 Debye.

Preferably, the dipole moment of the EML host is selected ≥0.2 Debye and ≤1.45 Debye, preferably ≥0.4 Debye and ≤1.2 Debye, also preferred ≥0.6 Debye and ≤1.1 Debye.

The dipole moment is calculated using the optimized using the hybrid functional B3LYP with the 6-31G* basis set as implemented in the program package TURBOMOLE V6.5. If more than one conformation is viable, the conformation with the lowest total energy is selected to determine the dipole moment of the molecules. Using this method, 2-(10-phenyl-9-anthracenyl)-benzo[b]naphtho[2,3-d]furan (CAS 1627916-48-6) has a dipole moment of 0.88 Debye, 2-(6-(10-phenylanthracen-9-yl)naphthalen-2-yl)dibenzo[b,d]thiophene (CAS 1838604-62-8) of 0.89 Debye, 2-(6-(10-phenylanthracen-9-yl)naphthalen-2-yl)dibenzo[b,d]furan (CAS 1842354-89-5) of 0.69 Debye, 2-(7-(phenanthren-9-yl)tetraphen-12-yl)dibenzo[b,d]furan (CAS 1965338-95-7) of 0.64 Debye, 4-(4-(7-(naphthalen-1-yl)tetraphen-12-yl)phenyl) dibenzo[b,d] furan (CAS 1965338-96-8) of 1.01 Debye.

Emitter Dopant

The dopant is mixed in a small amount to cause light emission, and may be generally a material such as a metal complex that emits light by multiple excitation into a triplet or more. The dopant may be, for example an inorganic, organic, or organic/inorganic compound, and one or more kinds thereof may be used.

The emitter may be a red, green, or blue emitter.

The dopant may be a fluorescent dopant, for example ter-fluorene, the structures are shown below. 4,4'-bis(4-diphenyl amiostyryl)biphenyl (DPAVBI, 2,5,8,11-tetra-tert-butyl perylene (TBPe), and Compound 5 below are examples of fluorescent blue dopants.

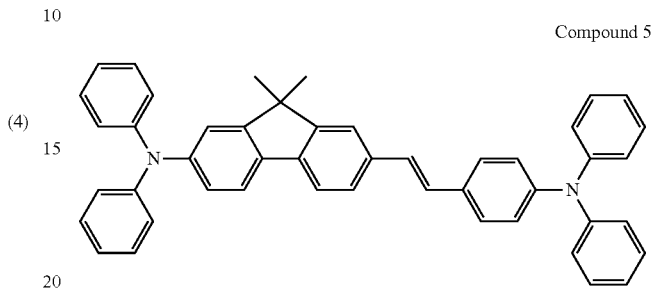

Compound 5

The dopant may be a phosphorescent dopant, and examples of the phosphorescent dopant may be an organic metal compound comprising Ir, Pt, Os, Ti, Zr, Hf, Eu, Tb, Tm, Fe, Co, Ni, Ru, Rh, Pd, or a combination thereof. The phosphorescent dopant may be, for example a compound represented by formula Z, but is not limited thereto:

$$J_2MX \qquad (Z).$$

In formula Z, M is a metal, and J and X are the same or different, and are a ligand to form a complex compound with M.

The M may be, for example Ir, Pt, Os, Ti, Zr, Hf, Eu, Tb, Tm, Fe, Co, Ni, Ru, Rh, Pd or a combination thereof, and the J and X may be, for example a bidendate ligand.

Electron Transport Layer

According to another embodiment, the organic semiconductor layer comprising a compound of formula 1 is an electron transport layer.

For example, an organic light emitting diode according to an embodiment of the present invention comprises at least one electron transport layer, and in this case, the electron transport layer comprises a compound of formula 1, or preferably of at least one compound of formulae H1 to H41.

In another embodiment, the organic electronic device comprises an electron transport region of a stack of organic layers formed by two or more electron transport layers, wherein at least one electron transport layer comprises a compound of formula 1.

The electron transport layer may include one or two or more different electron transport compounds.

According to another embodiment, the second electron transport layer (162) comprises at least one compound of formula 1 according to the invention and the first electron transport layer (161) comprises a matrix compound, which is selected different to the compound of formula 1 according to the invention, and may be selected from:

an anthracene based compound or a hetero substituted anthracene based compound, preferably 2-(4-(9,10-di(naphthalen-2-yl)anthracene-2-yl)phenyl)-1-phenyl-1H-benzo[d]imidazole and/or N4,N4"-di(naphthalen-1-yl)-N4,N4"-diphenyl-[1,1':4',1"-terphenyl]-4,4"-diamine.

According to another embodiment, the first electron transport layer (161) comprises at least one compound of formula 1 according to the invention and the second electron transport layer (162) comprises a matrix compound, which is selected different to the compound of formula 1 according to the invention, and may be selected from:

a phosphine oxide based compound, preferably (3-(dibenzo[c,h]acridin-7-yl)phenyl)diphenylphosphine oxide and/or phenyl bis(3-(pyren-1-yl)phenyl)phosphine oxide and/or 3-Phenyl-3H-benzo[b]dinaphtho[2,1-d:1',2'-f]phosphepine-3-oxide; or a substituted phenanthroline compound, preferably 2,4,7,9-tetraphenyl-1,10-phenanthroline or 2,9-di(biphenyl-4-yl)-4,7-diphenyl-1,10-phenanthroline.

According to another embodiment the first electron transport layer comprises at least one compound of formula 1 according to the invention and the second electron transport layer comprises a matrix compound, which is selected different to the compound of formula 1 according to the invention, and may be selected from a phosphine oxide based compound, preferably (3-(dibenzo[c,h]acridin-7-yl)phenyl)diphenylphosphine oxide and/or phenyl bis(3-(pyren-1-yl)phenyl)phosphine oxide and/or 3-Phenyl-3H-benzo[b]dinaphtho[2,1-d:1',2'-f]phosphepine-3-oxide.

According to another embodiment, the first and second electron transport layers comprise a compound of formula 1, wherein the compound of formula 1 is not selected the same.

The thickness of the first electron transport layer (161) may be from about 0.5 nm to about 100 nm, for example about 2 nm to about 30 nm. When the thickness of the first electron transport layer (161) is within these ranges, the first electron transport layer (161) may have improved electron transport ability without a substantial increase in operating voltage.

A thickness of the optional second electron transport layer (162) may be about 1 nm to about 100 nm, for example about 2 nm to about 20 nm. When the thickness of the electron transport layer is within these ranges, the electron transport layer may have satisfactory electron transporting ability without a substantial increase in operating voltage.

The electron transport layer may further comprise an alkali halide and/or alkali organic complex.

According to another embodiment, the first and second electron transport layers comprise a compound of formula 1, wherein the second electron transport layer (162) further comprises an alkali halide and/or alkali organic complex.

Alkali Halide

Alkali halides, also known as alkali metal halides, are the family of inorganic compounds with the chemical formula MX, where M is an alkali metal and X is a halogen.

M can be selected from Li, Na, Potassium, Rubidium and Cesium.

X can be selected from F, Cl, Br and J.

According to various embodiments of the present invention a lithium halide may be preferred. The lithium halide can be selected from the group comprising LiF, LiCl, LiBr and LiJ. However, most preferred is LiF.

The alkali halide is essentially non-emissive or non-emissive.

Alkali Organic Complex

According to various embodiments of the present invention the organic ligand of the lithium organic complex is a quinolate, a borate, a phenolate, a pyridinolate or a Schiff base ligand;

preferably the lithium quinolate complex has the formula III, IV or V:

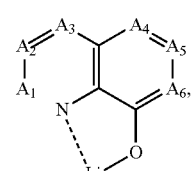

(III)

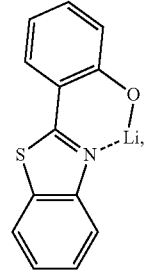

(IV)

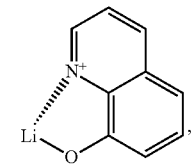

(V)

wherein
A$_1$ to A$_6$ are same or independently selected from CH, CR, N, O;
R is same or independently selected from hydrogen, halogen, alkyl or arylene or heteroarylene with 1 to 20 carbon atoms; and more preferred A1 to A6 are CH;
preferably the borate based organic ligand is a tetra(1H-pyrazol-1-yl)borate;
preferably the phenolate is a 2-(pyridin-2-yl)phenolate, a 2-(diphenylphosphoryl)phenolate, an imidazol phenolates, or 2-(pyridin-2-yl)phenolate and more preferred 2-(1-phenyl-1H-benzo[d]imidazol-2-yl)phenolate;
preferably the pyridinolate is a 2-(diphenylphosphoryl)pyridin-3-olate.

According to various embodiments of the present invention the organic ligand of the alkali organic complex, preferably of a lithium organic complex, can be a quinolate. Quinolates that can be suitable used are disclosed in WO 2013079217 A1 and incorporated by reference.

According to various embodiments of the present invention the organic ligand of the lithium organic complex can be a borate based organic ligand, Preferably the lithium organic complex is a lithium tetra(1H-pyrazol-1-yl)borate. Borate based organic ligands that can be suitable used are disclosed in WO 2013079676 A1 and incorporated by reference.

According to various embodiments of the present invention the organic ligand of the lithium organic complex can be a phenolate ligand, Preferably the lithium organic complex is a lithium 2-(diphenylphosphoryl)phenolate. Phenolate ligands that can be suitable used are disclosed in WO 2013079678 A1 and incorporated by reference.

Further, phenolate ligands can be selected from the group of pyridinolate, preferably 2-(diphenylphosphoryl)pyridin-3-olate. Pyridine phenolate ligands that can be suitable used are disclosed in JP 2008195623 and incorporated by reference.

In addition, phenolate ligands can be selected from the group of imidazol phenolates, preferably 2-(1-phenyl-1H-benzo[d]imidazol-2-yl)phenolate. Imidazol phenolate ligands that can be suitable used are disclosed in JP 2001291593 and incorporated by reference.

Also, phenolate ligands can be selected from the group of oxazol phenolates, preferably 2-(benzo[d]oxazol-2-yl)phenolate. Oxazol phenolate ligands that can be suitable used are disclosed in US 20030165711 and incorporated by reference.

The alkali organic complex may be essentially non-emissive or non-emissive.

N-Dopant

According to various embodiments, the organic semiconductor layer comprising a compound of formula 1 may further comprise an n-dopant.

Electrically neutral metal complexes suitable as n-dopants may be e.g. strongly reductive complexes of some transition metals in low oxidation state. Particularly strong n-dopants may be selected for example from Cr(II), Mo(II) and/or W(II) guanidinate complexes such as $W_2(hpp)_4$, as described in more detail in WO2005/086251.

Electrically neutral organic radicals suitable as n-dopants may be e.g. organic radicals created by supply of additional energy from their stable dimers, oligomers or polymers, as described in more detail in EP 1 837 926 B1, WO2007/107306, or WO2007/107356. Specific examples of such suitable radicals may be diazolyl radicals, oxazolyl radicals and/or thiazolyl radicals.

In another embodiment, the organic semiconductor layer may further comprise an elemental metal. An elemental metal is a metal in a state of metal in its elemental form, a metal alloy, or a metal cluster. It is understood that metals deposited by vacuum thermal evaporation from a metallic phase, e.g. from a bulk metal, vaporize in their elemental form. It is further understood that if the vaporized elemental metal is deposited together with a covalent matrix, the metal atoms and/or clusters are embedded in the covalent matrix. In other words, it is understood that any metal doped covalent material prepared by vacuum thermal evaporation contains the metal at least partially in its elemental form.

For the use in consumer electronics, only metals containing stable nuclides or nuclides having very long halftime of radioactive decay might be applicable. As an acceptable level of nuclear stability, the nuclear stability of natural potassium can be taken.

In one embodiment, the n-dopant is selected from electropositive metals selected from alkali metals, alkaline earth metals, rare earth metals and metals of the first transition period Ti, V, Cr and Mn. Preferably, the n-dopant is selected from Li, Na, K, Rb, Cs, Mg, Ca, Sr, Ba, Sm, Eu, Tm, Yb; more preferably from Li, Na, K, Rb, Cs, Mg and Yb, even more preferably from Li, Na, Cs and Yb, most preferably from Li, Na and Yb.

The n-dopant may be essentially non-emissive or non-emissive.

Electron Injection Layer

According to another aspect of the invention, the organic electroluminescent device may further comprise an electron injection layer between the first electron transport layer (first-ETL) and the cathode.

The electron injection layer (EIL) may facilitate injection of electrons from the cathode.

According to another aspect of the invention, the electron injection layer comprises:

(i) an electropositive metal selected from alkali metals, alkaline earth metals and rare earth metals in substantially elemental form, preferably selected from Li, Na, K, Rb, Cs, Mg, Ca, Sr, Ba, Eu and Yb, more preferably from Li, Na, Mg, Ca, Sr and Yb, even more preferably from Li and Yb, most preferably Yb; and/or (ii) an alkali metal complex and/or alkali metal salt, preferably the Li complex and/or salt, more preferably a Li quinolinolate, even more preferably a lithium 8-hydroxyquinolinolate, most preferably the alkali metal salt and/or complex of the second electron transport layer (second-ETL) is identical with the alkali metal salt and/or complex of the injection layer.

The electron injection layer may include at least one selected from LiF, NaCl, CsF, $Li_2O$, and BaO.

A thickness of the EIL may be from about 0.1 nm to about 10 nm, or about 0.3 nm to about 9 nm. When the thickness of the electron injection layer is within these ranges, the electron injection layer may have satisfactory electron injection ability without a substantial increase in operating voltage.

Cathode

A material for the cathode may be a metal, an alloy, or an electrically conductive compound that have a low work function, or a combination thereof. Specific examples of the material for the cathode may be lithium (Li), magnesium (Mg), aluminum (Al), aluminum-lithium (Al—Li), calcium (Ca), magnesium-indium (Mg—In), magnesium-silver (Mg—Ag), etc. In order to manufacture a top-emission light-emitting device having a reflective anode deposited on a substrate, the cathode may be formed as a light-transmissive electrode from, for example, indium tin oxide (ITO) or indium zinc oxide (IZO).

In devices comprising a transparent metal oxide cathode or a reflective metal cathode, the cathode may have a thickness from about 50 nm to about 100 nm, whereas semitransparent metal cathodes may be as thin as from about 5 nm to about 15 nm.

Organic Electronic Device

An organic electronic device according to the invention may include a substrate, an anode layer, an organic semiconductor layer comprising a compound of formula 1 and a cathode layer.

An organic light-emitting diode (OLED) according to the invention may include an anode, a hole transport layer (HTL), an emission layer (EML), a first electron transport layer (ETL) comprising at least one compound of formula 1, and a cathode, which are sequentially stacked on a substrate. In this regard, the HTL, the EML, and the ETL are thin films formed from organic compounds.

According to one embodiment the OLED may have the following layer structure, wherein the layers having the following order:

an anode layer, a hole injection layer, optional an first hole transport layer, optional a second hole transport layer, an emission layer, an electron transport layer comprising a compound of formula 1 according to the invention, an electron injection layer, and a cathode layer.

According to another aspect of the present invention, there is provided a method of manufacturing an organic electronic device, the method using:

at least one deposition source, preferably two deposition sources and more preferred at least three deposition sources.

The methods for deposition that can be suitable comprise:
deposition via vacuum thermal evaporation;
deposition via solution processing, preferably the processing is selected from spin-coating, printing, casting; and/or
slot-die coating.

According to various embodiments of the present invention, there is provided a method using:
a first deposition source to release the compound of formula 1 according to the invention, and
a second deposition source to release the alkali halide or alkali organic complex, preferably a lithium halide or lithium organic complex;
the method comprising the steps of forming the electron transport layer stack; whereby for an organic light-emitting diode (OLED):
the first electron transport layer is formed by releasing the compound of formula 1 according to the invention from the first deposition source and the alkali halide or alkali organic complex, preferably a lithium halide or lithium organic complex from the second deposition source.

According to various embodiments of the present invention, the method may further include forming on the anode electrode an emission layer and at least one layer selected from the group consisting of forming a hole injection layer, forming a hole transport layer, or forming a hole blocking layer, between the anode electrode and the first electron transport layer.

According to various embodiments of the present invention, the method may further include the steps for forming an organic light-emitting diode (OLED), wherein
on a substrate a first anode electrode is formed,
on the first anode electrode an emission layer is formed,
on the emission layer an electron transport layer stack is formed, preferably the first electron transport layer is formed on the emission layer and optional a second electron transport layer is formed,
and finally a cathode electrode is formed,
optional a hole injection layer, a hole transport layer, and a hole blocking layer, formed in that order between the first anode electrode and the emission layer,
optional an electron injection layer is formed between the electron transport layer and the cathode electrode.

According to various embodiments of the present invention, the method may further include forming an electron injection layer on the first electron transport layer. However, according to various embodiments of the OLED of the present invention, the OLED may not comprise an electron injection layer.

According to various embodiments, the OLED may have the following layer structure, wherein the layers having the following order:
an anode, first hole transport layer, second hole transport layer, emission layer, optional second electron transport layer, first electron transport layer comprising a compound of formula 1 according to the invention, optional an interlayer comprising an electron injection layer, and a cathode.

According to another aspect of the invention, it is provided an electronic device comprising at least one organic light emitting device according to any embodiment described throughout this application, preferably, the electronic device comprises the organic light emitting diode in one of embodiments described throughout this application. More preferably, the electronic device is a display device.

Hereinafter, the embodiments are illustrated in more detail with reference to examples. However, the present disclosure is not limited to the following examples.

DESCRIPTION OF THE DRAWINGS

These and/or other aspects and advantages of the present invention will become apparent and more readily appreciated from the following description of the exemplary embodiments, taken in conjunction with the accompanying drawings, of which.

Figure 1:
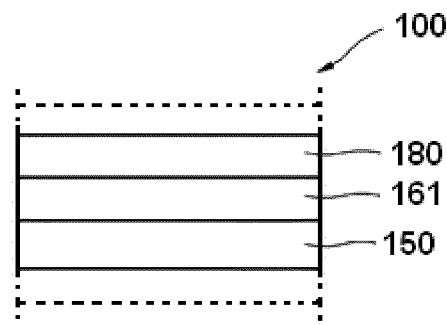
FIG. 1 is a schematic sectional view of an organic light-emitting diode (OLED), according to an exemplary embodiment of the present invention with an emission layer, one electron transport layer and an electron injection layer.

Reference will now be made in detail to the exemplary aspects, examples of which are illustrated in the accompanying drawings, wherein like reference numerals refer to the like elements throughout. The exemplary embodiments are described below, in order to explain the aspects, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

The term "contacting sandwiched" refers to an arrangement of three layers whereby the layer in the middle is in direct contact with the two adjacent layers.

The organic light emitting diodes according to an embodiment of the present invention may include a hole transport region; an emission layer; and a first electron transport layer comprising a compound according to formula 1.

FIG. 1 is a schematic sectional view of an organic light-emitting diode 100, according to an exemplary embodiment of the present invention. The OLED 100 comprises an emission layer 150, an electron transport layer (ETL) 161 and an electron injection layer 180, whereby the first electron transport layer 161 is disposed directly on the emission layer 150 and the electron injection layer 180 is disposed directly on the first electron transport layer 161.

Figure 2:
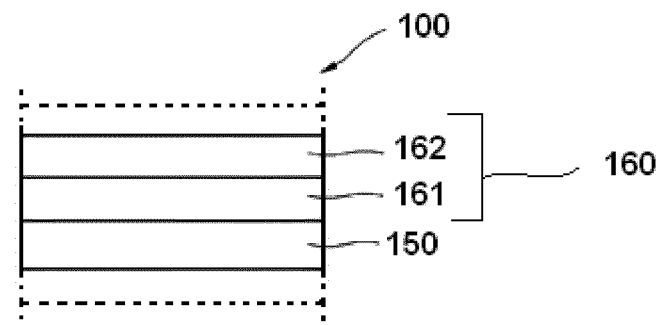
FIG. 2 is a schematic sectional view of an organic light-emitting diode (OLED), according to an exemplary embodiment of the present invention with an emission layer and two electron transport layers.

FIG. 2 is a schematic sectional view of an organic light-emitting diode 100, according to an exemplary embodiment of the present invention. The OLED 100 comprises an emission layer 150 and an electron transport layer stack (ETL) 160 comprising a first electron transport layer 161 and a second electron transport layer 162, whereby the second electron transport layer 162 is disposed directly on the first electron transport layer 161.

Figure 3:
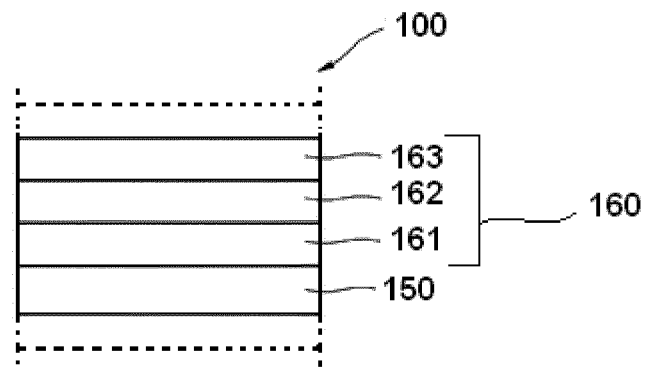
FIG. 3 is a schematic sectional view of an OLED, according to an exemplary embodiment of the present invention with an emission layer and three electron transport layers.

FIG. 3 is a schematic sectional view of an organic light-emitting diode 100, according to an exemplary embodiment of the present invention. The OLED 100 comprises an emission layer 150 and an electron transport layer stack (ETL) 160 comprising a first electron transport layer 161, a second electron transport layer 162, and a third electron transport layer 163, whereby the second electron transport layer 162 is disposed directly on the first electron transport layer 161 and the third electron transport layer 163 is disposed directly on the first electron transport layer 162.

Figure 4:
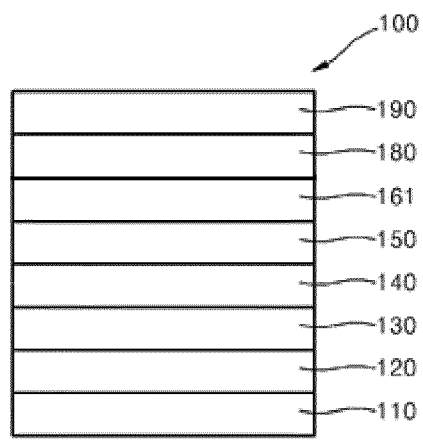
FIG. 4 is a schematic sectional view of an organic light-emitting diode (OLED), according to an exemplary embodiment of the present invention with an emission layer and one electron transport layer.

FIG. 4 is a schematic sectional view of an organic light-emitting diode 100, according to an exemplary embodiment of the present invention. The OLED 100 comprises a substrate 110, a first anode electrode 120, a hole injection layer (HIL) 130, a hole transport layer (HTL) 140, an emission layer (EML) 150, one first electron transport layer (ETL) 161, an electron injection layer (EIL) 180, and a cathode electrode 190. The first electron transport layer (ETL) 161 comprises a compound of formula 1 and optionally an alkali halide or alkali organic complex. The electron transport layer (ETL) 161 is formed directly on the EML 150.

Figure 5:
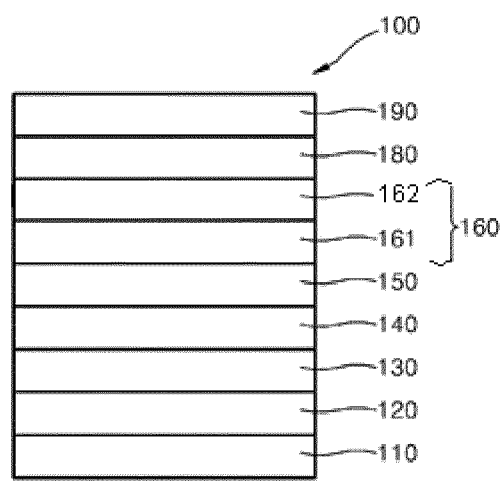
FIG. 5 is a schematic sectional view of an organic light-emitting diode (OLED), according to an exemplary embodiment of the present invention with an emission layer and two electron transport layers.

FIG. 5 is a schematic sectional view of an organic light-emitting diode 100, according to an exemplary embodiment of the present invention. The OLED 100 comprises a substrate 110, a first anode electrode 120, a hole injection layer (HIL) 130, a hole transport layer (HTL) 140, an emission layer (EML) 150, an electron transport layer stack (ETL) 160, an electron injection layer (EIL) 180, and a cathode electrode 190. The electron transport layer (ETL) 160 comprises a first electron transport layer 161 and a second electron transport layer 162, wherein the first electron transport layer is arranged near to the anode (120) and the second electron transport layer is arranged near to the cathode (190). The first and/or the second electron transport layer comprise a compound of formula 1 and optionally an alkali halide or alkali organic complex.

Figure 6:
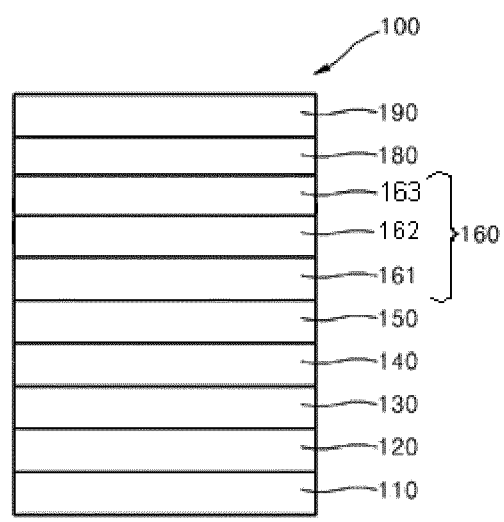
FIG. 6 is a schematic sectional view of an OLED, according to an exemplary embodiment of the present invention with an emission layer and three electron transport layers.

FIG. 6 is a schematic sectional view of an organic light-emitting diode 100, according to an exemplary embodiment of the present invention. The OLED 100 comprises a substrate 110, a first anode electrode 120, a hole injection layer (HIL) 130, a hole transport layer (HTL) 140, an emission layer (EML) 150, an electron transport layer stack (ETL) 160, an electron injection layer (EIL) 180, and a second cathode electrode 190. The electron transport layer stack (ETL) 160 comprises a first electron transport layer 161, a second electron transport layer 162 and a third electron transport layer 163. The first electron transport layer 161 is formed directly on the emission layer (EML) 150. The first, second and/or third electron transport layer comprise a compound of formula 1 and optionally an alkali halide or alkali organic complex.

A substrate may be further disposed under the anode 120 or on the cathode 190. The substrate may be a substrate that is used in a general organic light emitting diode and may be a glass substrate or a transparent plastic substrate with strong mechanical strength, thermal stability, transparency, surface smoothness, ease of handling, and water resistance.

The hole injection layer 130 may improve interface properties between ITO as an anode and an organic material used for the hole transport layer 140, and may be applied on a non-planarized ITO and thus may planarize the surface of the ITO. For example, the hole injection layer 130 may include a material having particularly desirable conductivity between a work function of ITO and HOMO of the hole transport layer 140, in order to adjust a difference a work function of ITO as an anode and HOMO of the hole transport layer 140.

When the hole transport region comprises a hole injection layer 130, the hole injection layer may be formed on the anode 120 by any of a variety of methods, for example, vacuum deposition, spin coating, casting, Langmuir-Blodgett (LB) method, or the like.

When hole injection layer is formed using vacuum deposition, vacuum deposition conditions may vary depending on the material that is used to form the hole injection layer, and the desired structure and thermal properties of the hole injection layer to be formed and for example, vacuum deposition may be performed at a temperature of about 100° C. to about 500° C., a pressure of about $10^{-8}$ torr to about $10^{-3}$ torr, and a deposition rate of about 0.01 to about 100 Å/sec, but the deposition conditions are not limited thereto.

When the hole injection layer is formed using spin coating, the coating conditions may vary depending on the material that is used to form the hole injection layer, and the desired structure and thermal properties of the hole injection layer to be formed. For example, the coating rate may be in the range of about 2000 rpm to about 5000 rpm, and a temperature at which heat treatment is performed to remove a solvent after coating may be in a range of about 80° C. to about 200° C., but the coating conditions are not limited thereto.

Conditions for forming the hole transport layer and the electron blocking layer may be defined based on the above-described formation conditions for the hole injection layer.

A thickness of the hole transport region may be from about 100 Å to about 10000 Å, for example, about 100 Å to about 1000 Å. When the hole transport region comprises the hole injection layer and the hole transport layer, a thickness of the hole injection layer may be from about 100 Å to about 10,000 Å, for example about 100 Å to about 1000 Å and a thickness of the hole transport layer may be from about 50 Å to about 2,000 Å, for example about 100 Å to about 1500 Å. When the thicknesses of the hole transport region, the HIL, and the HTL are within these ranges, satisfactory hole transport characteristics may be obtained without a substantial increase in operating voltage.

A thickness of the emission layer may be about 100 Å to about 1000 Å, for example about 200 Å to about 600 Å. When the thickness of the emission layer is within these ranges, the emission layer may have improved emission characteristics without a substantial increase in a operating voltage.

Next, an electron transport region is disposed on the emission layer.

The electron transport region may include at least one of a second electron transport layer, a first electron transport layer, and an electron injection layer.

The thickness of the electron transport layer may be from about 20 Å to about 1000 Å, for example about 30 Å to about 300 Å. When the thickness of the electron transport layer is within these ranges, the electron transport layer may have improved electron transport auxiliary ability without a substantial increase in operating voltage.

A thickness of the electron transport layer may be about 100 Å to about 1000 Å, for example about 150 Å to about 500 Å. When the thickness of the electron transport layer is within these ranges, the electron transport layer may have satisfactory electron transporting ability without a substantial increase in operating voltage.

In addition, the electron transport region may include an electron injection layer (EIL) that may facilitate injection of electrons from the anode.

The electron injection layer is disposed on an electron transport layer and may play a role of facilitating an electron injection from a cathode and ultimately improving power efficiency and be formed by using any material used in a related art without a particular limit, for example, LiF, Liq, NaCl, CsF, Li$_2$O, BaO, Yb and the like.

The electron injection layer may include at least one selected from LiF, NaCl, CsF, Li$_2$O, and BaO.

A thickness of the EIL may be from about 1 Å to about 100 Å, or about 3 Å to about 90 Å. When the thickness of the electron injection layer is within these ranges, the electron injection layer may have satisfactory electron injection ability without a substantial increase in operating voltage.

The anode can be disposed on the organic layer. A material for the anode may be a metal, an alloy, or an electrically conductive compound that have a low work function, or a combination thereof. Specific examples of the material for the anode 150 may be lithium (Li, magnesium (Mg), aluminum (Al), aluminum-lithium (Al-LI, calcium (Ca), magnesium-indium (Mg—In), magnesium-silver (Mg—Ag), etc. In order to manufacture a top-emission light-emitting device, the anode 150 may be formed as a light-transmissive electrode from, for example, indium tin oxide ITO) or indium zinc oxide IZO).

According to another aspect of the invention, a method of manufacturing an organic electroluminescent device is provided, wherein
on an anode electrode (120) the other layers of hole injection layer (130), hole transport layer (140), optional an electron blocking layer, an emission layer (130), first electron transport layer (161), second electron transport layer (162), electron injection layer (180), and a cathode (190), are deposited in that order; or
the layers are deposited the other way around, starting with the cathode (190).

Hereinafter, the embodiments are illustrated in more detail with reference to examples. However, the present disclosure is not limited to the following examples.

Preparation of Compounds of Formula 1

Compounds of formula 1 may be prepared according to Route A, B, C and/or D.

Route A

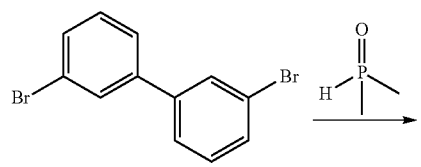

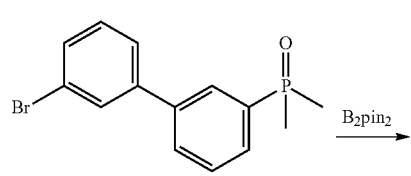

-continued

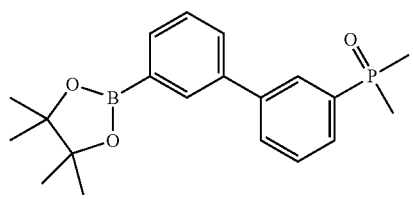

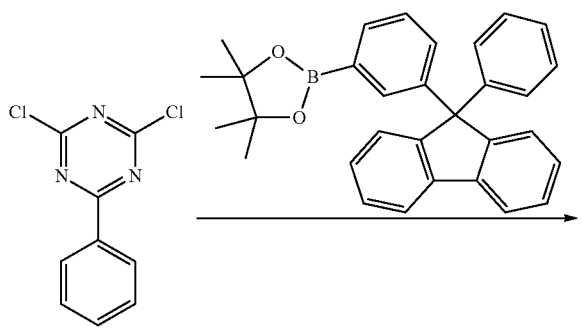

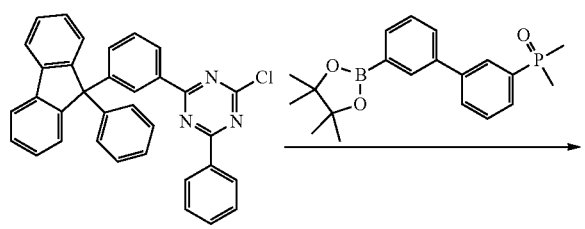

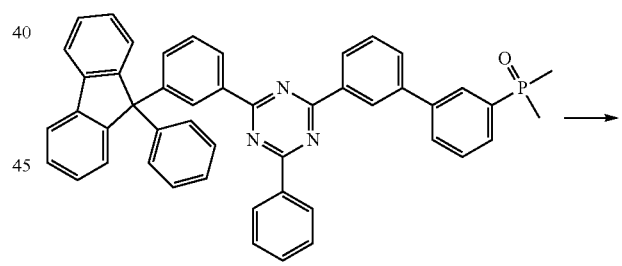

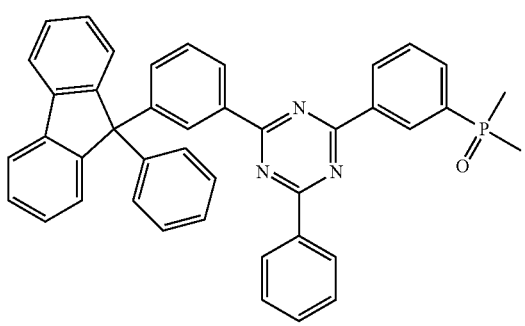

Route B
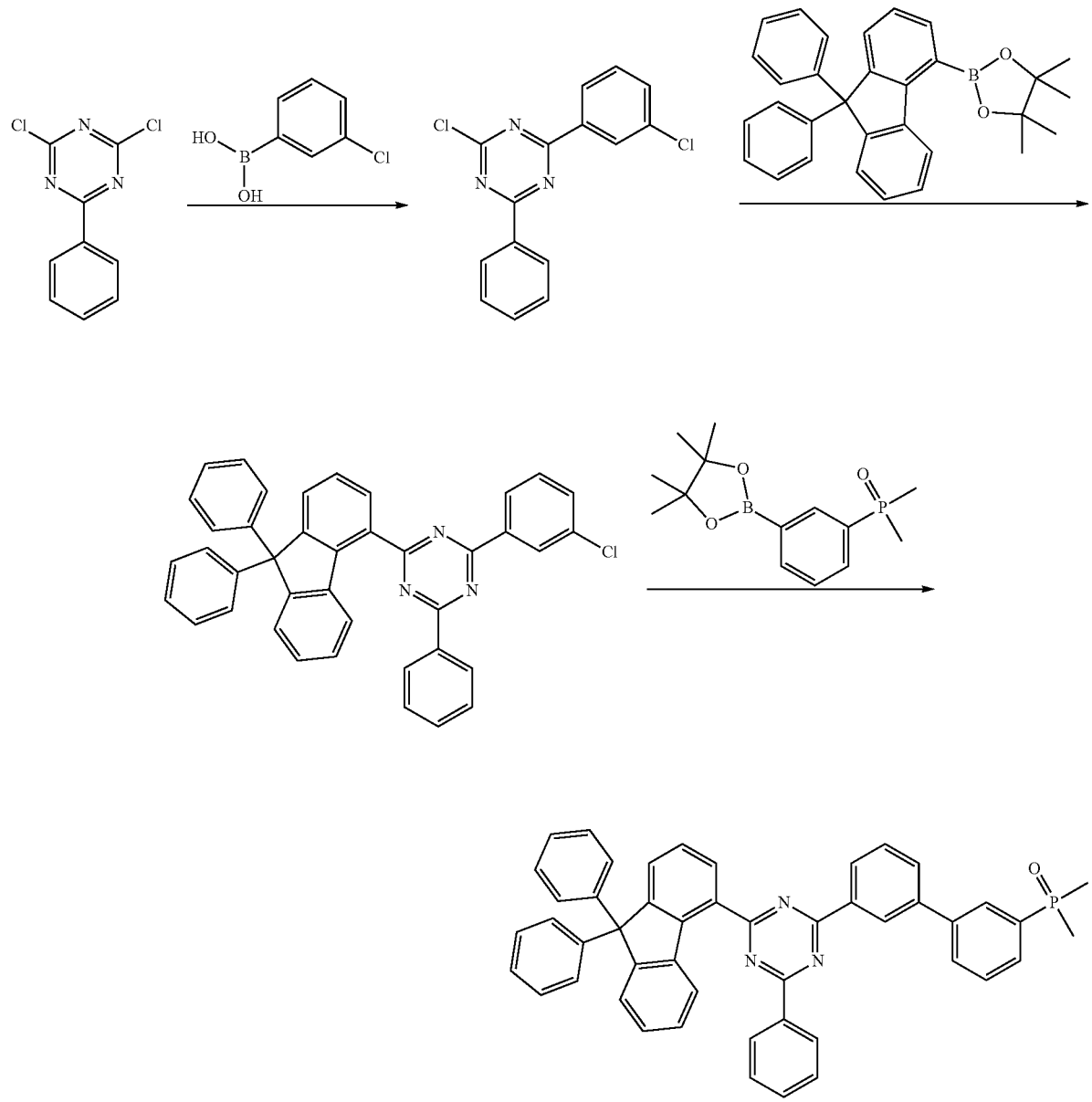
Route C
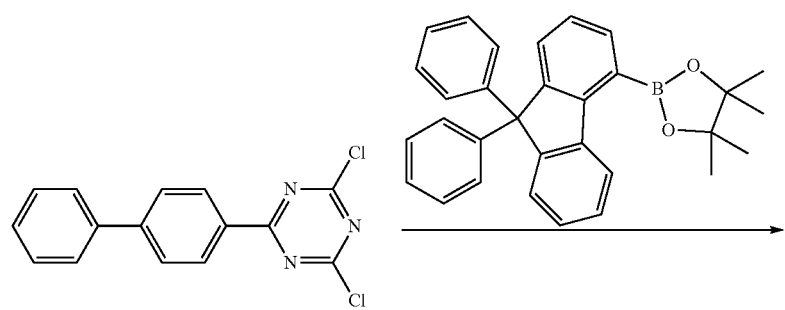

-continued
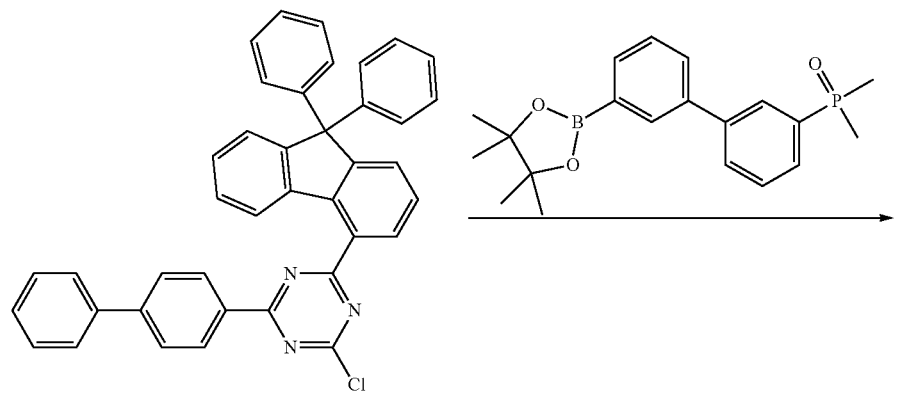
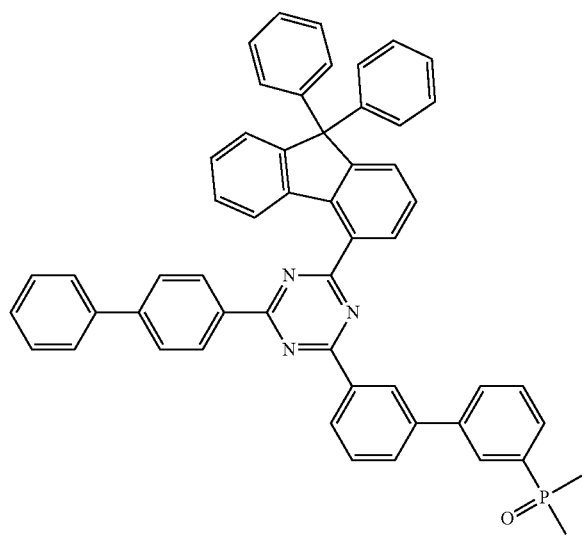
Route D
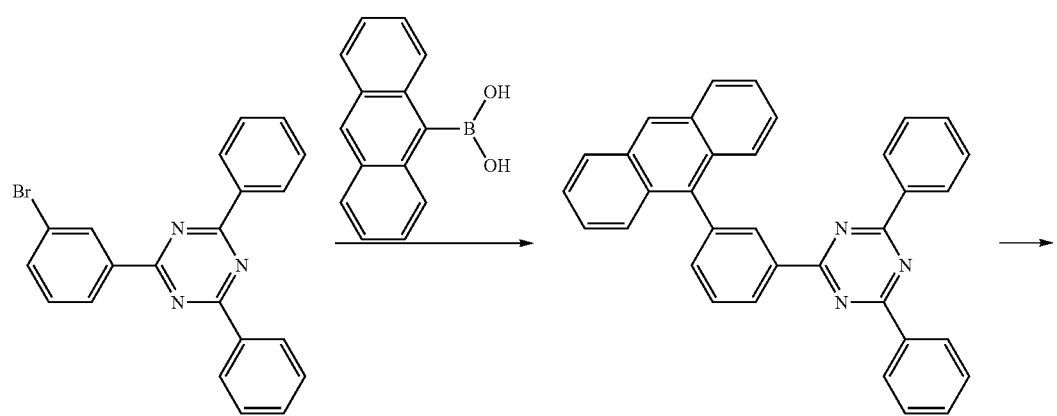

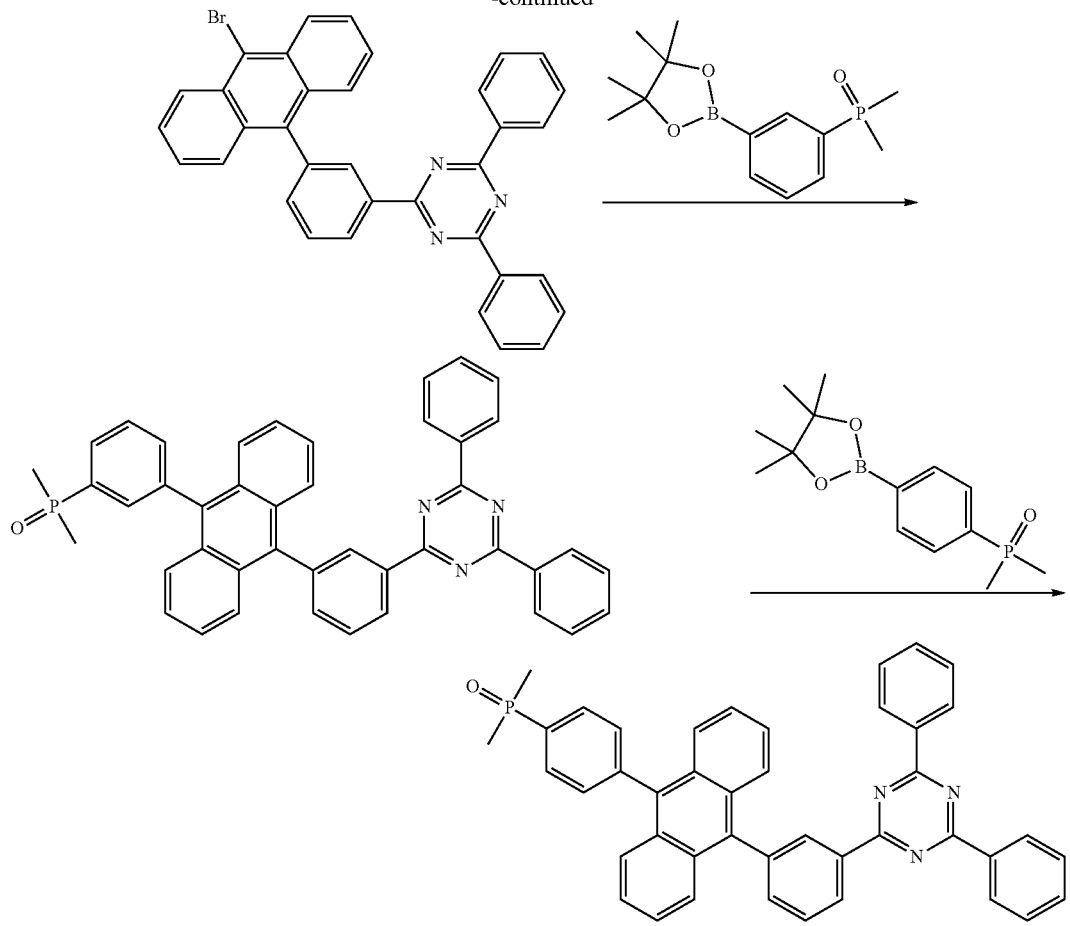

(3'-bromo-[1,1'-biphenyl]-3-yl)dimethylphosphine Oxide

Dimethyl(3'-(4,4,5,5-tetramethyl-1,3,2-dioxaborolan-2-yl)-[1,1'-biphenyl]-3-yl)phosphine Oxide

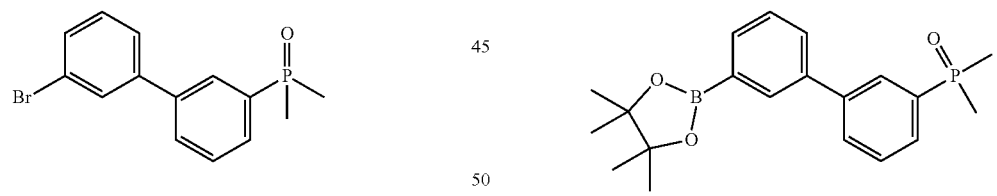

A flask was flushed with nitrogen and charged with 3,3'-dibromo-1,1'-biphenyl (50 g, 160 mmol), dimethylphosphine oxide (12.51 g, 160 mmol), Pd$_2$(dba)$_3$ (2.93 g, 3.21 mmol), and xantphos (5.56 g, 9.62 mmol). A mixture of deaerated dioxane/THF (2:1, 480 mL) and trimethylamine (26 mL) were added and the reaction mixture was heated to reflux under a nitrogen atmosphere for 20 h. Subsequently, all volatiles have been removed in vacuo, the residue was dissolved in dichloromethane and washed with water three times. The organic phase was extracted with an aqueous sodium diethylcarbamodithioate solution three times and again with water two times. After drying over MgSO$_4$, the organic phase was concentrated and the product was isolated by column chromatography (silica, dichloromethane to dichloromethane/methanol 99:1) to yield 18.5 g (37%) product. m/z=309 ([M]$^+$).

A flask was flushed with nitrogen and charged with (3'-bromo-[1,1'-biphenyl]-3-yl)dimethylphosphine oxide (18.45 g, 59.7 mmol), 4,4,4',4',5,5,5',5'-octamethyl-2,2'-bi(1,3,2-dioxaborolane) (16.67 g, 65.6 mmol), Pd(dppf)Cl$_2$ (0.87 g, 1.2 mmol), and potassium acetate (17.6 g, 179 mmol). Dry and deaerated DMF (185 mL) was added and the reaction mixture was heated to 80° C. under a nitrogen atmosphere for 20 h. Subsequently, all volatiles have been removed in vacuo, the residue was suspended in dichloromethane and washed with water three times. After drying over MgSO$_4$, the organic phase was concentrated and filtered over a pad of Florisil. After rinsing with dichloromethane followed by dichloromethane/methanol 96:4, the filtrate was evaporated to dryness. The residue was triturated with MTBE and the resulting precipitate was collected by suction filtration and washed with additional MTBE to yield 13.6 g (64%) product. m/z=356 ([M]⁺).

2-chloro-4-phenyl-6-(3-(9-phenyl-9H-fluoren-9-yl)phenyl)-1,3,5-triazine

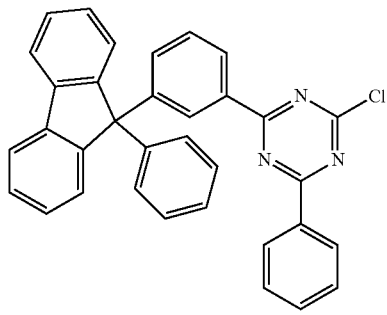 [SMILES: Clc1nc(-c2ccccc2)nc(-c2cccc(C3(c4ccccc4)c4ccccc4-c4ccccc43)c2)n1]

A flask was flushed with nitrogen and charged with 2,4-dichloro-6-phenyl-1,3,5-triazine (18.0 g, 79.4 mmol), 4,4,5,5-tetramethyl-2-(3-(9-phenyl-9H-fluoren-9-yl)phenyl)-1,3,2-dioxaborolane (30 g, 67.5 mol), Pd(PPh₃)₄ (4.6 g, 3.98 mmol), and K₂CO₃ (27.5 g, 199 mmol). A mixture of deaerated toluene/THF/water (1:1:1, 660 mL) was added and the reaction mixture was heated to 65° C. under a nitrogen atmosphere for 6 h. Subsequently, all volatiles have been removed in vacuo, the residue was suspended in dichloromethane and washed with water three times. After drying over MgSO₄, the organic phase was concentrated to a minimal amount and precipitation was induced by addition of acetonitrile. The precipitate was collected by suction filtration and washed with additional acetonitrile. Further purification was achieved by trituration with hot ethyl acetate. After suction filtration at room temperature and washing with additional ethyl acetate, 10 g (30%) product, m/z=508 ([M]⁺).

2-([1,1'-biphenyl]-4-yl)-4-chloro-6-(9,9-diphenyl-9H-fluoren-4-yl)-1,3,5-triazine

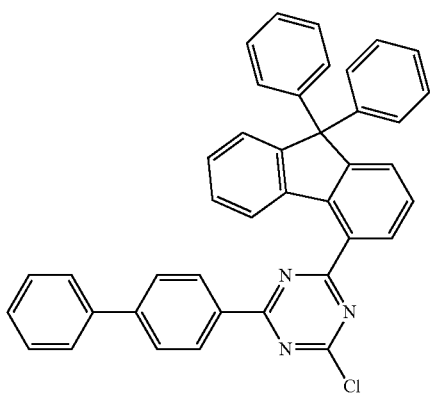 [SMILES: Clc1nc(-c2ccc(-c3ccccc3)cc2)nc(-c2cccc3c2-c2ccccc2C3(c2ccccc2)c2ccccc2)n1]

Following the procedure described above using 2-([1,1'-biphenyl]-4-yl)-4,6-dichloro-1,3,5-triazine (25.5 g, 84.4 mmol), 2-(9,9-diphenyl-9H-fluoren-4-yl)-4,4,5,5-tetramethyl-1,3,2-dioxaborolane (30 g, 67.5 mmol), Pd(dppf)Cl₂ (3.09 g, 4.2 mmol), K₂CO₃ (29.1 g, 211 mmol), toluene/THF/water (1:1:1, 700 mL), and 3 h reaction time, 17.4 g (35%) product.

2-chloro-4-(3-chlorophenyl)-6-phenyl-1,3,5-triazine

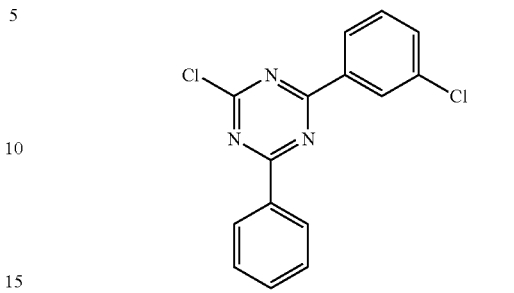

Following the procedure described above using 2,4-dichloro-6-phenyl-1,3,5-triazine (35 g, 155 mmol), (3-chlorophenyl)boronic acid (19.4 g, 123.9 mmol), Pd(PPh₃)₄ (8.94 g, 7.7 mmol), K₂CO₃ (53.5 g, 387 mmol), toluene/THF/water (1:1:1, 1300 mL), and 3 h reaction time, 10.5 g (28%) product.

dimethyl(3'-(4-phenyl-6-(3-(9-phenyl-9H-fluoren-9-yl)phenyl)-1,3,5-triazin-2-yl)-[1,1'-biphenyl]-3-yl) phosphine Oxide

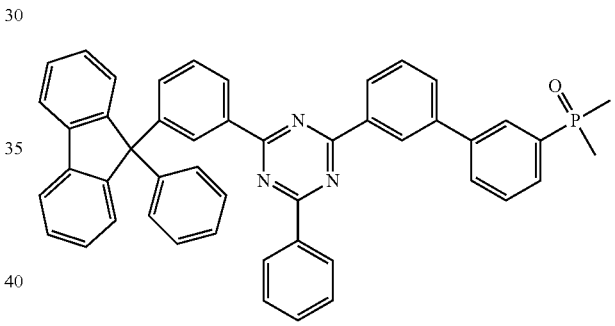

A flask was flushed with nitrogen and charged with 2-chloro-4-phenyl-6-(3-(9-phenyl-9H-fluoren-9-yl)phenyl)-1,3,5-triazine (5.43 g, 10.7 mmol), dimethyl(3'-(4,4,5,5-tetramethyl-1,3,2-dioxaborolan-2-yl)-[1,1'-biphenyl]-3-yl) phosphine oxide (4.0 g, 11.2 mmol), Pd(PPh₃)₄ (0.25 g, 0.21 mmol), and K₂CO₃ (2.95 g, 21.4 mmol). A mixture of deaerated THF/water (2:1, 53 mL) was added and the reaction mixture was heated to reflux under a nitrogen atmosphere for 18 h. After cooling down to room temperature, dichloromethane was added, the aqueous phase was removed and the organic phase was washed with water three times. Subsequently, the organic phase was extracted with an aqueous sodium diethylcarbamodithioate solution three times and again with water two times. After drying over MgSO₄, the organic phase was concentrated to a minimal amount and precipitation was induced by addition of cyclohexane. The precipitate was collected by suction filtration and washed with additional cyclohexane. Further purification was achieved by column chromatography (silica, dichloromethane to dichloromethane/methanol 98:2) to yield 5.6 g (75%) product. m/z=724 ([M+Na]⁺).

Dimethyl(3-(4-phenyl-6-(3-(9-phenyl-9H-fluoren-9-yl)phenyl)-1,3,5-triazin-2-yl)phenyl)phosphine Oxide

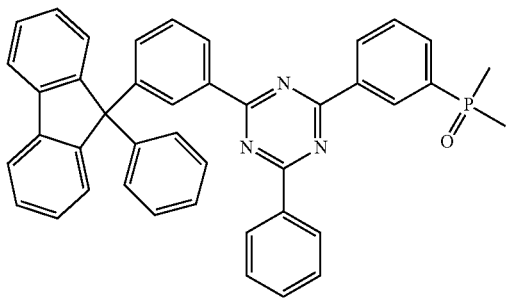 [SMILES: CP(C)(=O)c1cccc(-c2nc(-c3ccccc3)nc(-c3cccc(C4(c5ccccc5)c5ccccc5-c5ccccc54)c3)n2)c1]

Following the procedure described above using 2-chloro-4-phenyl-6-(3-(9-phenyl-9H-fluoren-9-yl)phenyl)-1,3,5-triazine (4.3 g, 8.5 mmol), dimethyl(3-(4,4,5,5-tetramethyl-1,3,2-dioxaborolan-2-yl)phenyl)phosphine oxide (2.5 g, 8.9 mmol), Pd(dppf)Cl$_2$ (0.12 g, 0.17 mmol), K$_2$CO$_3$ (2.34 g, 16.9 mmol), and THF/water (2:1, 42 mL), 4.95 g (93%) product. m/z=648 ([M+Na]$^+$).

(3'-(4-([1,1'-biphenyl]-4-yl)-6-(9,9-diphenyl-9H-fluoren-4-yl)-1,3,5-triazin-2-yl)-[1,1'-biphenyl]-3-yl)dimethylphosphine Oxide

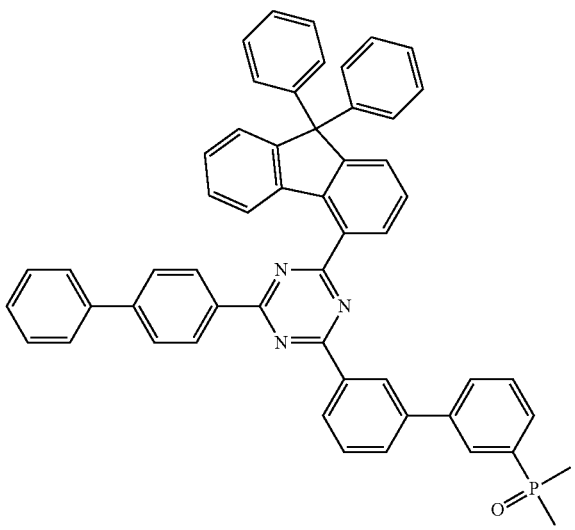 [SMILES: CP(C)(=O)c1cccc(-c2cccc(-c3nc(-c4ccc(-c5ccccc5)cc4)nc(-c4cccc5c4-c4ccccc4C5(c4ccccc4)c4ccccc4)n3)c2)c1]

Following the procedure described above using 2-([1,1'-biphenyl]-4-yl)-4-chloro-6-(9,9-diphenyl-9H-fluoren-4-yl)-1,3,5-triazine (5.73 g, 9.8 mmol), dimethyl(3'-(4,4,5,5-tetramethyl-1,3,2-dioxaborolan-2-yl)-[1,1'-biphenyl]-3-yl)phosphine oxide (3.67 g, 10.3 mmol), Pd(PPh$_3$)$_4$(0.23 g, 0.2 mmol), K$_2$CO$_3$ (2.71 g, 19.6 mmol), and THF/water (2:1, 63 mL), 5.6 g (73%) product. m/z=800 ([M+Na]$^+$).

2-(3-chlorophenyl)-4-(9,9-diphenyl-9H-fluoren-4-yl)-6-phenyl-1,3,5-triazine

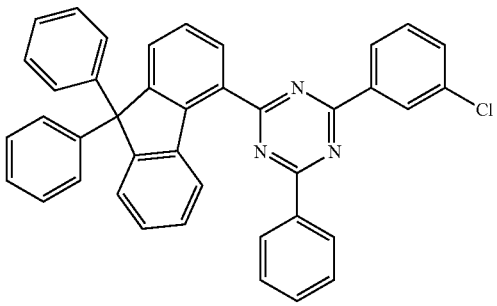 [SMILES: Clc1cccc(-c2nc(-c3ccccc3)nc(-c3cccc4c3-c3ccccc3C4(c3ccccc3)c3ccccc3)n2)c1]

Following the procedure described above using 2-chloro-4-(3-chlorophenyl)-6-phenyl-1,3,5-triazine (5.05 g, 16.7 mmol), 2-(9,9-diphenyl-9H-fluoren-4-yl)-4,4,5,5-tetramethyl-1,3,2-dioxaborolane (7.8 g, 17.6 mmol), Pd(PPh$_3$)$_4$ (0.39 g, 0.33 mmol), K$_2$CO$_3$ (4.6 g, 33.4 mmol), and THF/water (2:1, 84 mL), 8.2 g (84%) product.

4-yl)-6-phenyl-1,3,5-triazin-2-yl)-[1,1'-biphenyl]-3-yl)dimethylphosphine Oxide A flask was flushed with nitrogen and charged with 2-(3-chlorophenyl)-4-(9,9-diphenyl-9H-fluoren-4-yl)-6-phenyl-1,3,5-triazine (4 g, 6.9 mmol), dimethyl(3-(4,4,5,5-tetramethyl-1,3,2-dioxaborolan-2-yl)phenyl)phosphine oxide (2.88 g, 10.3 mmol), chloro(crotyl)(2-dicyclohexylphosphino-2',6'-dimethoxybiphenyl)palladium(II) (0.083 g, 0.13 mmol), and K$_3$PO$_4$ (2.9 g, 13.7 mmol). A mixture of deaerated THF/water (4:1, 50 mL) was added and the reaction mixture was heated to 45° C. under a nitrogen atmosphere for 2 h. After cooling down to room temperature, dichloromethane was added, the aqueous phase was removed and the organic phase was washed with water three times. Subsequently, the organic phase was extracted with an aqueous sodium diethylcarbamodithioate solution three times and again with water two times. After drying over MgSO$_4$, the organic phase was evaporated to dryness. Purification of the crude product was achieved by column chromatography (silica, dichloromethane to dichloromethane/methanol 99:1) followed by precipitation from a concentrated dichloromethane solution by addition of methanol to yield 4.0 g (83%) product, m/z=724 ([M+Na]$^+$).

2-(3-(anthracen-9-yl)phenyl)-4,6-diphenyl-1,3,5-triazine

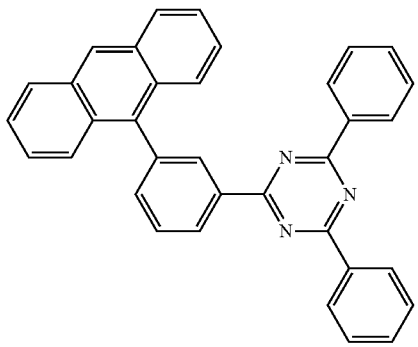 [SMILES: c1ccc(-c2nc(-c3ccccc3)nc(-c3cccc(-c4c5ccccc5cc5ccccc45)c3)n2)cc1]

A flask was flushed with nitrogen and charged with 2-(3-bromophenyl)-4,6-diphenyl-1,3,5-triazine (50 g, 129 mmol), anthracen-9-ylboronic acid (31.5 g, 142 mmol), Pd(dppf)Cl$_2$ (0.47 g, 0.64 mmol), and K$_2$CO$_3$ (35.6 g, 258 mmol). A mixture of deaerated toluene/ethanol (3:1, 670 mL) and deaerated water (130 mL) was added and the reaction mixture was heated to reflux under a nitrogen atmosphere for 18 h. After cooling down to room temperature, the precipitate was collected by suction filtration and washed with toluene, ethanol, and, subsequently, with water until the aqueous phase was pH neutral. After washing with methanol and drying, 56.4 g (90%) product were obtained.

2-(3-(10-bromoanthracen-9-yl)phenyl)-4,6-diphenyl-1,3,5-triazine

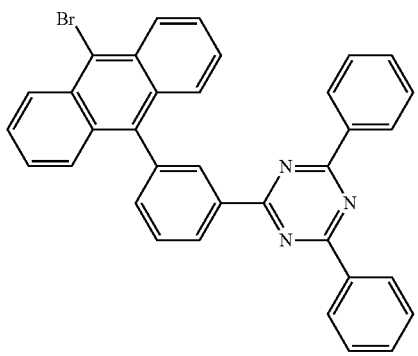 [SMILES: Brc1c2ccccc2c(-c2cccc(-c3nc(-c4ccccc4)nc(-c4ccccc4)n3)c2)c2ccccc12]

A flask was charged with 2-(3-(anthracen-9-yl)phenyl)-4,6-diphenyl-1,3,5-triazine (55 g, 113 mmol), NBS (24.2 g, 136 mmol), and chloroform (770 mL). The mixture was heated to 60° C. for 48 h. After cooling down to room temperature, the reaction mixture was extracted with water and dried over MgSO$_4$. The organic phase was concentrated and n-hexane was added. The resulting precipitate was collected by suction filtration, washed with additional n-hexane and dried. 60.4 g (94.5%) product.

(3-(10-(3-(4,6-diphenyl-1,3,5-triazin-2-yl)phenyl)anthracen-9-yl)phenyl)dimethylphosphine Oxide

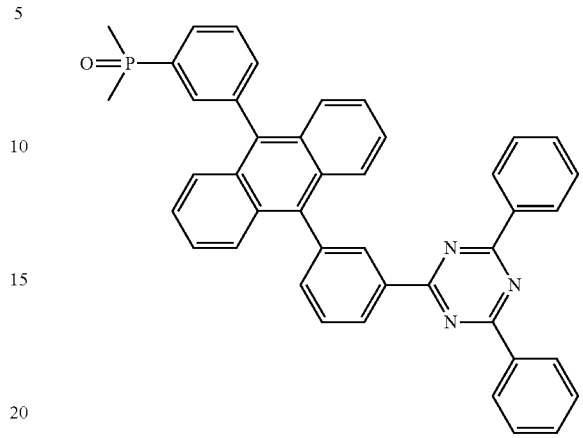

A flask was flushed with nitrogen and charged with 2-(3-(10-bromoanthracen-9-yl)phenyl)-4,6-diphenyl-1,3,5-triazine (15 g, 26.6 mmol), dimethyl(3-(4,4,5,5-tetramethyl-1,3,2-dioxaborolan-2-yl)phenyl)phosphine oxide (8.2 g, 29.2 mmol), Pd(dppf)Cl$_2$ (0.1 g, 0.13 mmol), and K$_2$CO$_3$ (7.3 g, 53 mmol). A mixture of deaerated toluene/ethanol (3:1, 300 mL) and deaerated water (30 mL) was added and the reaction mixture was heated to reflux under a nitrogen atmosphere for 18 h. All volatiles were removed in vacuo and the residue was dissolved in dichloromethane/water. The organic phase was additionally washed with water three times and then filtered over a pad of Florisil. The filtrate was concentrated and n-hexane was added. The resulting precipitate was purified by gel filtration (silica, chloroform to chloroform/methanol 97:3) to obtain 7.31 g (41%) product, m/z=660 ([M+Na]$^+$).

(4-(10-(3-(4,6-diphenyl-1,3,5-triazin-2-yl)phenyl)anthracen-9-yl)phenyl)dimethylphosphine Oxide

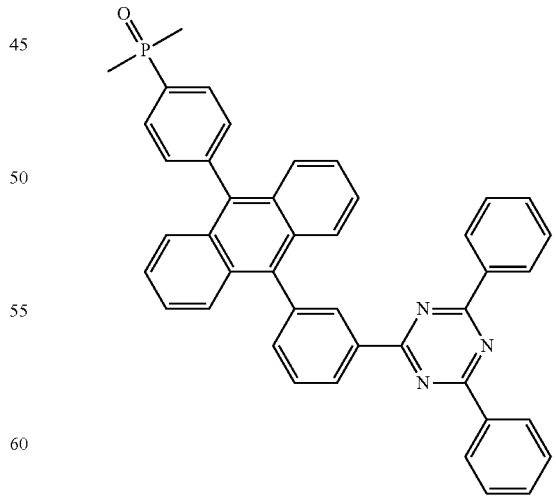

Following the procedure described above using dimethyl (4-(4,4,5,5-tetramethyl-1,3,2-dioxaborolan-2-yl)phenyl)phosphine oxide, 6.80 g (41%) product, m/z=660 ([M+Na]$^+$).

General Procedure for Fabrication of Organic Electronic Devices

Electron-only devices and OLEDs were prepared to demonstrate the technical benefit utilizing the compounds of formula 1 in an organic electronic device.

Electron-Only Devices

For electron-only devices (EOD), see Table 1 and 2, a glass substrate was cut to a size of 50 mm×50 mm×0.7 mm, ultrasonically cleaned with isopropyl alcohol for 5 minutes and then with pure water for 5 minutes, and cleaned again with UV ozone for 30 minutes. 100 nm Ag were deposited as anode on the glass at a pressure of $10^{-5}$ to $10^{-7}$ mbar.

Then, MgAg alloy (90:10 vol.-%) was deposited on the anode electrode to form a layer with a thickness of 30 nm.

Then, LiQ was deposited on the MgAg layer to form a layer with a thickness of 1 nm.

Then, an organic semiconductor layer was deposited on the LiQ layer to form an organic semiconductor layer with a thickness of 36 nm.

In examples 1 to 6 (Table 1), the organic semiconductor layer consisted of compound of formula 1. In comparative example 1, MX1 [(3'-(4,6-diphenyl-1,3,5-triazin-2-yl)-[1,1'-biphenyl]-3-yl)diphenylphosphine oxide] was used instead, see Table 1.

In example 7 (Table 2), the organic semiconductor layer comprised 70 vol.-% compound of formula 1 and 30 vol.-% alkali organic complex. In comparative example 1, MX1 was used in place of compound of formula 1, see Table 2.

Then, LiQ was deposited to form a layer with a thickness of 1 nm.

Then, MgAg alloy (90:10 vol.-%) was deposited on the LiQ layer to form a cathode electrode with a thickness of 30 nm.

Bottom Emission Devices with an Evaporated Emission Layer

For bottom emission devices—Example 8 and comparative example 3, a 15 Ω/cm² glass substrate with 90 nm ITO (available from Corning Co.) was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

Then, 97 vol.-% of Biphenyl-4-yl(9,9-diphenyl-9H-fluoren-2-yl)-[4-(9-phenyl-9H-carbazol-3-yl)phenyl]-amine (CAS 1242056-42-3) and 3 vol.-% of 2,2',2''-(cyclopropane-1,2,3-triylidene)tris(2-(p-cyanotetrafluorophenyl)acetonitrile) was vacuum deposited on the ITO electrode, to form a HIL having a thickness of 10 nm. Then Biphenyl-4-yl(9,9-diphenyl-9H-fluoren-2-yl)-[4-(9-phenyl-9H-carbazol-3-yl)phenyl]-amine was vacuum deposited on the HIL, to form a HTL having a thickness of 120 nm. 97 vol.-% of 2-(10-phenyl-9-anthracenyl)-benzo[b]naphtho[2,3-d]furan (CAS 1627916-48-6) as a host and 3 vol.-% of NUBD370 (Sun Fine Chemicals) as a dopant were deposited on the HTL, to form a blue-emitting EML with a thickness of 20 nm.

Then, the organic semiconductor layer is formed by deposing a matrix compound and an alkali organic complex according to example 8 and comparative example 3 by deposing the compound of formula 1 from a first deposition source and the alkali organic complex from a second deposition source directly on the EML. The composition of the organic semiconductor layer can be seen in Table 3. In example 8 the matrix compound is a compound of formula 1. The thickness of the organic semiconductor layer is 36 nm.

Then, the cathode electrode layer is formed by evaporating aluminum at ultra-high vacuum of $10^{-7}$ bar and deposing the cathode layer directly on the organic semiconductor layer. A thermal single co-evaporation or sputtering process of one or several metals is performed with a rate of 0, 1 to 10 nm/s (0.01 to 1 Å/s) in order to generate a homogeneous cathode electrode with a thickness of 5 to 1000 nm. The thickness of the cathode electrode layer is 100 nm.

Bottom Emission Devices with a Solution-Processed Emission Layer

For bottom emission devices, a 15 Ω/cm² glass substrate with 90 nm ITO (available from Corning Co.) was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

Then, PEDOT:PSS (Clevios P VP AI 4083) is spin-coated directly on top of the first electrode to form a 55 nm thick HIL. The HIL is baked on hotplate at 150° C. for 5 min. Then, a light-emitting polymer, for example MEH-PPV, is spin-coated directly on top of the HIL to form a 40 nm thick EML. The EML is baked on a hotplate at 80° C. for 10 min. The device is transferred to an evaporation chamber and the following layers are deposited in high vacuum.

The compound of formula 1 and an alkali organic complex are deposed directly on top of the EML to form the organic semiconductor layer with a thickness of 4 nm. A cathode electrode layer is formed by deposing a 100 nm thick layer of aluminum directly on top of the organic semiconductor layer.

Pn Junction Device as Model for an OLED Comprising at Least Two Emission Layers

The fabrication of OLEDs comprising at least two emission layers is time-consuming and expensive. Therefore, the effectiveness of the organic semiconductor layer of the present invention in a pn junction was tested without emission layers. In this arrangement, the organic semiconductor layer functions as n-type charge generation layer (CGL) and is arranged between the anode electrode and the cathode electrode and is in direct contact with the p-type CGL.

For pn junction devices, a 15 Ω/cm² glass substrate with 90 nm ITO (available from Corning Co.) was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

Then, 97 vol.-% of Biphenyl-4-yl(9,9-diphenyl-9H-fluoren-2-yl)-[4-(9-phenyl-9H-carbazol-3-yl)phenyl]-amine (CAS 1242056-42-3) and 3 vol.-% of 2,2',2''-(cyclopropane-1,2,3-triylidene)tris(2-(p-cyanotetrafluorophenyl)acetonitrile) was vacuum deposited on the ITO electrode, to form a HIL having a thickness of 10 nm. Then 2,4-diphenyl-6-(3'-(triphenylen-2-yl)-[1,1'-biphenyl]-3-yl)-1,3,5-triazine (CAS 1638271-85-8) was vacuum deposited on the HIL, to form an electron blocking layer (EBL) having a thickness of 130 nm.

Then, the organic semiconductor layer is formed by deposing a matrix compound and metal organic complex by deposing the matrix compound from a first deposition source and rare earth metal dopant from a second deposition source directly on the EBL.

Then, the p-type CGL is formed by deposing the host and p-type dopant directly onto the organic semiconductor layer. 97 vol.-% of Biphenyl-4-yl(9,9-diphenyl-9H-fluoren-2-yl)-[4-(9-phenyl-9H-carbazol-3-yl)phenyl]-amine, referred to as HT-1, and 3 vol.-% of 2,2',2"-(cyclopropane-1,2,3-triylidene)tris(2-(p-cyanotetrafluorophenyl)acetonitrile), referred to as Dopant 1, was vacuum deposited to form a p-type CGL having a thickness of 10 nm.

Then, a layer of 30 nm Biphenyl-4-yl(9,9-diphenyl-9H-fluoren-2-yl)-[4-(9-phenyl-9H-carbazol-3-yl)phenyl]-amine is deposed directly on the p-type CGL to form a hole blocking layer (HBL).

Then, the cathode electrode layer is formed by evaporating aluminum at ultra-high vacuum of $10^{-7}$ bar and deposing the aluminum layer directly on the organic semiconductor layer. A thermal single co-evaporation of one or several metals is performed with a rate of 0, 1 to 10 nm/s (0.01 to 1 Å/s) in order to generate a homogeneous cathode electrode with a thickness of 5 to 1000 nm. The thickness of the cathode electrode layer is 100 nm.

The device is protected from ambient conditions by encapsulation of the device with a glass slide. Thereby, a cavity is formed, which comprises a getter material for further protection.

To assess the performance of the inventive examples compared to the prior art, the current efficiency is measured under ambient conditions (20° C.). Current voltage measurements are performed using a Keithley 2400 source meter, and recorded in V. At 10 mA/cm² for bottom emission and 10 mA/cm² for top emission devices, a calibrated spectrometer CAS140 from Instrument Systems is used for measurement of CIE coordinates and brightness in Candela. Lifetime LT of bottom emission device is measured at ambient conditions (20° C.) and 10 mA/cm², using a Keithley 2400 source meter, and recorded in hours. Lifetime LT of top emission device is measured at ambient conditions (20° C.) and 8 mA/cm². The brightness of the device is measured using a calibrated photo diode. The lifetime LT is defined as the time till the brightness of the device is reduced to 97% of its initial value.

In bottom emission devices, the emission is predominately Lambertian and quantified in percent external quantum efficiency (EQE). To determine the efficiency EQE in % the light output of the device is measured using a calibrated photodiode at 10 mA/cm2.

In pn junction devices, the operating voltage is determined at 10 mA/cm² as described for OLEDs above.

Technical Effect of the Invention

In Table 1 are shown the dipole moment, glass transition temperature Tg, rate onset temperature $T_{RO}$ of compound of formula 1 (examples 1 to 6) and of comparative example 1. Additionally, the operating voltage of electron-only devices at 10 mA/cm² comprising an organic semiconductor layer consisting of compound of formula 1 is shown. Operating voltage in electron-only devices provides an indirect measure of conductivity. The lower the operating voltage the higher the conductivity.

In comparative example 1, MX1 has a glass transition temperature of 87° C. rate onset temperature of 234° C. The operating voltage is high at 1.8 V.

In example 1, the glass transition temperature is improved to 120° C., the rate onset temperature is 229° C. and the operating voltage is reduced significantly to 1.4 V.

In examples 2 to 6, the glass transition temperature is between 123 and 167° C., the rate onset temperature is between 229 and 294° C. and the operating voltage is significantly lower than in the comparative example.

In summary, compound of formula 1 may have very high conductivity and a significant reduction in operating voltage may be achieved. The glass transition temperature and rate onset temperature are within the range acceptable for mass production of organic semiconductor layers.

TABLE 1

| | | | Tg | $T_{RO}$ | Operating voltage |
|---|---|---|---|---|---|
| Name | | Formula | [° C.] | [° C.] | at 10 mA/cm² [V] |
| Comparative example 1 | MX1 | 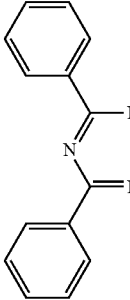 | 87 | 234 | 1.8 |

TABLE 1-continued
Glass transition temperature, rate onset temperature and operating voltage in electron-only devices
| | Name | Formula | Tg [° C.] | T$_{RO}$ [° C.] | Operating voltage at 10 mA/cm$^2$ [V] |
|---|---|---|---|---|---|
| Example 1 | MX2 | 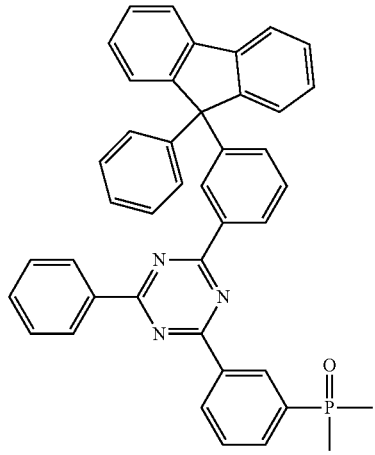 [SMILES: CP(C)(=O)c1cccc(-c2nc(-c3ccccc3)nc(-c3cccc(C4(c5ccccc5)c5ccccc5-c5ccccc54)c3)n2)c1] | 120 | 229 | 1.4 |
| Example 2 | MX3 | 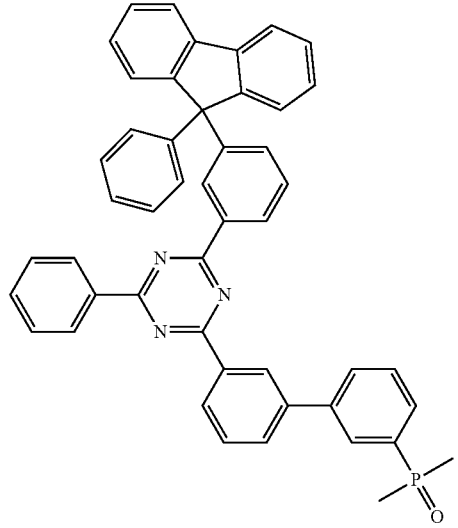 [SMILES: CP(C)(=O)c1cccc(-c2cccc(-c3nc(-c4ccccc4)nc(-c4cccc(C5(c6ccccc6)c6ccccc6-c6ccccc65)c4)n3)c2)c1] | 123 | 264 | 1.5 |
| Example 3 | MX4 | 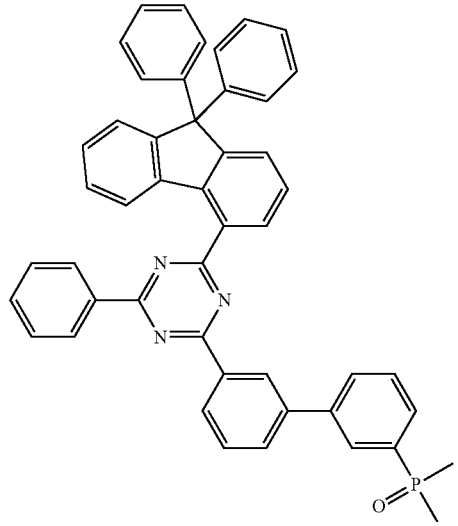 [SMILES: CP(C)(=O)c1cccc(-c2cccc(-c3nc(-c4ccccc4)nc(-c4cccc5c4-c4ccccc4C5(c4ccccc4)c4ccccc4)n3)c2)c1] | 131 | 254 | 0.9 |

TABLE 1-continued

Glass transition temperature, rate onset temperature and operating voltage in electron-only devices

| Name | Formula | Tg [° C.] | T$_{RO}$ [° C.] | Operating voltage at 10 mA/cm$^2$ [V] |
|---|---|---|---|---|
| Example 4 MX5 | | 156 | 262 | 0.7 |
| Example 5 MX6 | | 167 | 294 | 0.7 |
| Example 6 MX7 | | 147 | 283 | 0.8 |

In Table 2 are shown operating voltages of an organic semiconductor layer comprising a compound of formula 1 and alkali organic complex. The alkali organic complex is LI-1 (Lithium tetra(1H-pyrazol-1-yl)borate).

In comparative example 2, the operating voltage is high at 0.5 V. In example 7, the operating voltage is reduced significantly to 0.3 V. Thereby, the beneficial effect of high conductivity of compound of formula 1 is observed also in an organic semiconductor layer comprising further an alkali organic complex.

TABLE 2

Electron-only devices of an organic semiconductor layer comprising a compound of formula 1 and an alkali organic complex.

| | Compound of formula 1 | vol.-% compound of formula 1 | Alkali organic complex | vol.-% alkali organic complex | Operating voltage at 10 mA/cm² (V) |
|---|---|---|---|---|---|
| Comparative example 2 | MX1 | 70 | LI-1 | 30 | 0.5 |
| Example 7 | MX5 | 70 | LI-1 | 30 | 0.3 |

In Table 3 are shown data for bottom emission OLEDs. In example 8, the first electron transport layer comprises compound of formula 1 and alkali organic complex LI-1. In comparative example 3, the first electron transport layer comprises MX1 and alkali organic complex LI-1. As can be seen in Table 3, the operating voltage is reduced significantly in example 8 compared to comparative example 3. Additionally, the lifetime is increased. Long lifetime is important for long-term stability of the organic electronic device.

In summary, a beneficial effect of compound of formula ion operating voltage and lifetime is observed when used in the electron transport layer.

TABLE 3

OLED performance of a first electron transport layer comprising a compound of formula 1 and an alkali organic complex

| | Compound of formula 1 | vol.-% compound of formula 1 | Alkali organic complex | vol.-% alkali organic complex | Thickness ETL1/nm | Operating voltage at 10 mA/cm² (V) | cd/A efficiency at 10 mA/cm² (cd/A) | LT97 at 10 mA/cm² [h] |
|---|---|---|---|---|---|---|---|---|
| Comparative example 3 | MX1 | 70 | LI-1 | 30 | 36 | 3.7 | 6.1 | 133 |
| Example 8 | MX5 | 70 | LI-1 | 30 | 36 | 3.5 | 5.9 | 171 |

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

The invention claimed is:

1. Organic electronic device comprising at least one organic semiconductor layer, wherein the at least one organic semiconductor layer comprises a compound of formula 1:

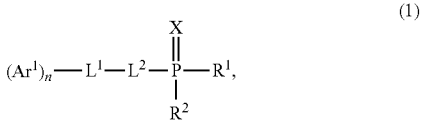

wherein

X is selected from O, S or Se;

$Ar^1$ is selected from unsubstituted or substituted $C_2$ to $C_{60}$ heteroarylene, and wherein the substituted $C_2$ to $C_{60}$ heteroarylene comprises at least about one to about six substituents,
  wherein the substituent of the substituted $C_2$ to $C_{60}$ heteroarylene are independently selected from $C_1$ to $C_{12}$ alkyl, $C_1$ to $C_{12}$ alkoxy, CN, OH, halogen, $C_6$ to $C_{36}$ arylene, or $C_2$ to $C_{25}$ heteroarylene;

n is 1 or 2;

$L^1$ is selected from a single bond, $C_1$ to $C_4$ alkyl, substituted or unsubstituted $C_6$ to $C_{36}$ arylene,
  wherein the substituent of substituted $C_6$ to $C_{36}$ arylene is selected from $C_1$ to $C_{12}$ alkyl, $C_6$ to $C_{18}$ arylene;

$L^2$ is selected from a single bond or $C_1$ to $C_6$ alkyl, $R^1$, $R^2$ are independently selected from substituted or unsubstituted $C_1$ to $C_{16}$ alkyl, wherein the substituent of substituted $C_1$ to $C_{16}$ alkyl is selected from $C_6$ to $C_{18}$ arylene or $C_2$ to $C_{12}$ heteroarylene, wherein the compound of formula 1 comprises:
  at least about 4 of $C_6$-arylene rings,
  a molecular mass of at least about 400 g/mol to about 1800 g/mol;
  wherein $Ar^1$ comprises at least one N-heteroaryl group selected from the group comprising a triazine, quinazoline, quinoline, benzimidazole, benzothiazole, benzo[4,5]thieno[3,2-d]pyrimidine, pyrimidine and pyridine.

2. The organic electronic device according to claim 1, wherein the compound of formula 1 comprises at least about 4 to about 12 $C_6$-arylene rings, or at least about 4 to about 12 condensed $C_6$-arylene rings.

3. The organic electronic device according to claim 1, wherein $L^1$ bonds via a single bond directly on a heteroarylene group of $Ar^1$.

4. The organic electronic device according to claim 1, wherein in formula 1:

X is selected from O or S;

$Ar^1$ is selected from unsubstituted or substituted $C_3$ to $C_{51}$ heteroarylene, and
   wherein the substituted $C_3$ to $C_{51}$ heteroarylene comprises at least one to three substituents,
      wherein the substituent of the substituted $C_3$ to $C_{51}$ heteroarylene are independently selected from $C_1$ to $C_{12}$ alkyl, CN, $C_6$ to $C_{36}$ arylene or $C_2$ to $C_{25}$ heteroarylene;

n is 1 or 2;

$L^1$ is selected from unsubstituted $C_6$ to $C_{36}$ arylene, wherein $L^1$ comprises at least one to six aromatic-6-member rings;

$L^2$ is selected from a single bond or $C_1$ to $C_6$ alkyl, $R^1$, $R^2$ are independently selected from unsubstituted $C_1$ to $C_4$ alkyl.

5. The organic electronic device according to claim 1, wherein $Ar^1$ has the chemical structure B1 to B12:

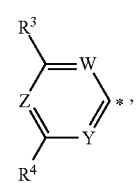
(B1)

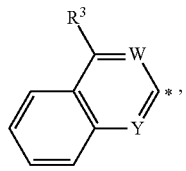
(B2)

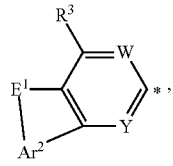
(B3)

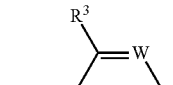
(B4)

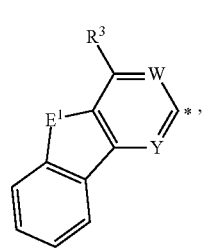
(B5)

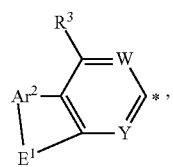

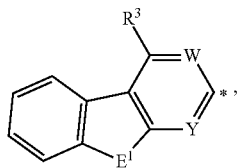
(B6)

(B7)

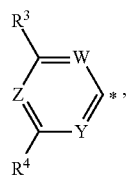
(B8)

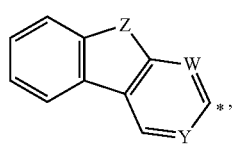
(B9)

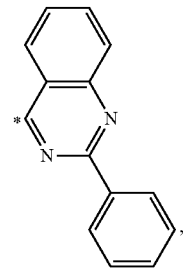
(B10)

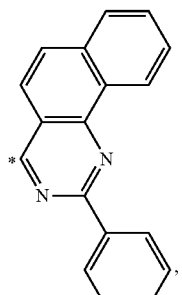
(B11)

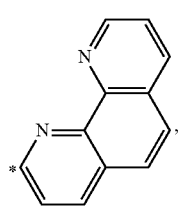
(B12)

wherein

Ar¹ is bonded at "*" to L¹ via a single bond; and wherein

W, Y, Z are independently selected from N, S, O, CH or CR³, wherein at least one of W, Y, Z is selected from N, S or O, or at least W and Y are N;

E¹ is selected from N—Ar², O or S;

R³ and R⁴ are independently selected from H, $C_1$ to $C_{16}$ alkyl, or Ar²;

Ar² is independently selected from substituted or unsubstituted $C_6$ to $C_{36}$ arylene, $C_2$ to $C_{25}$ heteroarylene, wherein in structure B3 and structure B5 at least two ring atoms of the arylene or heteroarylene of Ar² forms with E¹ at least a five member ring, and wherein the substituent of the substituted $C_6$ to $C_{36}$ arylene and of the substituted $C_2$ to $C_{25}$ heteroarylene are selected from $C_1$ to $C_{12}$ alkyl and $C_1$ to $C_{12}$ alkoxy.

6. The organic electronic device according to claim 1, wherein for n=2 the compound has the chemical formula 2:

$$Ar^1-L^1-L^2-\overset{\overset{X}{\|}}{\underset{R^2}{P}}-R^1. \qquad (2)$$

$$\underset{Ar^1}{}$$

7. The organic electronic device according to claim 1, wherein

Ar¹ is selected from at least one of the following:

at least about 1 to about 5 heteroarylenes selected from 5 or 6 member rings, or about 1 to about 3 heteroarylenes selected from 5 or 6 member rings, or one 6 member heteroarylene ring;

at least about 1 to 12 arylenes selected from 5 or 6 member rings, or at least about 2 to 10 arylenes selected from 5 or 6 member rings, or at least about 2 to 8 arylenes selected from 6 member rings or about 3 to about 6 arylenes selected from 6 member rings;

at least 1 to 6 condensed 5 or 6 member rings of arylenes or heteroarylenes, or about 2 to about 4 condensed 5 or 6 member rings of arylenes or heteroarylenes, or 2 to about 4 condensed 5 or 6 member arylenes and one 5 or 6 member heteroarylene.

8. The organic electronic device according to claim 1, wherein

Ar¹ comprise at least about one group, or about one to about 4 groups, selected from phenyl, biphenyl, terpyhenyl, quarterphenyl, naphthyl, phenanthryl, dibenzofuranyl, dibenzothiophenyl, or a group selected from chemical structures D1 to D7:

(D1)

(D2)

(D3)

(D4)

(D5)

(D6)

(D7)

wherein

Ar¹ is bonded at"*" to Li, so that between Ar¹ and L¹ a single bond is formed; and wherein R⁵ and R⁶ are independently selected from $C_1$ to $C_{16}$ alkyl, or Ar²; and Ar[4] and Ar[5] are independently selected from $C_1$ to $C_{16}$ alkyl or substituted or unsubstituted $C_6$ to $C_{36}$ arylene, $C_2$ to $C_{25}$ heteroarylene, wherein the substituent of the substituted $C_6$ to $C_{36}$ arylene, $C_2$ to $C_{25}$ heteroarylene is selected from $C_1$ to $C_{12}$ alkyl, $C_1$ to $C_{12}$ alkoxy; and Ar[6] is selected from H or phenyl.

9. The organic electronic device according to claim 1, wherein

Ar[1] is selected from the chemical structures F1 to F31, and is connected with L[1] at "*" via a single bond:

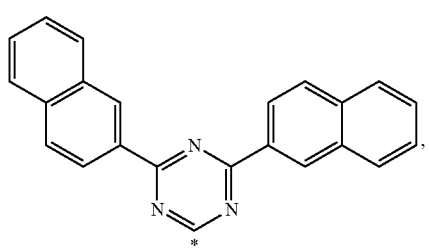
(F1)

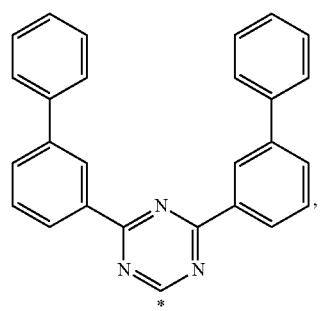
(F2)

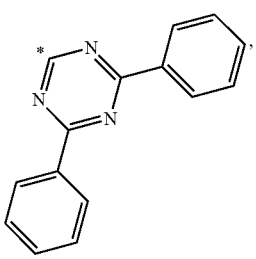
(F3)

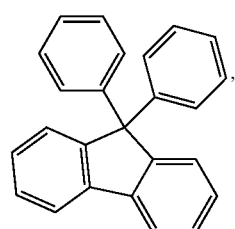

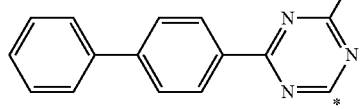
(F4)

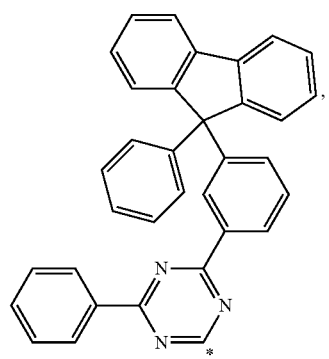
(F5)

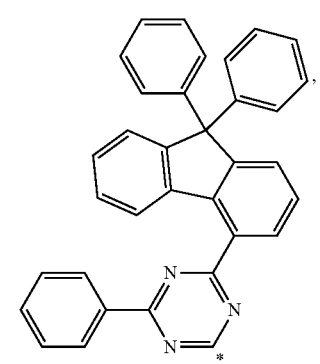
(F6)

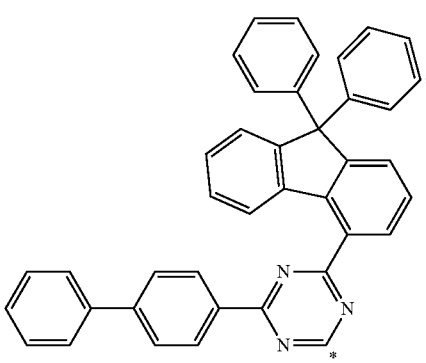
(F7)

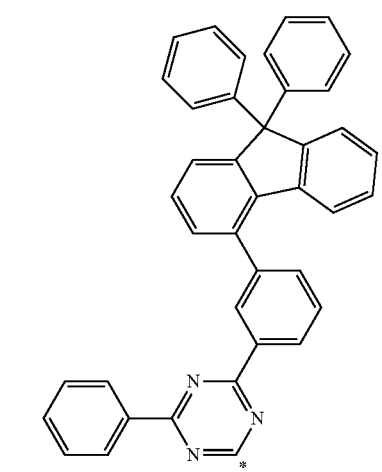
(F8)

(F9)
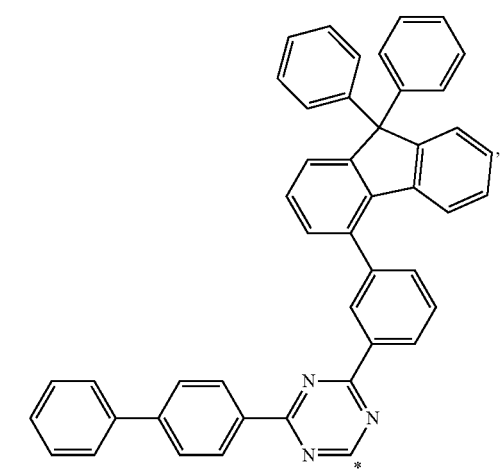
(F10)
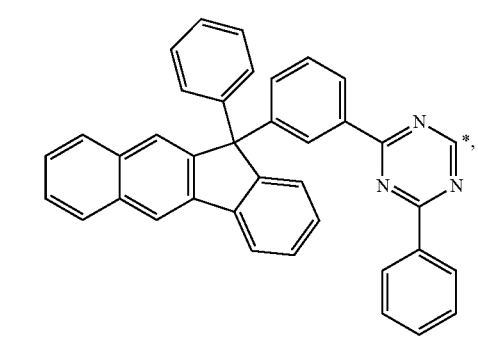
(F11)
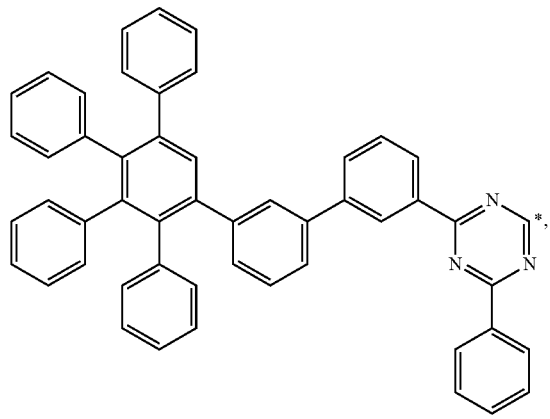
(F12)
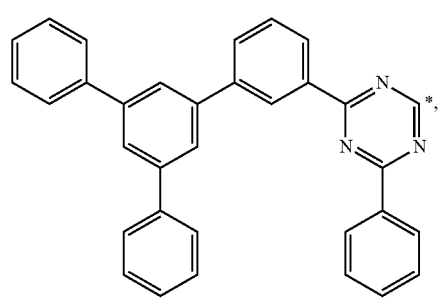
(F13)
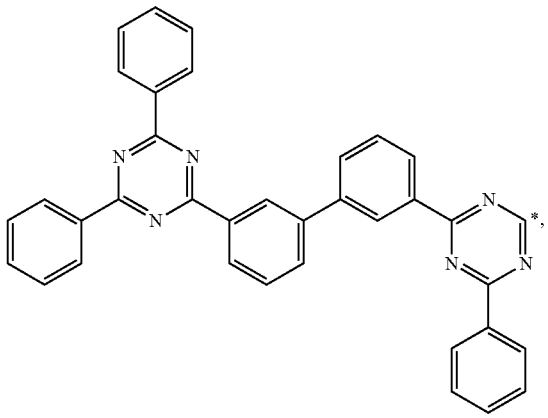
(F14)
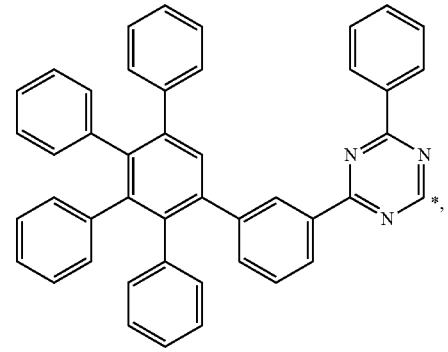
(F15)
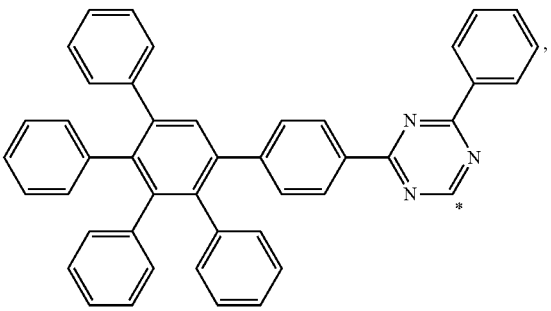
(F16)
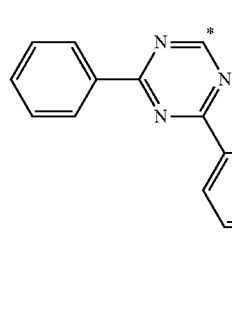
(F17)
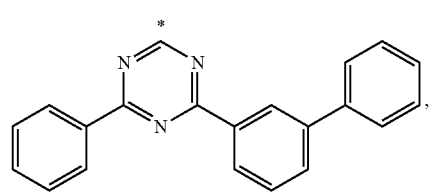

(F18)
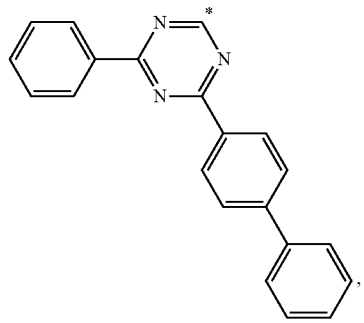
(F19)
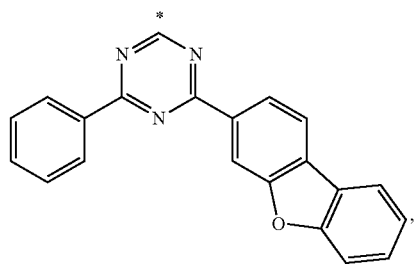
(F20)
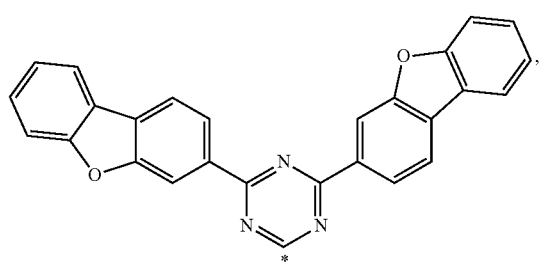
(F21)
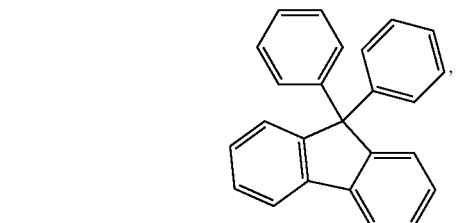
(F22)
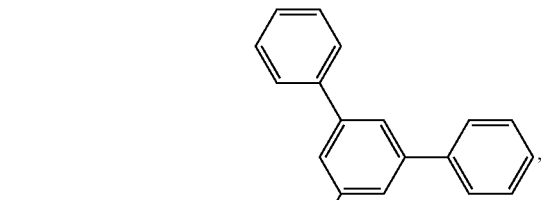
(F23)
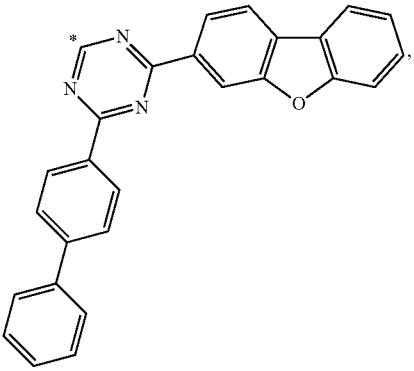
(F24)
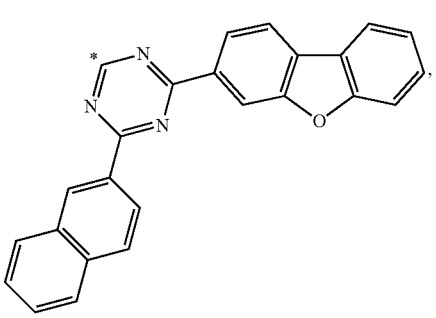
(F25)
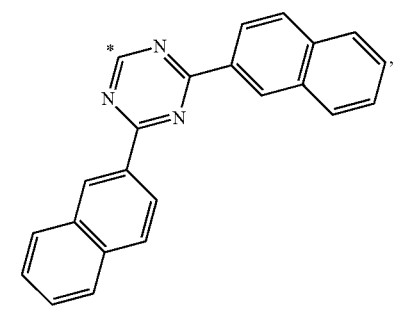
(F26)
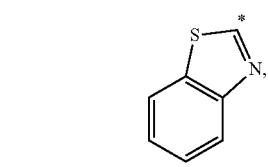
(F27)
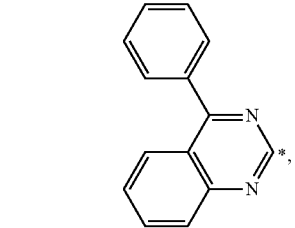

-continued
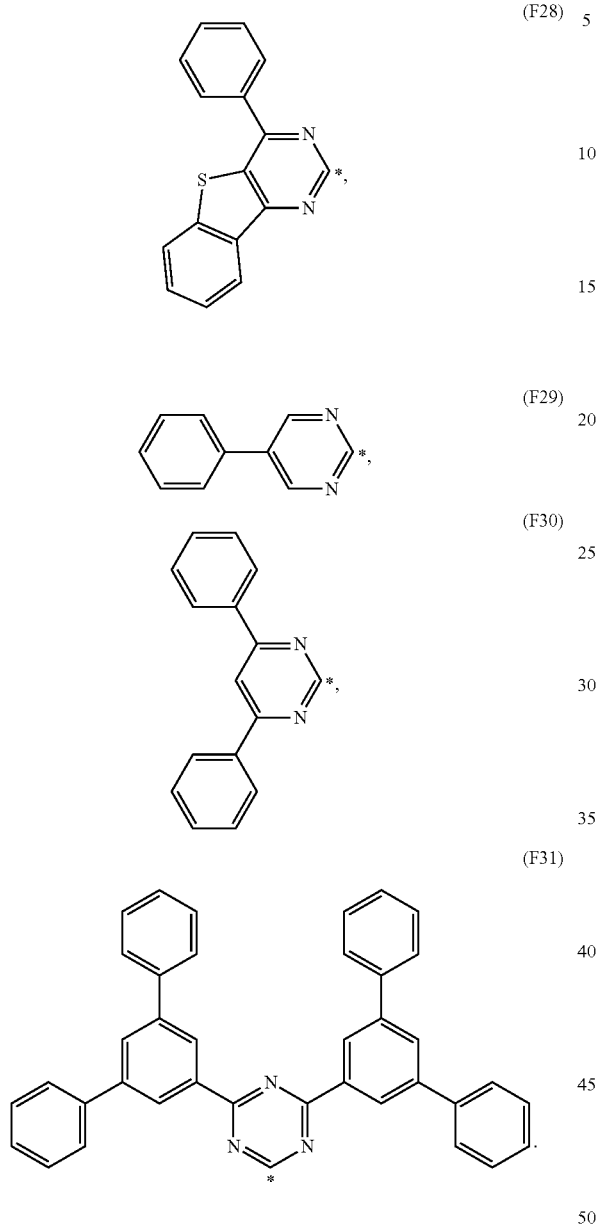
10. The organic electronic device according to claim 1, wherein for the comp according to chemical formula 1:
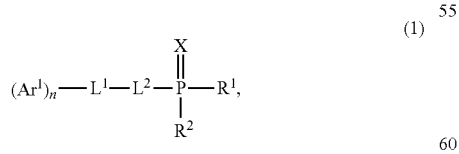
wherein
L¹ is selected from the group of structures G1 to G13, wherein
L¹ is connected via a single bond to L² at "*¹", and L¹ is connected via a single bond to Ar¹ at "*²":
a) for n=1
(G1)
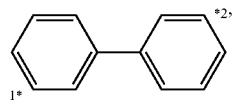
(G2)
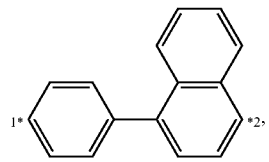
(G3)
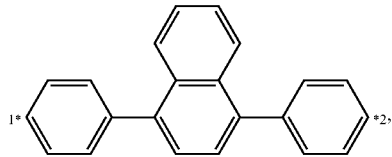
(G4)
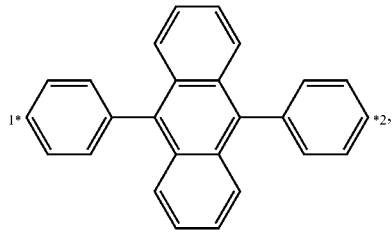
(G5)
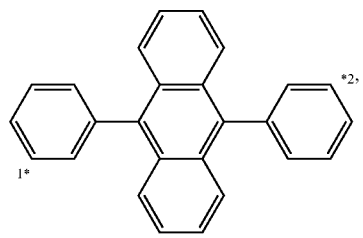
(G6)
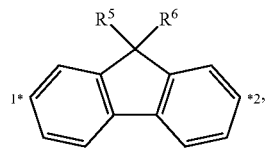
(G7)
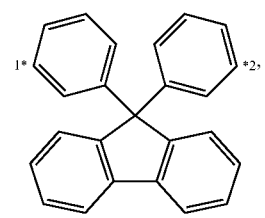
(G8)

-continued (G9)
[structure: 9,9-diphenylfluorene with 1* and *2 positions]

(G10)
[structure: 9,9-diphenyl-fluorene variant with 1* and *2 positions]

(G11)
[structure: spiro[fluorene-9,9'-xanthene] with 1* and *2 positions]

(G12)
[structure: biphenyl with Ar⁷ substituent, 1* and *2 positions]

or b) for n=2

(G13)
[structure: phenyl-naphthalene-biphenyl with *1 and *2 positions];

wherein

Ar⁷ is selected from $C_{10}$ to $C_{16}$ aryl, and $R^5$ and $R^6$ are independently selected from $C_1$ to $C_{16}$ alkyl, substituted or unsubstituted $C_6$ to $C_{36}$ arylene, or substituted or unsubstituted $C_2$ to $C_{25}$ heteroarylene.

11. The organic electronic device according to claim 1, wherein for the compound according to chemical formula 1:

$$(Ar^1)_n\text{—}L^1\text{—}L^2\text{—}\overset{\overset{X}{\|}}{\underset{R^2}{P}}\text{—}R^1,$$ (1)

X is O;

$R^1$, $R^2$ are $C_1$ to $C_4$ alkyl;

$L^1$ is selected from a group of G1 to G13;

$L^2$ is a single bond;

$Ar^1$ is from a group of F1 to F31;

n is 1 or 2; and wherein $Ar^1$ is bonded at "*" to $L^1$ via a single bond, $L^1$ is connected via a single bond to $L^2$ at "*1", and $L^1$ is connected via a single bond to $Ar^1$ at "*2";

(F1)
[structure: 2,4-di(naphthalen-2-yl)-1,3,5-triazine with * position], (F2)
[structure: 2,4-bis(3-biphenyl)-1,3,5-triazine with * position], (F3)
[structure: 2,4-diphenyl-1,3,5-triazine with * position], (F4)
[structure: 9,9-diphenylfluorene linked to biphenyl-triazine with * position],

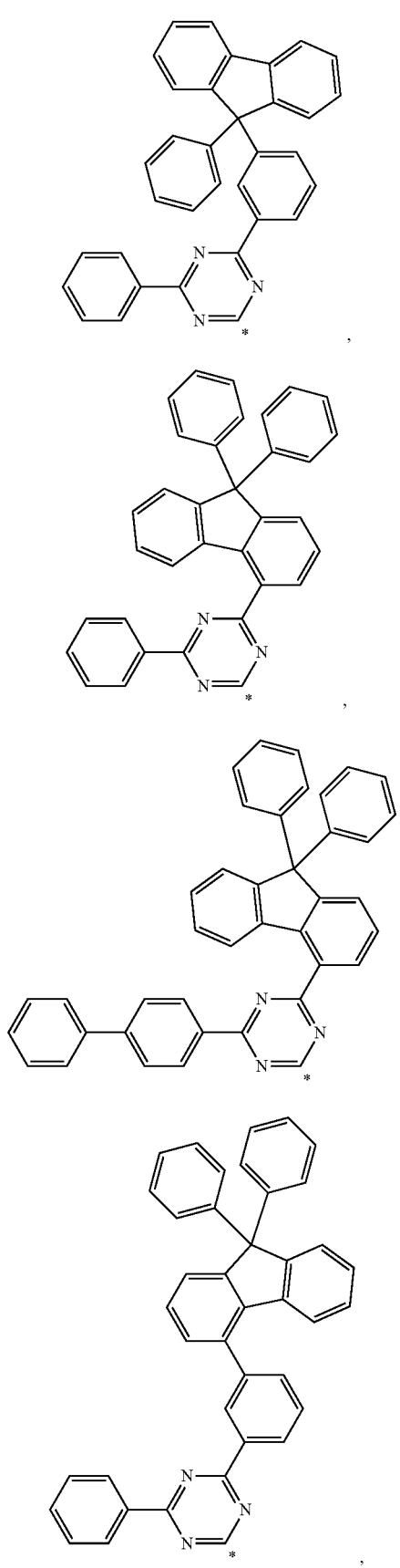
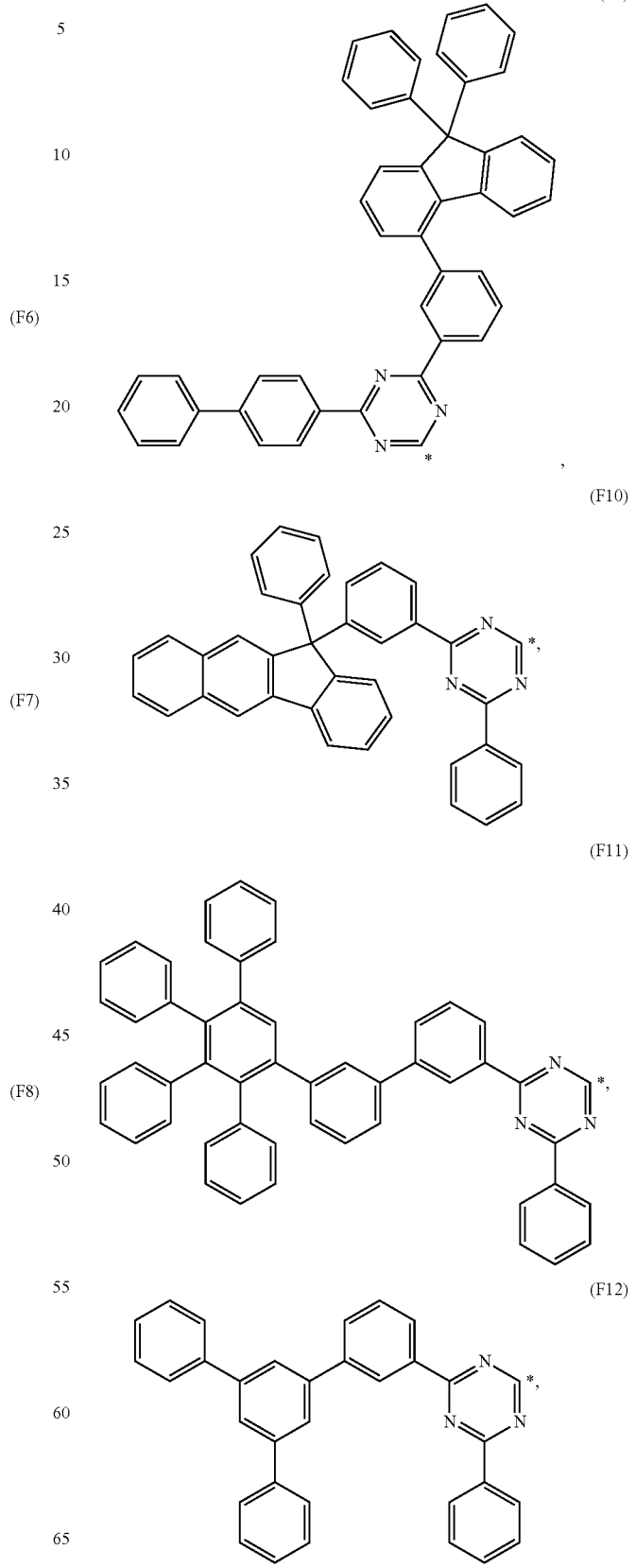

-continued
(F13)
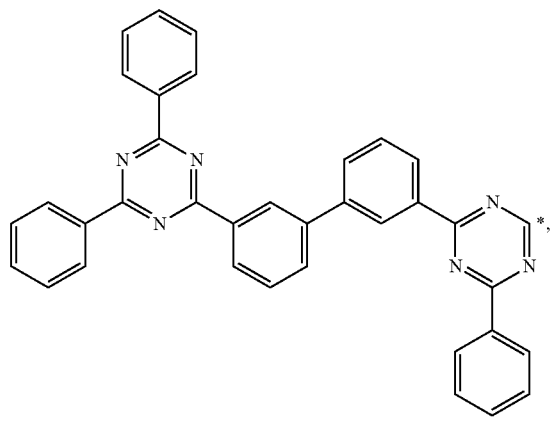
(F14)
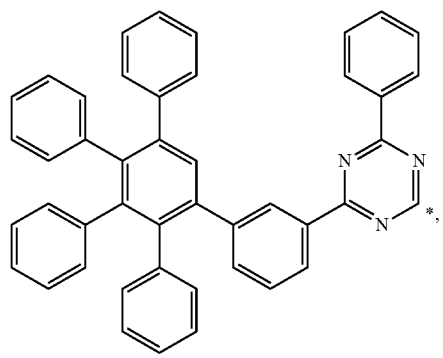
(F15)
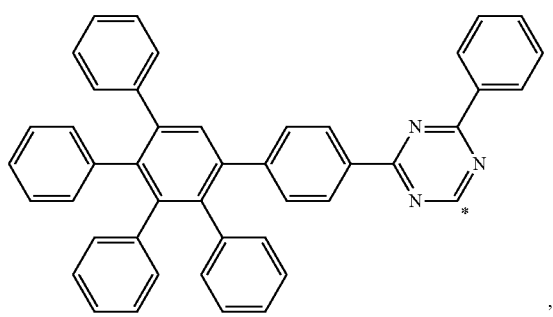
(F16)
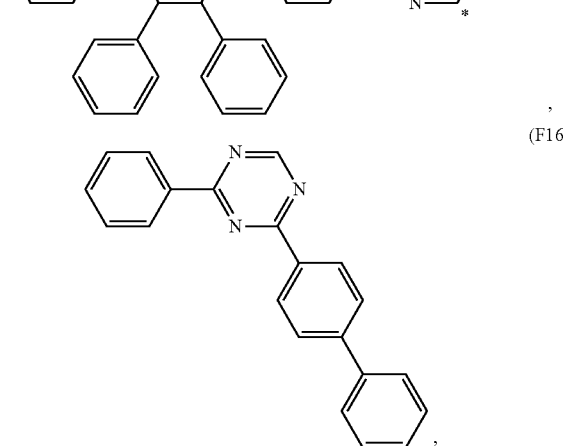
(F17)
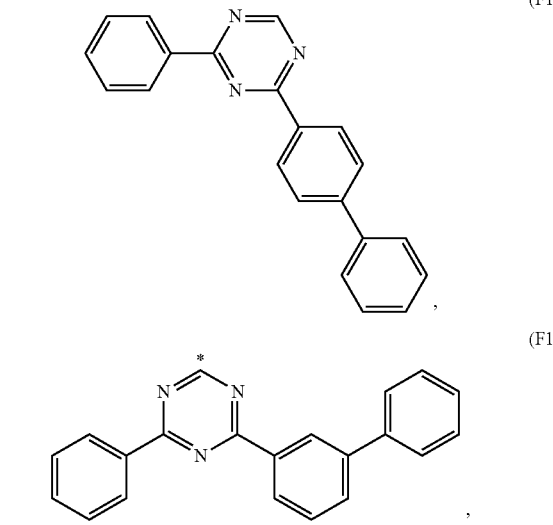
(F18)
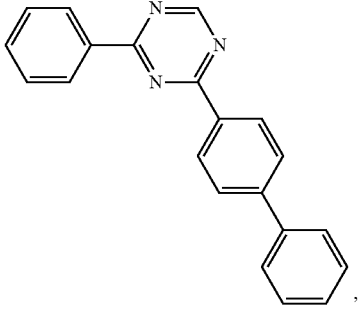
(F19)
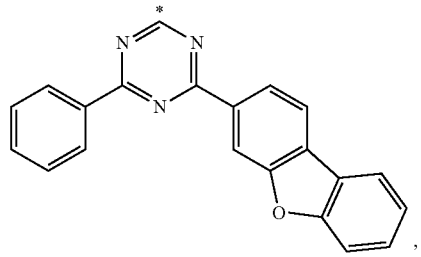
(F20)
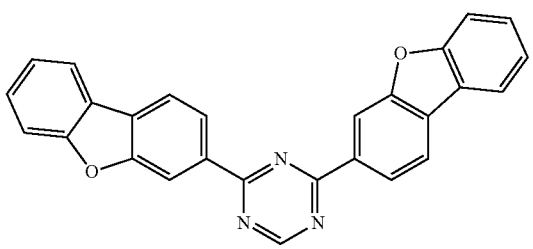
(F21)
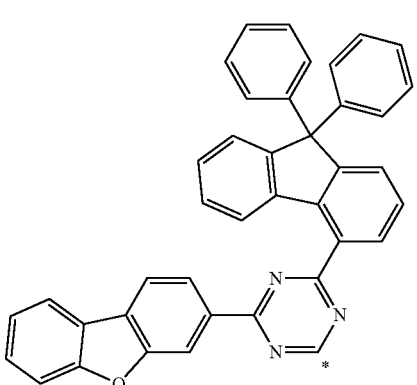
(F22)
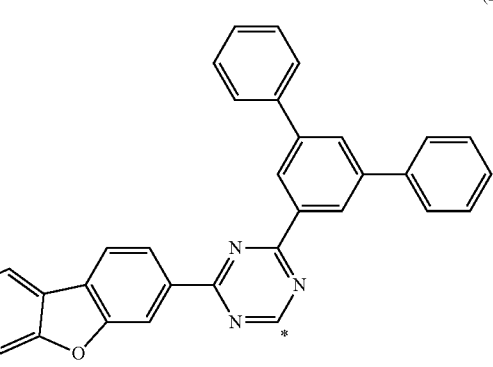

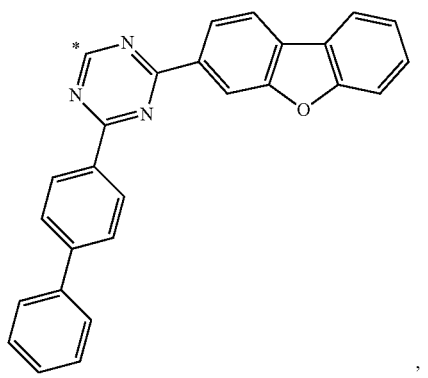
(F23)
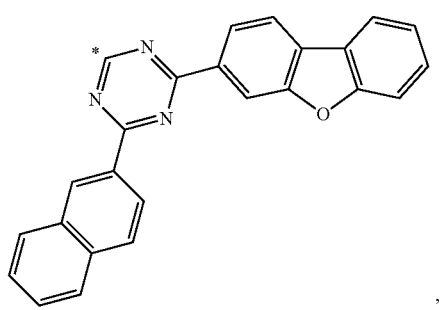
(F24)
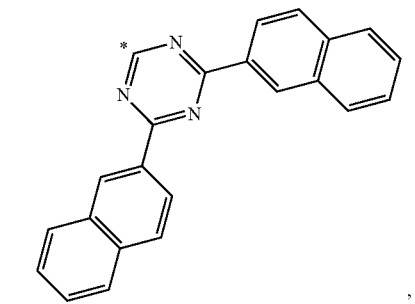
(F25)
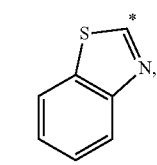
(F26)
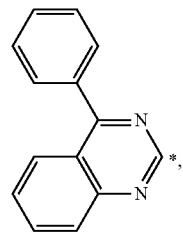
(F27)

(G4) 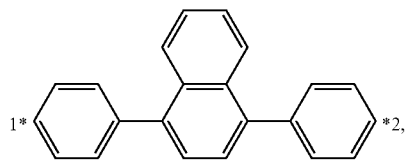

(G5) 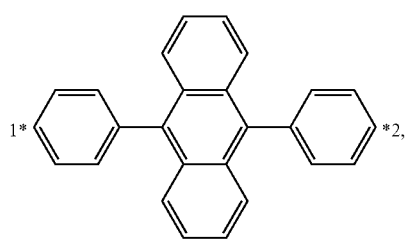

(G6) 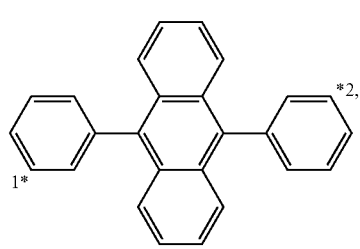

(G7) 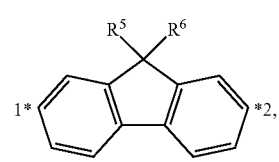

(G8) 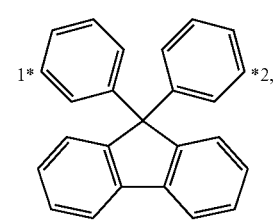

(G9) 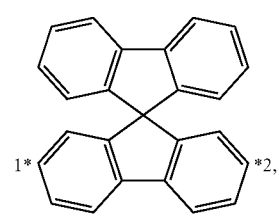

(G10) 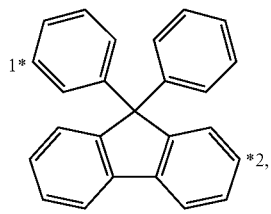

(G11) 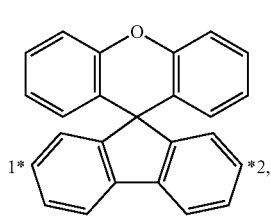

(G12) 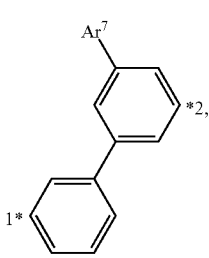

(G13) 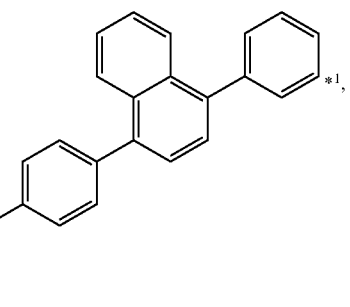

wherein $R^5$ and $R^6$ are independently selected from $C_1$ to $C_{16}$ alkyl, substituted or unsubstituted $C_6$ to $C_{36}$ arylene, or substituted or unsubstituted $C_2$ to $C_{25}$ heteroarylene, and wherein $Ar^7$ is selected from $C_{10}$ to $C_{16}$ aryl.

12. Organic electronic device comprising at least one organic semiconductor layer, wherein the at least one organic semiconductor layer comprises a compound selected from the group of H1 to H60:

143
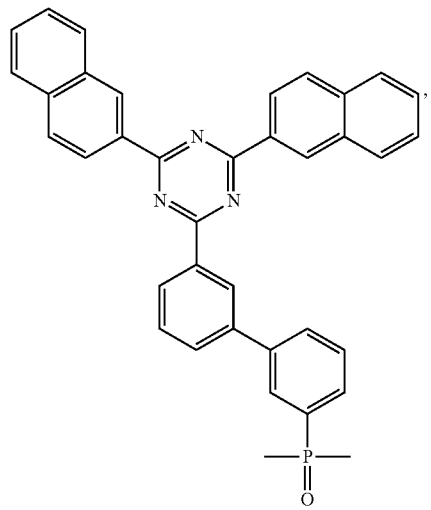
144
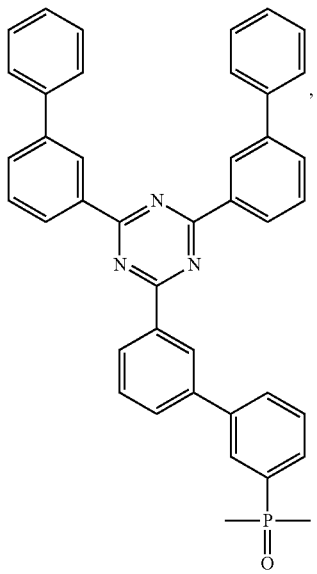
(H1)
(H2)
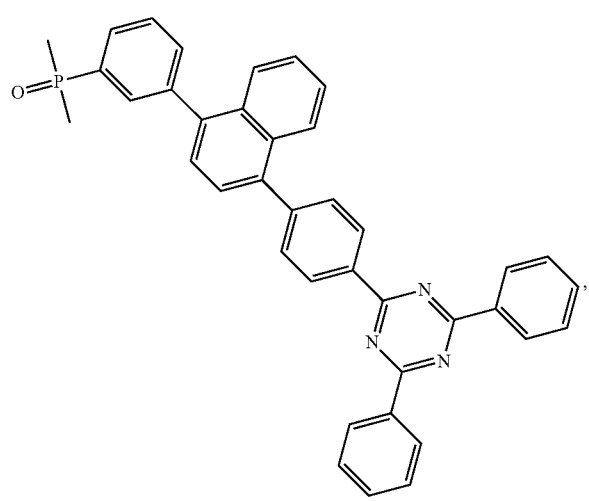
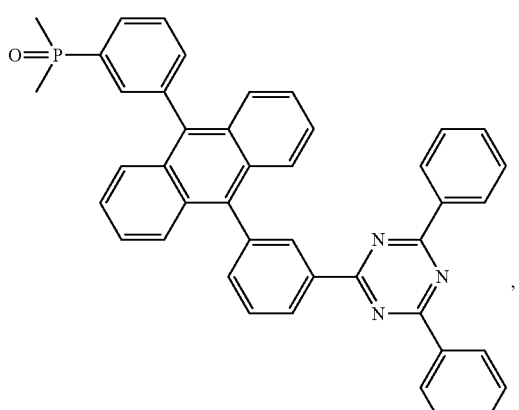
(H3)
(H4)
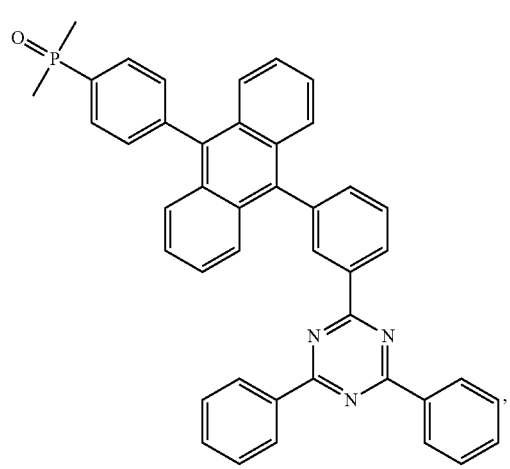
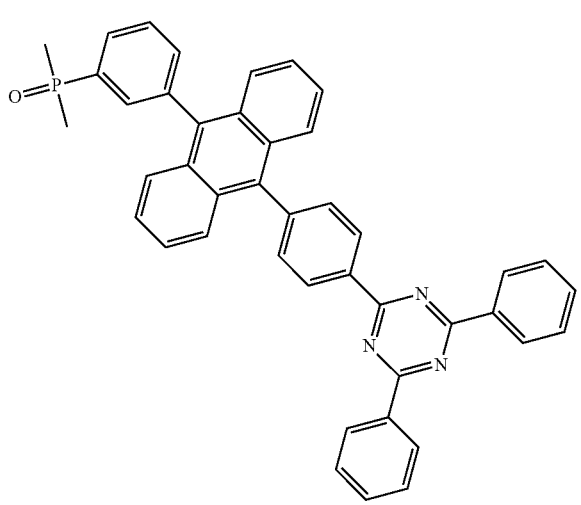
(H5)
(H6)

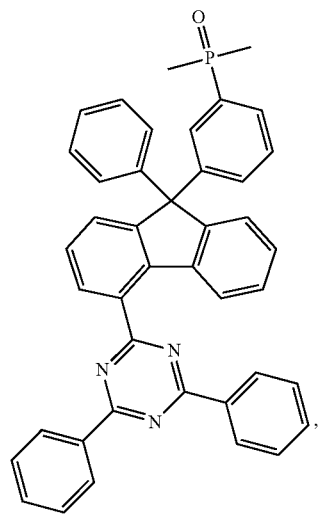
(H7)
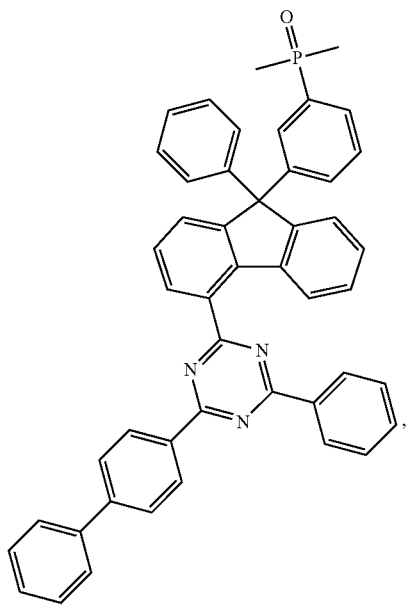
(H8)
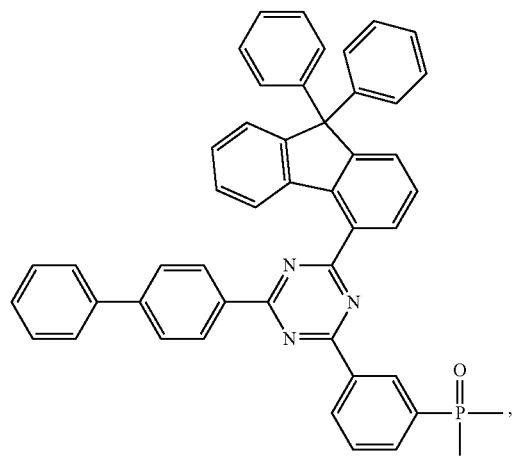
(H9)
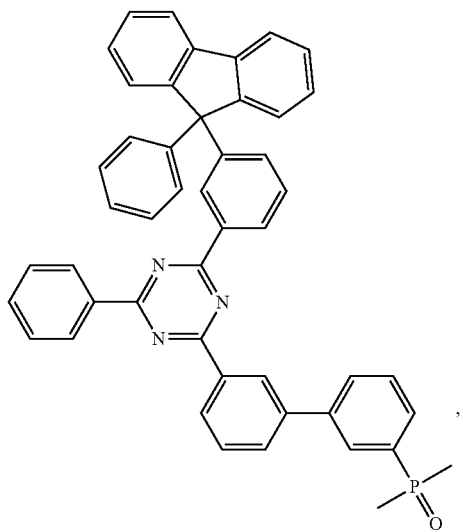
(H10)

(H11)
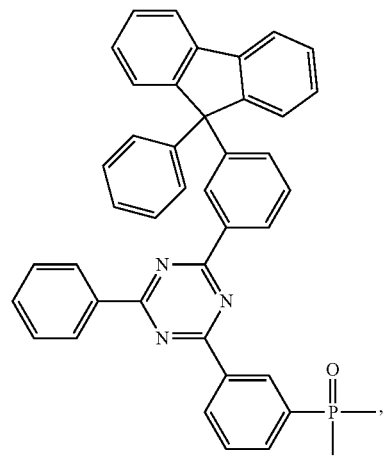
(H12)
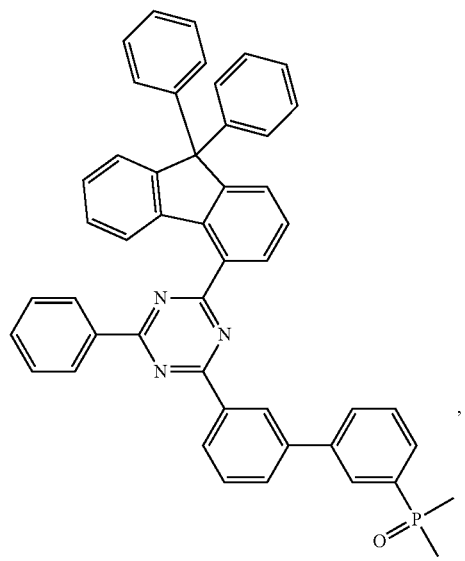
(H13)
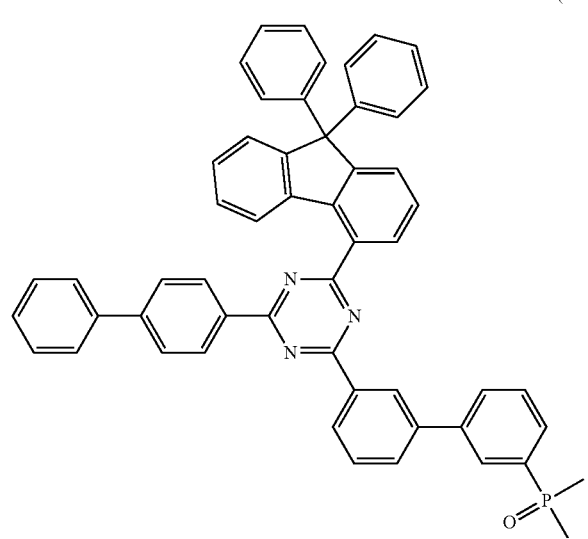
(H14)
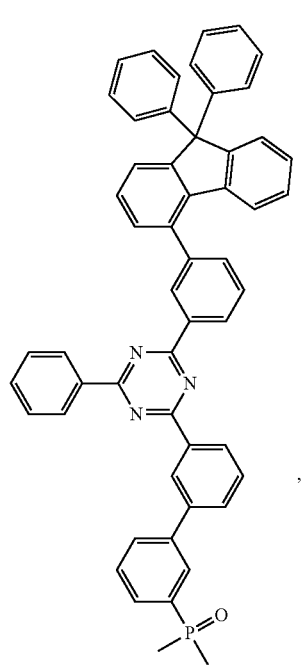

(H15)
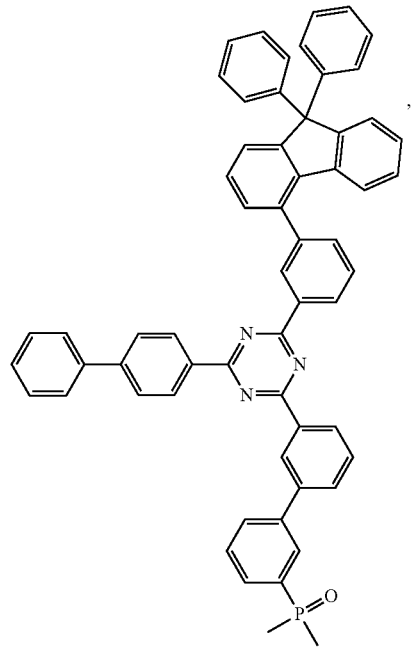
(H16)
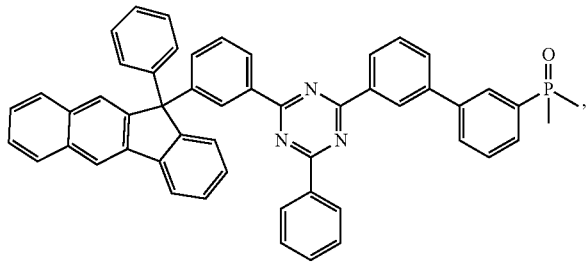
(H17)
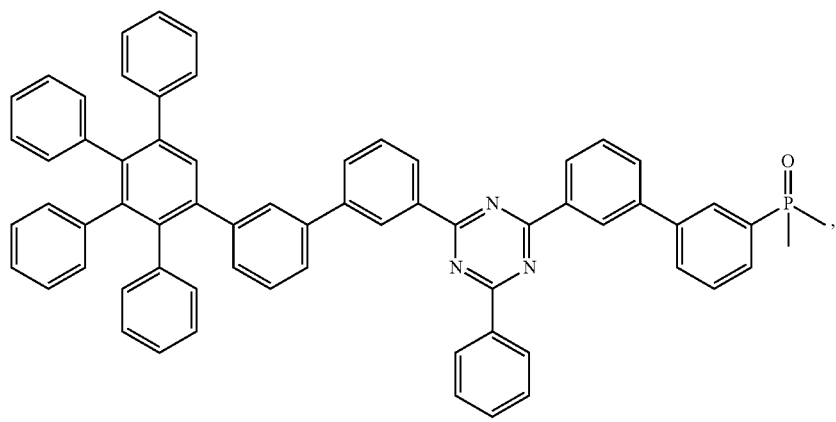
(H18)
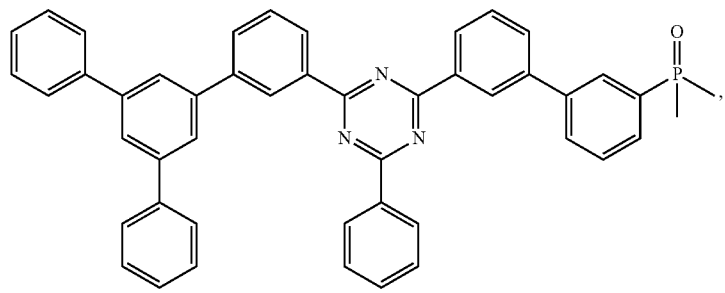

-continued
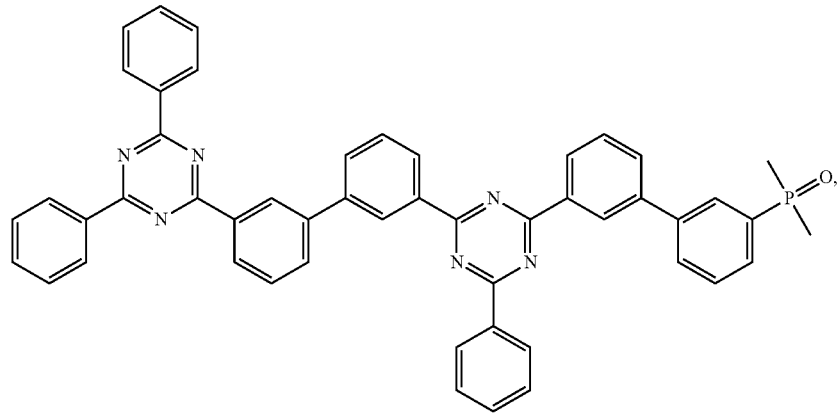
(H19)
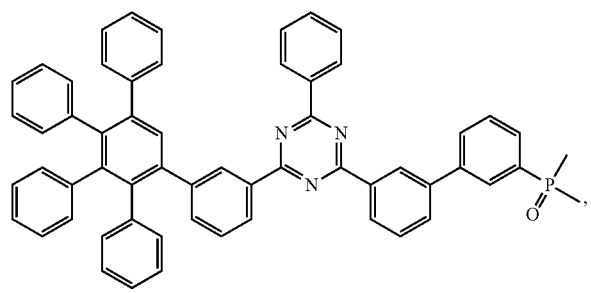
(H20)
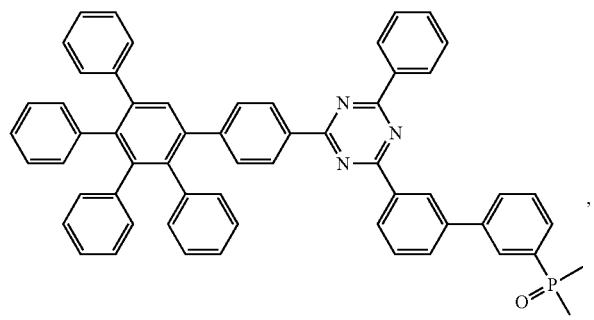
(H21)
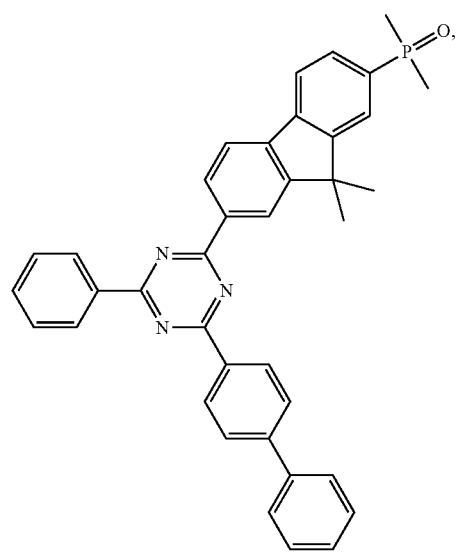
(H22)
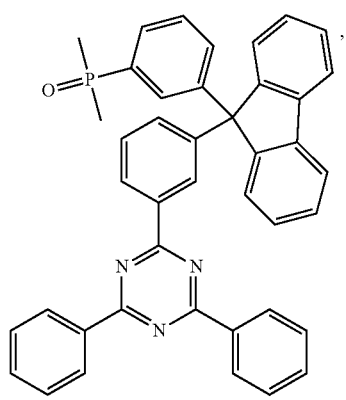
(H23)

-continued
(H24)
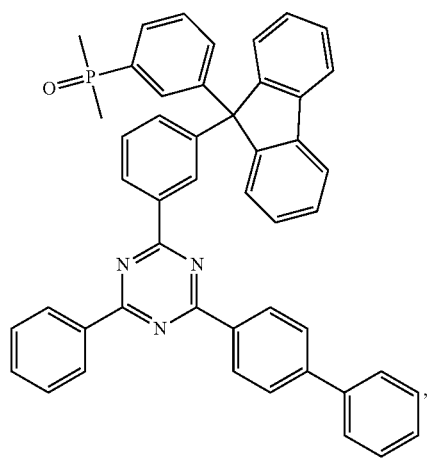
(H25)
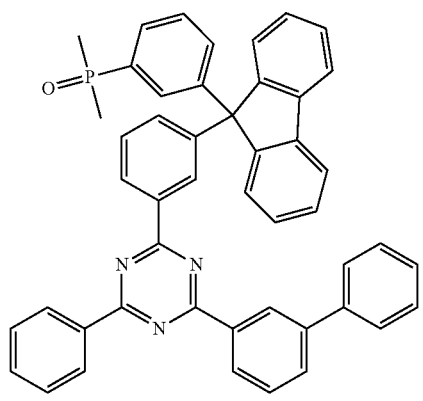
(H26)
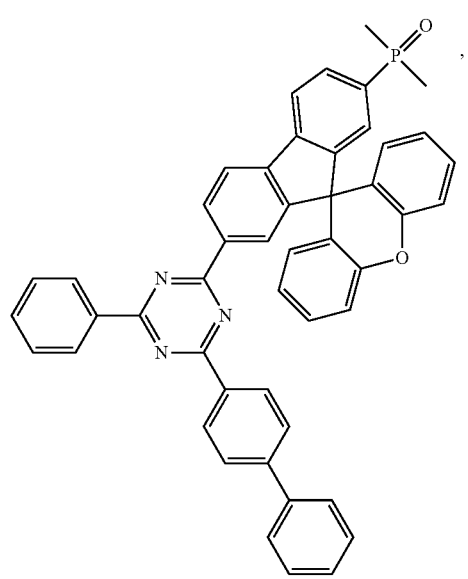
(H27)
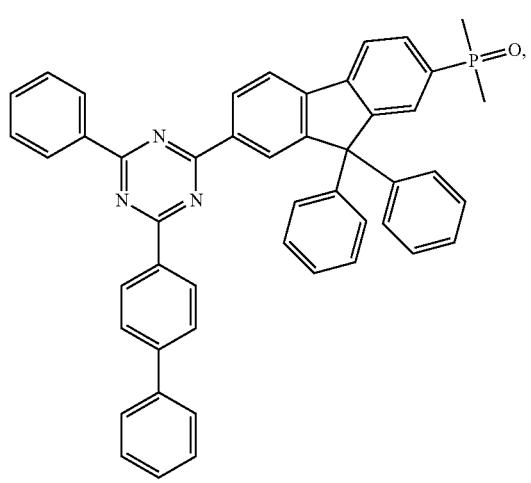
(H28)
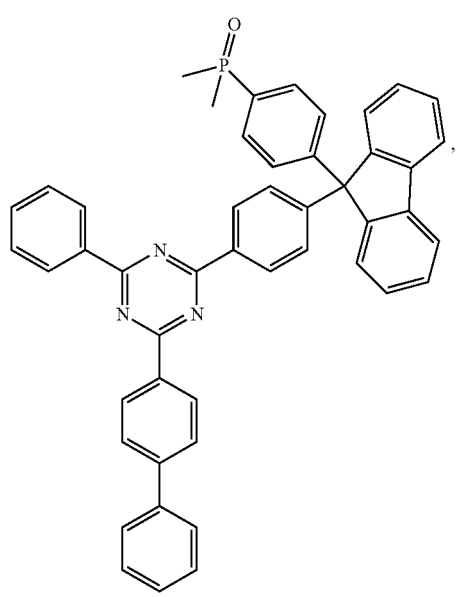
(H29)
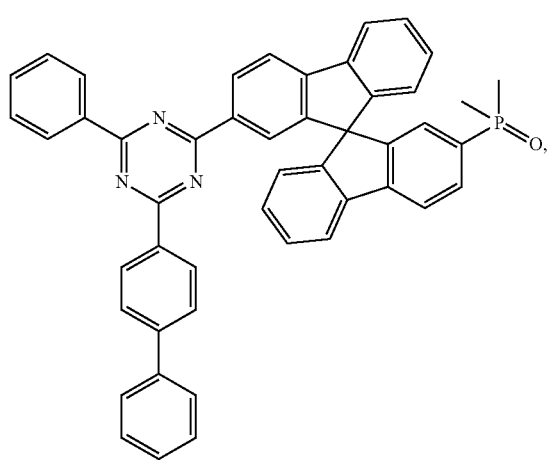

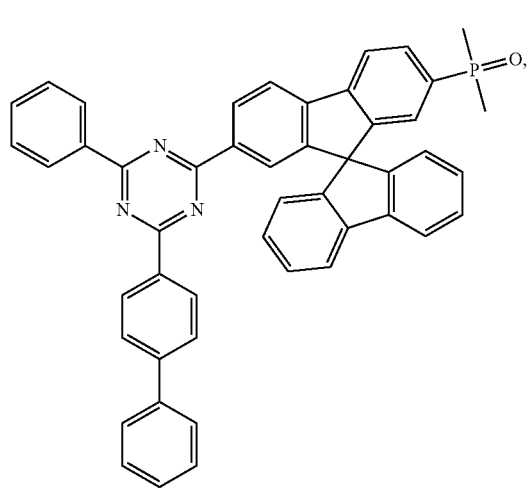
(H30)
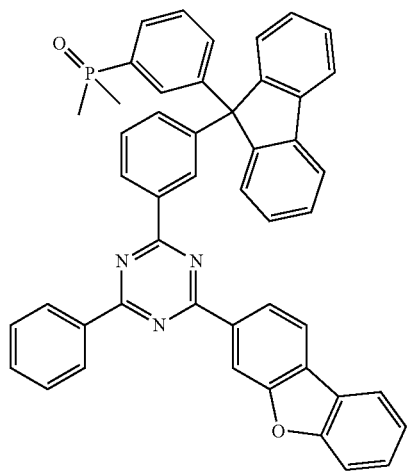
(H31)
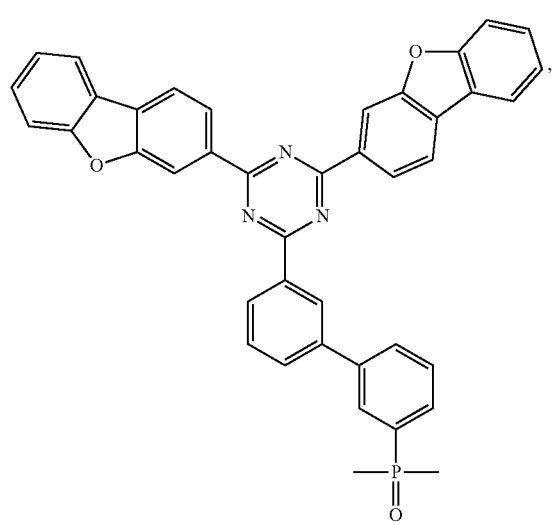
(H32)
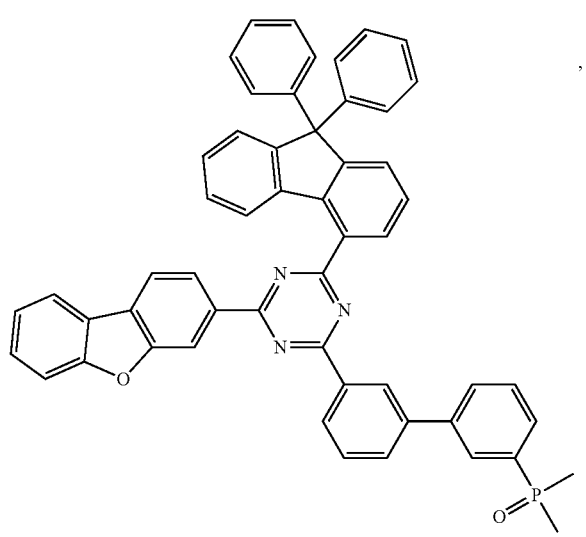
(H33)
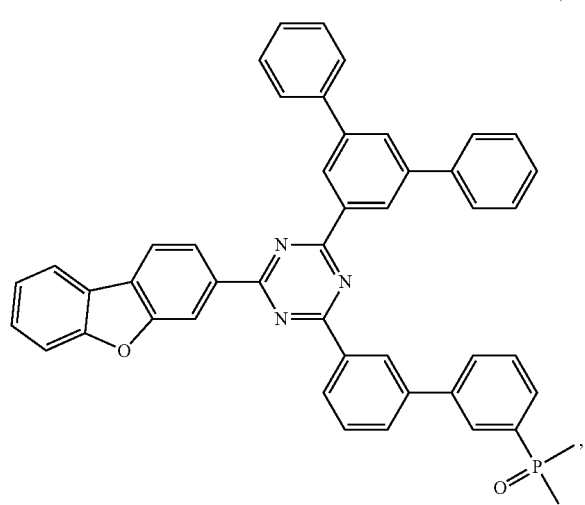
(H34)
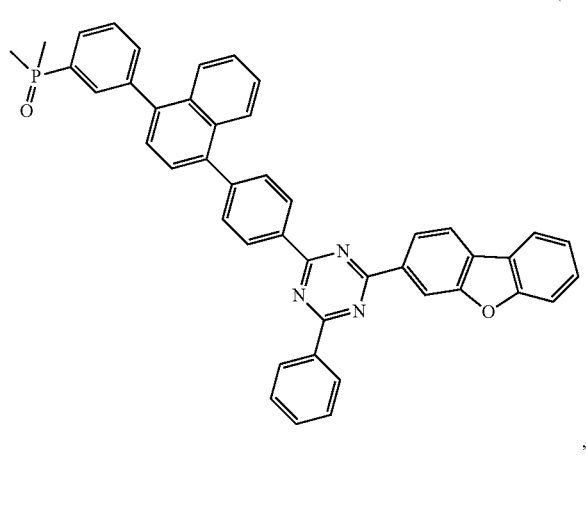
(H35)

(H36)
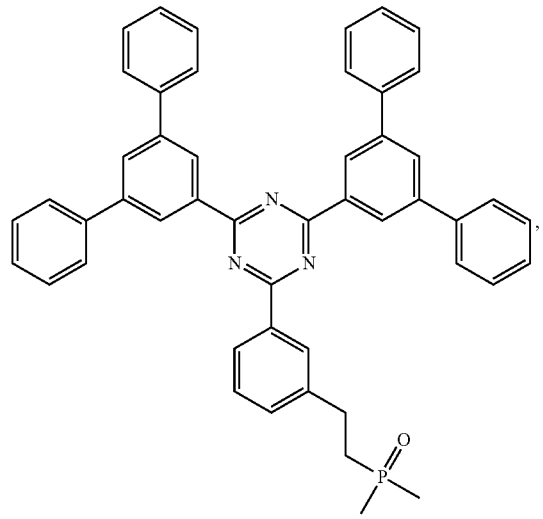
(H37)
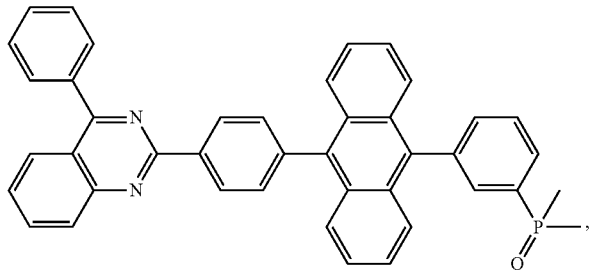
(H38)
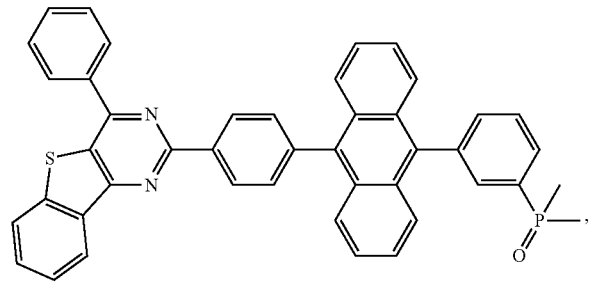
(H39)
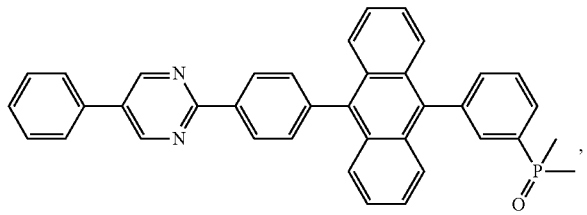
(H40)
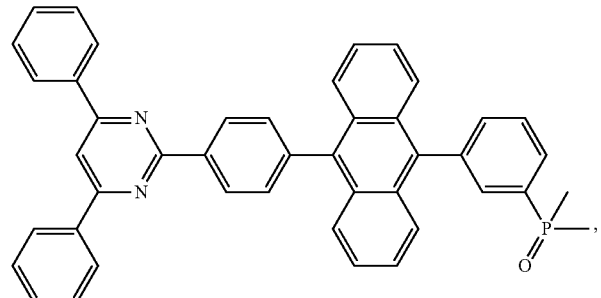
(H41)
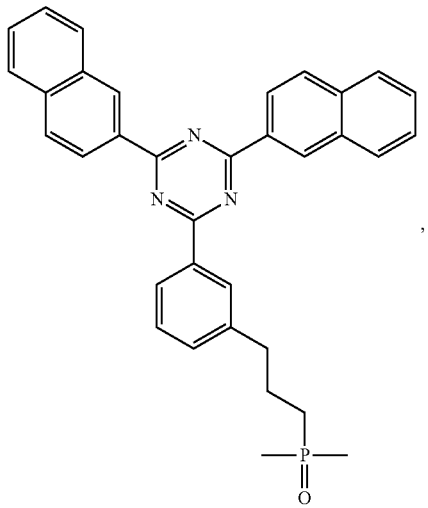

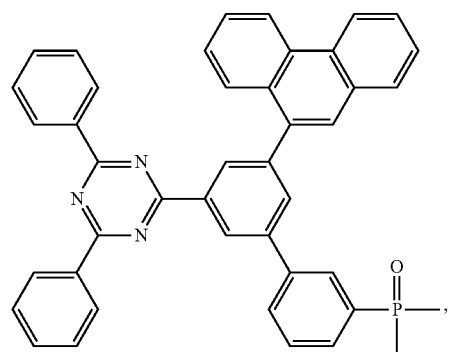 (H42)
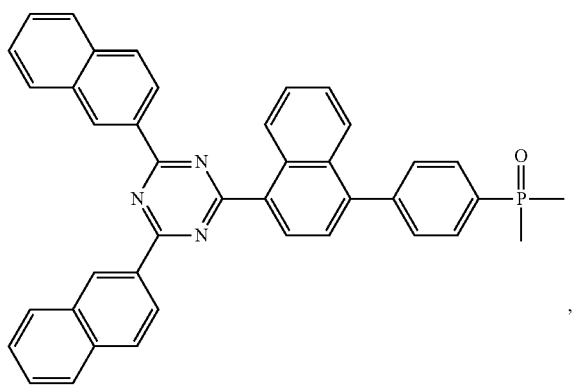 (H43)
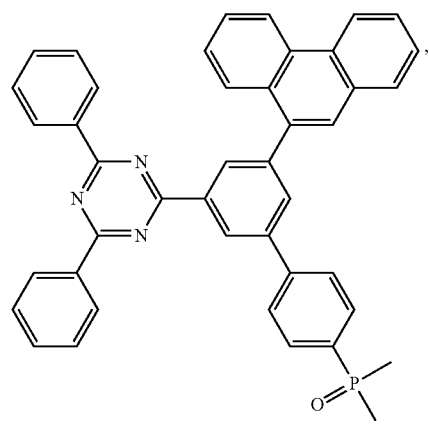 (H44)
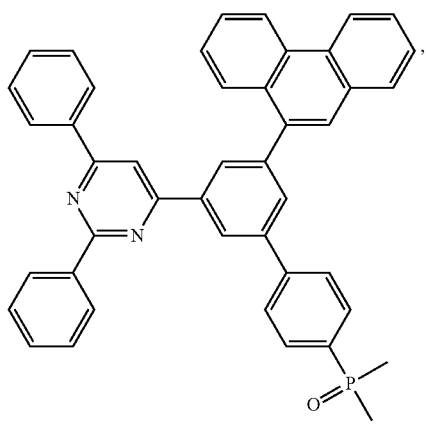 (H45)
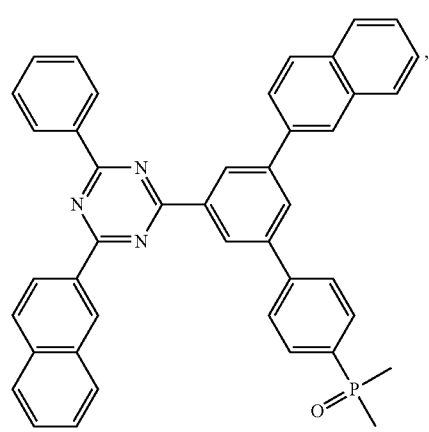 (H46)
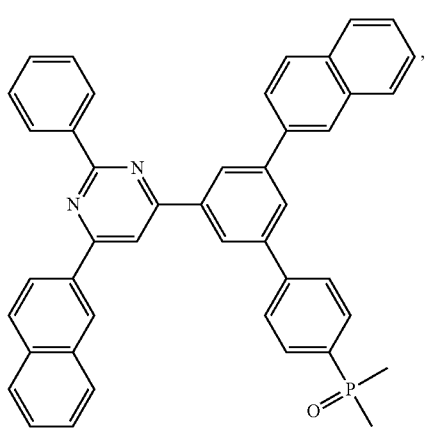 (H47)

-continued
(H48)
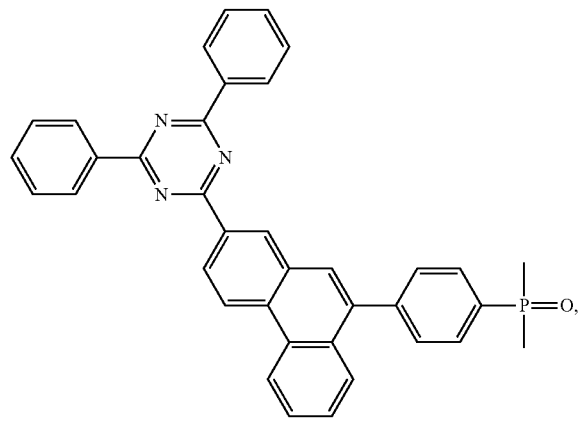
(H49)
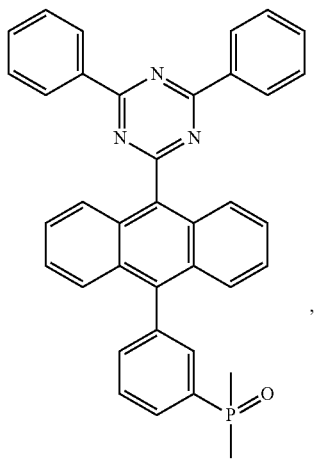
(H50)
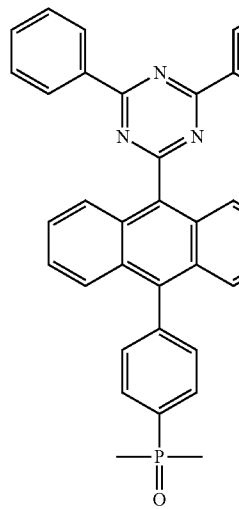
(H51)
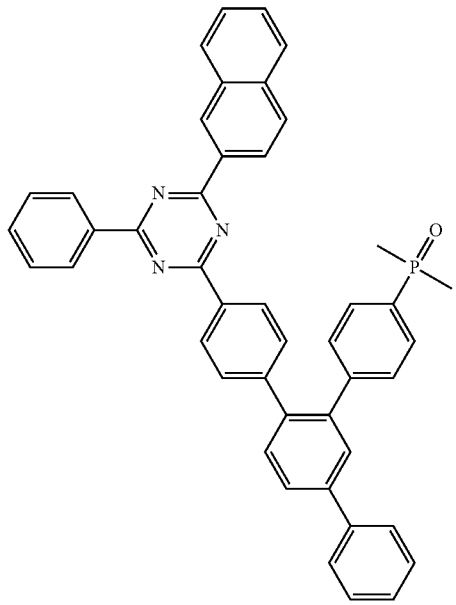
(H52)
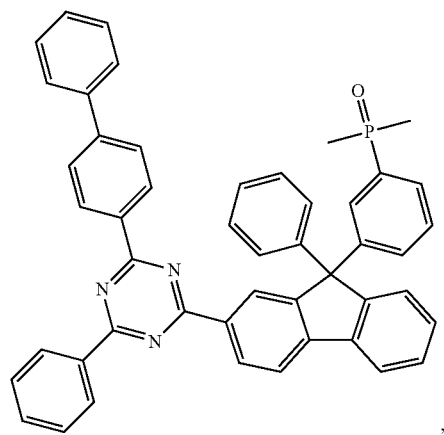
(H53)
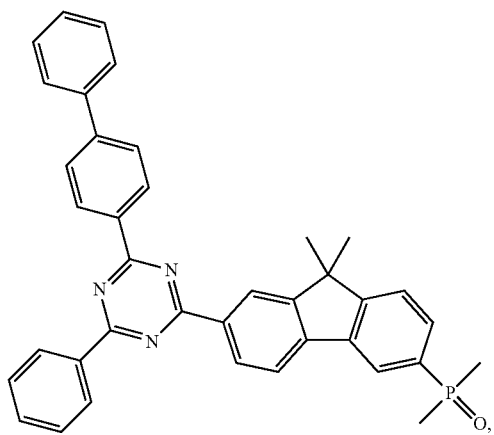

-continued (H54)

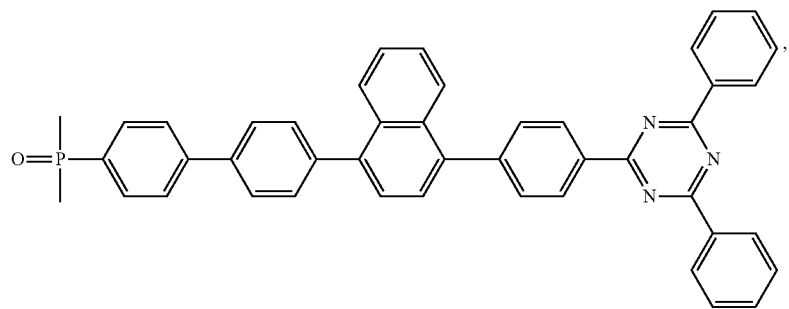

(H55)

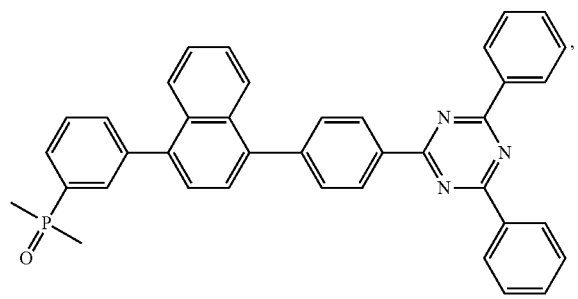

(H56)

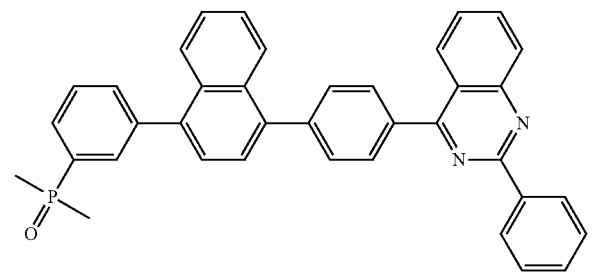

(H57)

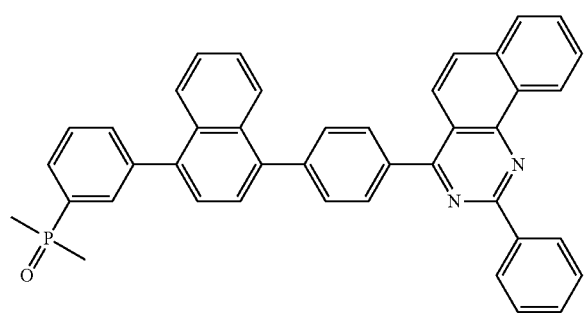

(H58)

(H59)

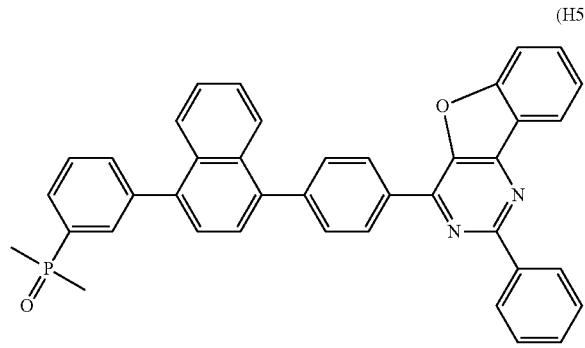

(H60)

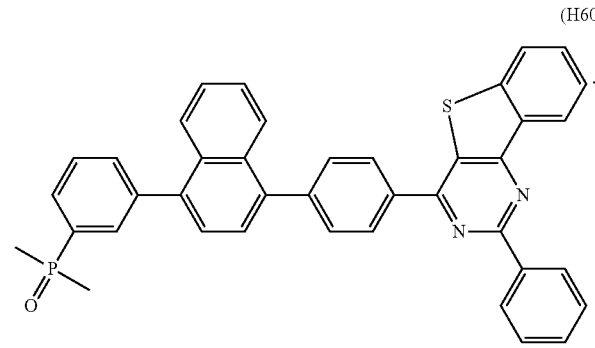

13. The organic electronic device according to claim 1, wherein the at least one organic semiconductor layer fulfils at least one of the following:
is essentially non-emissive or non-emissive,
free of covalently bound metal,
free of ionically bound metal, wherein the metal is selected from the group consisting of group III to VI, rare earth and transition metal.

14. The organic electronic device according to claim 1, wherein the at least one organic semiconductor layer is arranged between a photoactive layer and a cathode layer, or between an emission layer or light-absorbing layer and the cathode layer, or the at least one organic semiconductor layer is an electron transport layer.

15. The organic electronic device according to claim 1, wherein the at least one organic semiconductor layer further comprises at least one alkali halide or alkali organic complex.

16. The organic electronic device according to claim 1, wherein the electronic device comprises the at least one organic semiconductor layer, at least one anode layer, at least one cathode layer and at least one emission layer, or the at least one organic semiconductor layer is arranged between the emission layer and the cathode layer.

17. The organic electronic device according to claim 1, wherein the electronic device is a light emitting device, thin film transistor, a battery, a display device or a photovoltaic cell.

18. A compound of formula 1 according to claim 1, wherein $Ar^1$ that is selected from substituted or unsubstituted dibenzo[c,h]acridine, benzo[c]acridine, carbazole, indolo[3,2-a]carbazole, 1,3,5,2,4,6-triazatriphosphinine, and the following compounds are excluded:

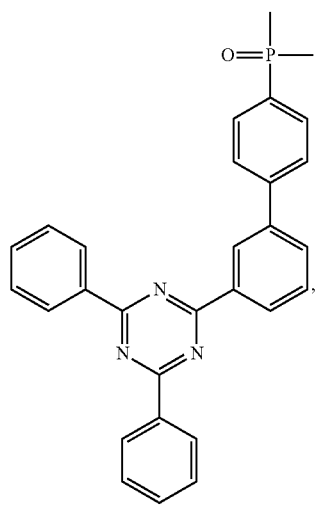
(G1)

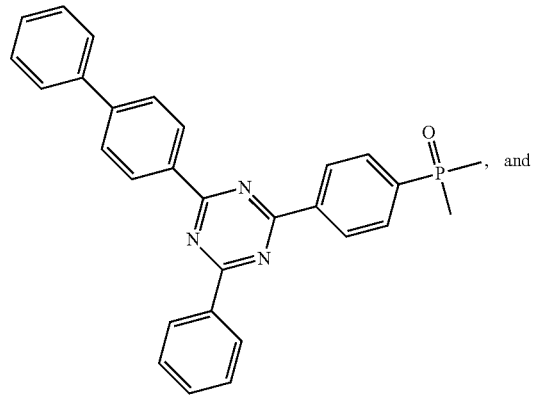
(G2)

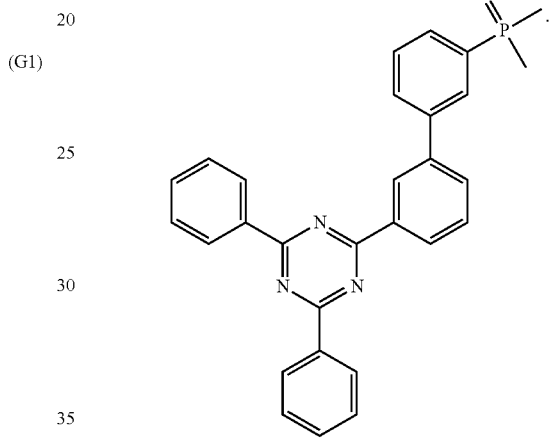
(G3)

19. The organic electronic device according to claim 3, wherein $L^1$ bonds via a single bond directly on a heteroarylene group of $Ar^1$ and wherein the heteroarylene group comprises about 1 to about 3 N-atoms.

* * * * *